(12) United States Patent
Graham et al.

(10) Patent No.: US 6,443,213 B1
(45) Date of Patent: Sep. 3, 2002

(54) SYSTEM FOR CASTING A METAL ARTICLE USING A FLUIDIZED BED

(75) Inventors: Lawrence D. Graham, Chagrin Falls; Brad L. Rauguth, North Canton, both of OH (US)

(73) Assignee: PCC Airfoils, Inc., Cleveland, OH (US)

( * ) Notice: Subject to any disclaimer, the term of this patent is extended or adjusted under 35 U.S.C. 154(b) by 0 days.

(21) Appl. No.: 09/569,906

(22) Filed: May 11, 2000

(51) Int. Cl.$^7$ .......................... B22D 27/00; B22D 27/04; B22D 7/10; B22D 41/04; B22D 46/00
(52) U.S. Cl. ................. 164/122.1; 164/125; 164/338.1; 164/4.1
(58) Field of Search .............................. 164/122, 122.1, 164/122.2, 123, 124, 125, 126, 127, 128, 34, 35

(56) References Cited

U.S. PATENT DOCUMENTS

| | | | |
|---|---|---|---|
| 3,841,384 A | | 10/1974 | Tingquist et al. ............. 164/60 |
| 4,190,094 A | * | 2/1980 | Giamei ........................ 164/60 |
| 4,378,240 A | * | 3/1983 | Siegle et al. ............... 75/5 BA |
| 4,573,516 A | * | 3/1986 | Quested et al. ............... 164/61 |
| 4,746,547 A | * | 5/1988 | Brown et al. ............... 427/213 |
| 5,173,325 A | * | 12/1992 | Knobbe et al. ............. 427/476 |
| 5,577,547 A | * | 11/1996 | Hosamani .................... 164/122 |
| 5,752,327 A | * | 5/1998 | Biallas et al. ................. 34/359 |
| 6,035,924 A | * | 3/2000 | Graham .................. 164/122.1 |

FOREIGN PATENT DOCUMENTS

| | | | |
|---|---|---|---|
| JP | XP002174335 | | 8/1979 |
| JP | 54106031 A | * | 8/1979 |
| JP | 402280956 A | * | 11/1990 |

OTHER PUBLICATIONS

European Search Report dated Aug. 8, 2001.

* cited by examiner

Primary Examiner—M. Alexandra Elve
Assistant Examiner—Kevin McHenry
(74) Attorney, Agent, or Firm—Tarolli, Sundheim, Covell, Tummino & Szabo L.L.P.

(57) ABSTRACT

An apparatus for use in casting a metal article includes a furnace assembly into which a mold is raised and a fluidized bed adjacent to the furnace assembly. The mold is filled with molten metal and lowered into the fluidized bed. The molten metal is solidified in the mold as it is lowered into the fluidized bed. The mold and fluidized bed are then lowered. The mold may be supported on a grid or support member having openings through which gas and particulate in the fluidized bed can flow. A stirrer member may be moved in the fluidized bed to promote uniform distribution of particulate in the flow of gas. Gas may be conducted from the support member for the mold into a container which holds the fluidized bed. Gas at different pressures may be conducted into the fluidized bed at different locations in the fluidized bed. The mold may have a central portion which engages a support member and a peripheral portion, in which article mold cavities are disposed, the peripheral portion of the mold being spaced from the support member to facilitate total immersion of the peripheral portion of the mold in the fluidized bed.

373 Claims, 18 Drawing Sheets

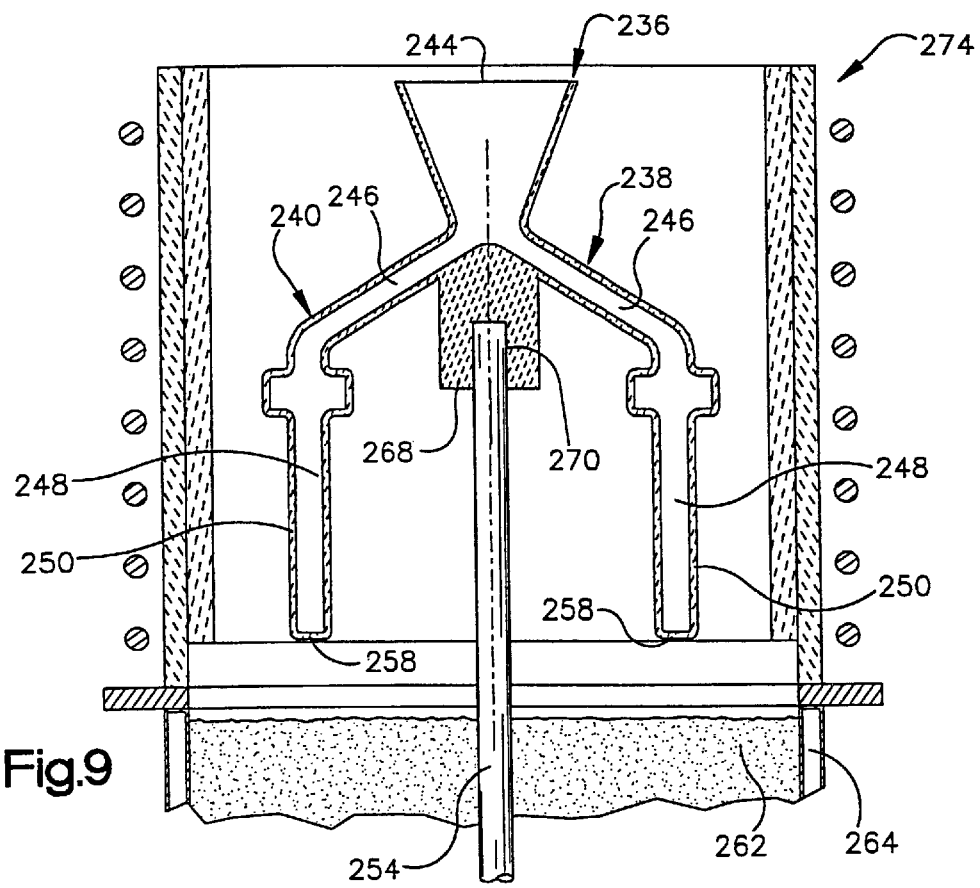
Fig.9
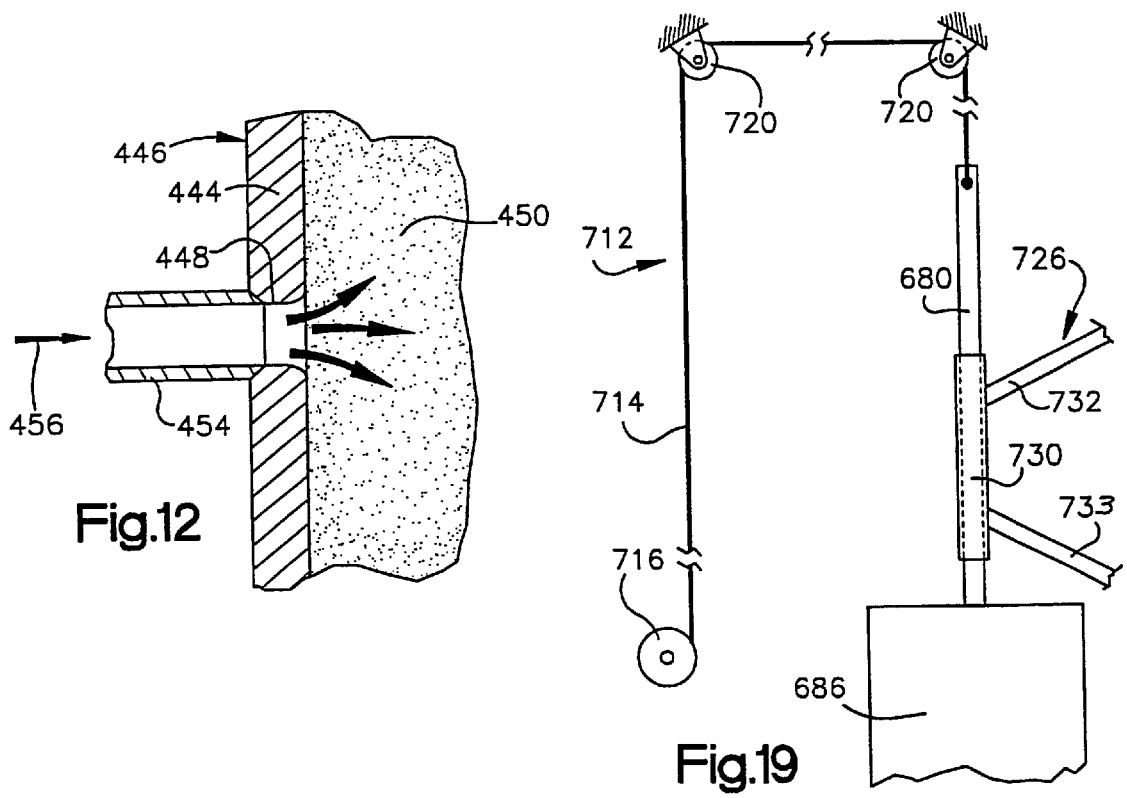
Fig.12
Fig.19

SYSTEM FOR CASTING A METAL ARTICLE USING A FLUIDIZED BED

BACKGROUND OF THE INVENTION

The present invention relates to a new and improved method and apparatus for casting a metal article. A mold for the metal article is moved into a fluidized bed to promote heat transfer from the mold.

An apparatus for molding a metal article is disclosed in U.S. Pat. No. 4,573,516. This apparatus includes a furnace assembly and a mold filled with molten metal. The apparatus also includes a fluidized bed which is disposed below the furnace assembly. The mold is lowered from the furnace assembly into the fluidized bed to effect solidification of the molten metal in the mold.

Another apparatus for use in casting metal articles and utilizing a fluidized bed is disclosed in U.S. Pat. No. 6,035,924. This apparatus includes a furnace assembly from which a mold containing molten metal is lowered into a fluidized bed. A layer of hollow spherical bodies is disposed on an upper end portion of the fluidized bed.

SUMMARY OF THE INVENTION

The present invention relates to a new and improved method and apparatus for use in casting a metal article. During casting of the metal article, a mold is moved into a fluidized bed. As the mold moves into the fluidized bed, molten metal in the mold is solidified.

In one specific instance, the mold is raised into a furnace assembly where the mold is filled with molten metal. A container holding the fluidized bed is moved to a raised position adjacent to the furnace assembly. The mold is lowered into the fluidized bed in the container. The container is lowered.

A stirrer member may be provided in the fluidized bed to promote distribution of particulate in a flow of gas through the fluidized bed. A support for the mold may have a plurality of openings to enable gas and particulate to flow through the support for the mold. Fluid may be conducted from the support for the mold to promote fluidization of particulate. Fluidization of the particulate may also be promoted by conducting gas at different pressures into different locations in the fluidized bed.

The mold may be constructed with a central portion and a peripheral portion in which a plurality of article mold cavities are disposed. The mold may be supported by engaging the central portion of the mold. The peripheral portion of the mold may be spaced from the support to facilitate heat transfer from the article mold cavities. The central portion of the mold may be suspended from an upwardly extending support or may rest on a downwardly extending support.

The side walls of the container for the fluidized bed may be configured so as to effect a change in the speed of movement, through the fluidized bed, of the gas in which the particulate is suspended. Baffles may be provided in association with the fluidized bed to deflect portions of the flow of fluidized material in the bed. Bellows, which may be flexible sleeves, are advantageously associated with apparatus which extends into the fluidized bed to minimize exposure of seals to the particulate in the fluidized bed.

When the molten metal solidifies in the mold, the molten metal may be solidified with a cellular front which is free of dendrites. By solidifying the molten metal with a cellular front which is free of dendrites, the characteristics of the resulting casting are enhanced.

It has been established that satisfactory solidification of molten metal in a mold may be obtained when a flow of gas is conducted through the fluidized bed at a flow rate of between 5 and 100 cubic feet per hour for each square foot of the fluidized bed in a horizontal plane. The upper portion of the fluidized bed may be exposed to a fluid pressure of between $6 \times 10^{-4}$ atmospheres to 1.0 atmosphere. The maximum temperature at the upper portion of the fluidized bed may vary within a range of 2,500 degrees Fahrenheit and 3,000 degrees Fahrenheit.

It should be understood that any one of the features mentioned above and/or additional features may be utilized by itself or in combination with other features of the invention. It should also be understood that the invention is not to be limited to any one of the specific embodiments disclosed herein. This is because there are many different ways in which the various features of the invention may be used together or separately and in which they may be changed from the specific embodiments disclosed herein.

BRIEF DESCRIPTION OF THE DRAWINGS

The foregoing and other features of the invention will become more apparent upon a consideration of the following description taken in connection with the accompanying drawings wherein:

FIG. 9 is a schematic fragmentary illustration depicting the relationship between a furnace assembly, mold, mold support and fluidized bed, the mold support being effective to engage a central portion of the mold;

FIG. 12 (on sheet 6 of the drawings) is a fragmentary sectional view illustrating the manner in which gas may be conducted through a side wall of the container into the fluidized bed;

FIG. 19 (on sheet 6 of the drawings) is a schematic illustration, taken generally along the line 19—19 of FIG. 18, depicting the manner in which the members suspending the mold in FIG. 18 are moved relative to a furnace assembly;

DESCRIPTION OF SPECIFIC PREFERRED EMBODIMENTS OF THE INVENTION

General Description

Figure 1:
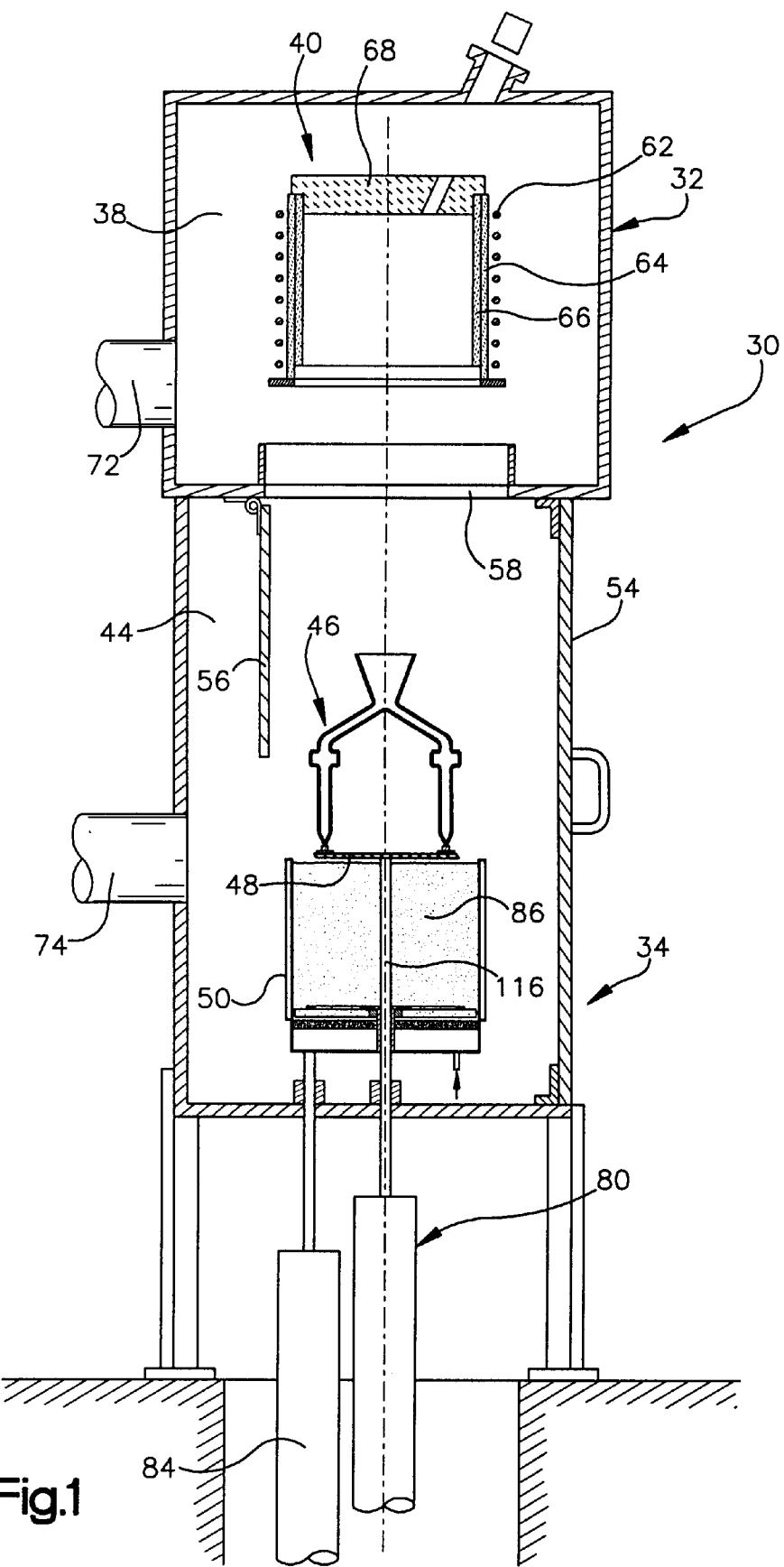
FIG. 1 is a schematic sectional view of one specific embodiment of an apparatus for use in casting a metal article and depicting the relationship between a furnace assembly, a mold and a container for a fluidized bed.
Figure 2:
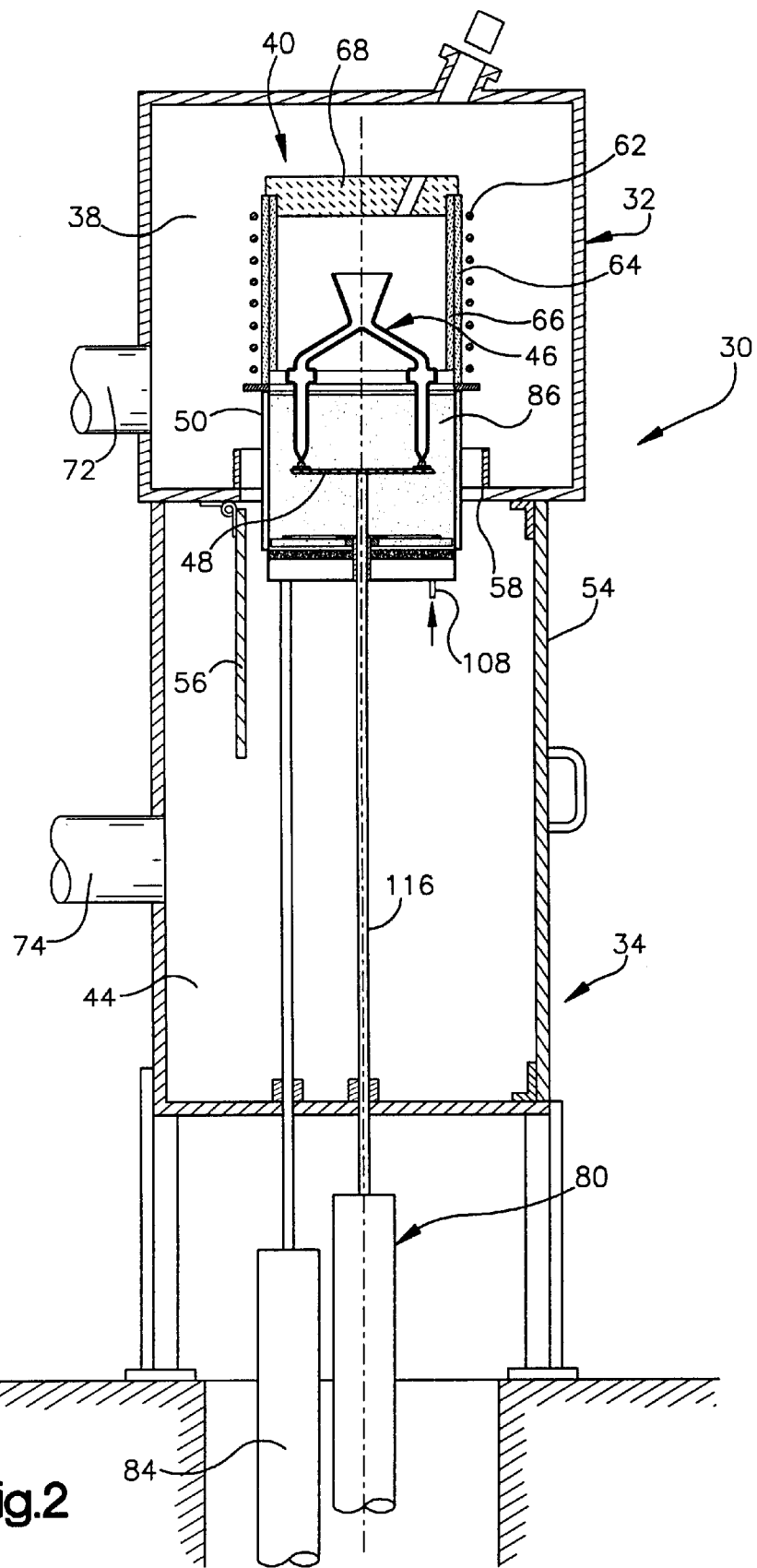
FIG. 2 is a schematic sectional view, generally similar to FIG. 1, illustrating the manner in which the mold is moved from the furnace assembly into the fluidized bed held by the container.

A casting apparatus 30 which is constructed and operated in accordance with one or more features of the present is illustrated schematically in FIGS. 1 and 2. The casting apparatus 30 includes an upper housing 32 and a lower housing 34. The upper housing 32 has a melt chamber 38 in which a furnace assembly 40 is disposed. The lower housing 34 has a loading chamber 44 in which a mold 46 is disposed.

The mold 46 is disposed on a movable support 48 above a container 50 for a fluidized bed. The lower housing 34 includes a door 54 which can be opened to provide access to the loading chamber 44. A flapper valve or panel 56 is pivotal to close an opening 58 between the melt chamber 38 and loading chamber 44 when the door 54 is open.

The furnace assembly 40 is of the know induction type and includes an induction coil 62. The coil is located in a surrounding relationship with a cylindrical refractory wall 64. A cylindrical radiation liner 66 is provided within the refractory wall 64. A cover 68 is provided over an upper end portion of the refractory wall 64.

Conduits 72 and 74 are connectable with a source of vacuum or low pressure. When the door 54 is closed, and the flapper valve 56 is in the open condition illustrated in FIG. 1, the conduits 72 and 74 are both connected with a source of low pressure to evacuate the melt chamber 38 and lower chamber 44. Prior to opening of the door 54, the flapper valve 58 is closed and the conduit 74 is connected to atmospheric pressure. This results in the evacuated atmosphere being maintained in the melt chamber 38 while the door 54 is opened to the atmosphere. The furnace assembly 40, upper housing 32, and lower housing 34 may have any one of many known constructions. It is believed that the furnace assembly 40 and upper and lower housings 32 and 34 may be constructed in the same manner as is disclosed in U.S. Pat. No. 3,841,384.

When the mold 46 is to be utilized to form a cast metal article, the flapper valve 56 is closed and the loading chamber 44 is exhausted to atmosphere. The door 54 to the loading chamber 44 is then opened. The mold 46 is placed on the mold support 48 while the empty mold support is disposed slightly above the container 50, in the manner illustrated schematically in FIG. 1.

Particulate within the container 50 is then fluidized to enable the support 48 to be lowered into the container. Once the particulate in the container 50 has been fluidized, a mold support drive assembly 80 is operated to lower the mold support 48 into the fluidized bed in the container 50. This moves the mold 46 out of the path of movement of the flapper valve 56 between its open and closed positions. However, at this time, the flapper valve 56 is maintained in its closed position.

The door 54 is then sealed and the conduit 74 is connected with a source of low pressure or vacuum to evacuate the loading chamber 44. Once the loading chamber 44 has been evacuated to the same pressure as the melt chamber 38, the flapper valve 56 is pivoted from its close position to the open position illustrated in FIG. 1. The mold support drive assembly 80 is then operated to move the mold 46 upward through the opening 58 into the furnace assembly 40.

After the mold 46 has been moved into the furnace assembly 40, the container 50 is moved from the lowered position shown in FIG. 1 to the raised position shown in FIG. 2 by operation of a container drive assembly 84. The container drive assembly 84 moves the container 50 and fluidized bed 86 to a location immediately below the furnace assembly 40. At this time, the mold support 48 is disposed above the container 50 in the furnace 40. The fluidized bed 86 in the container 50 is disposed immediately beneath the furnace assembly and is spaced from the mold support 48.

In the foregoing description of movement of the mold 46 into the furnace assembly 40, the mold has first been moved into the fluidized bed 86, to provide space in the loading chamber 44 for movement of the flapper valve 56. The mold 46 is then withdrawn from the fluidized bed and moved into the furnace assembly 40, while the container 50 holding the fluidized bed 86 is stationary. The container 50 and fluidized bed 86 are subsequently moved upward to a position beneath the furnace assembly 40, while the mold 46 is stationary in the furnace assembly.

It should be understood that the mold 46 and container 50 can be moved relative to the furnace assembly 40 in a different manner if desired. For example, the loading chamber 44 could be large enough to enable the flapper valve 56 to be moved between its open and closed positions with the mold 46 disposed above the container 50, as illustrated in FIG. 1. If desired, the flapper valve 56 could be constructed so as to move between its open and closed positions along a path which does not interfere with the mold 46 when the mold is in the position shown in FIG. 1. For example, the flapper valve may move between its open and closed positions along a horizontal path.

It is contemplated that the mold 46 may be moved into the furnace assembly 40 before gas is conducted into the container to fluidize the particulate in the container. If this was done, the container 50 could be moved to the raised position with the bed 86 in a defluidized condition. The mold 46 and container 50 may be raised together, with the mold above the container, by effecting simultaneous operation of the mold support drive assembly 80 and container drive assembly 84. The bed 86 could be fluidized, by a flow of gas into the container 50, either before or after the container is moved from the lowered position to the raised position.

Alternatively, the bed 86 could be fluidized and the mold 46 moved into the bed while the container 50 is in the lowered position of FIG. 1. The container 50 and mold 46 could then be moved together to the raised position with the mold in the. fluidized bed 86, by effecting simultaneous operation of the mold support drive assembly 80 and the container drive assembly 84. The mold support drive assembly 80 would then be operated to move the mold 46 out of the raised container 50 and fluidized bed 86 into the furnace assembly 40.

While the mold 46 is disposed in the furnace assembly 40, the mold is heated to a temperature between 2,500 degrees Fahrenheit and 3,000 degrees Fahrenheit. At this time, the fluid pressure in the melt chamber 38 and loading chamber 44 is between $6 \times 10^{-4}$ atmospheres and 1.0 atmosphere. The upper portion of the raised fluidized bed 86 is exposed to the same temperature and pressure as the mold 46 in the furnace assembly 40. It should be understood that the specific temperatures and pressures in the furnace assembly 40 and melt chamber 38 may vary depending upon the characteristics of the molten metal to be poured into the mold. It is contemplated that other temperatures and pressures may be utilized.

Once the mold 46 has been heated to the desired temperature in the furnace assembly 40, the mold is filled with molten metal. With the specific embodiment of FIG. 1, the molten metal is a nickel-chrome superalloy. Shortly after the mold 46 is filled with molten metal, the mold is lowered into the fluidized bed 86. To lower the mold 46 into the raised fluidized bed 86, the mold support drive assembly 80 is operated to lower the mold support 48 while the container 50 is held stationary relative to the upper housing 32 by the container drive assembly 84 (FIG. 2).

When the mold 46 is to be utilized to cast single crystal articles, such as airfoils, out of a nickel-chrome super alloy, the mold may be lowered from the furnace assembly 40 into the fluidized bed 86 at a rate of twenty inches or more per hour. Single crystal articles, such as airfoils, have previously been lowered from a furnace, similar to the furnace 40, at a rate of approximately six to eight inches per hour. It should be understood that the foregoing specific rates of lowering the mold 46 from the furnace assembly 40 will be different for different articles, metals and/or crystal structures. The relatively high rate at which the mold 46 can be lowered from the furnace assembly 40 is achieved due to the fact that the fluidized bed 86 is effective to rapidly cool the mold 46 and solidify molten metal in the mold. The rapid cooling of the mold 46 is obtained by conduction of heat to the particulate in the fluidized bed which is blown against the mold 46 by a flow of gas through the fluidized bed 86.

If desired, the mold 46 may be lowered into the fluidized bed 86 only far enough to completely immerse in the fluidized bed the portion of the mold in which article mold cavities are disposed. A gating system, which extends upward from the article mold cavities, does not have to be completely immersed in the fluidized bed 86. However, it is believed that it will probably be desired to lower the mold 46 at least far enough into the fluidized bed 86 so as to immerse the lower end portion of the gating system in the fluidized bed.

Once the mold 46 has been lowered into the fluidized bed 86, the mold support drive assembly 80 and the container drive assembly 84 are operated to simultaneously lower the mold 46 and the container 50. When the container 50 has been moved back to the lowered position illustrated in FIG. 1, the mold 46 will still be immersed in the fluidized bed 86. Therefore, the mold 46 will be beneath the path of movement of the flapper valve 56. The flapper valve 56 can be operated from the open position illustrated in FIG. 1 to the closed position sealing the opening 58.

Once the flapper valve 56 has been closed to isolate the melt chamber 38 from the loading chamber 44, the conduit 74 vents the loading chamber 44 to atmospheric pressure. The door 54 can then be opened. After the door 54 is opened, the mold support drive assembly 80 may be operated to move the mold out of the fluidized bed 86 to the position illustrated in FIG. 1. When the mold 46 is disposed above the fluidized bed 86, as illustrated in FIG. 1, the mold can be readily removed from the loading chamber 44 with the solidified molten metal in the mold. A next succeeding mold is then positioned on the mold support 48. Molten metal is then cast in the next succeeding mold in the manner previously described in conjunction with the mold 46.

Although one specific casting apparatus 30 has been illustrated in FIG. 1, a casting apparatus having a different construction may be utilized in association with the fluidized bed 86. For example, the furnace assembly 40, upper housing 32 and/or lower housing 34 may have a different construction if desired. The mold support drive assembly 80 and container drive assembly 84 could be constructed differently and operated to raise and lower the mold 46 and container in a different manner and/or sequence if desired. Of course, the mold 46 could have a different construction and be used to cast any desired article or articles. The mold 46 may be constructed to have a single article mold cavity rather than a plurality of article mold cavities.

Fluidized Bed

The fluidized bed 86 (FIG. 3) is held in the container 50. The container 50 has a cylindrical side wall 92 with a water cooling passage or jacket 94. The cooling jacket 94 extends completely around the container 50 and is effective to cool the fluidized bed 86.

The fluidized bed 86 is formed of particles suspended in a flow of gas. The gas may be argon. The particles may be alumina particles of 325 to 90 mesh size. Although the particles may be formed of alumina, it is believed that it may be preferred to utilize zircon particles which have a more rounded configuration than alumina particles. For example, it may be preferred to form the fluidized bed 86 by conducting gas through 200 mesh zircon particles. It should be understood that a gas and/or particulate other than the specific gas and/or particulate set forth herein may be used to form the fluidized bed 86.

The height of the fluidized bed 86 will vary depending upon the height of the mold 46 in which articles are to be cast. It is contemplated that the fluidized bed 86 may have a height of between ten and forty inches. However, it should be understood that the height of the bed may be outside of this range to accommodate a particular mold structure for the casting of a particular article. The fluidized bed 86 has a weight of approximately twelve pounds for each inch of bed height for each square foot of the bed in a horizontal plane.

Prior to fluidization of the bed, the particulate is held in the container 50. When the bed is fluidized, gas flows between the particles. There may be a relatively small increase in the volume occupied by the particles when the bed is fluidized. Thus, when the bed is fluidized, the volume occupied by the particles may increase by less than ten percent.

To fluidize the particles in the container 50, gas is conducted into a pile of the particles. In the embodiment of the invention illustrated in FIG. 3, the particles in the container 50 are fluidized by gas conducted from a cylindrical plenum chamber 98 disposed at the lower end of the container 50. The plenum chamber 98 is separated from a cylindrical particulate chamber 102 by a porous, gas permeable, layer 104.

Prior to fluidization of the bed 86, the particulate in the container 50 is supported by the cylindrical porous layer 104. When the bed 86 is to be fluidized, gas under pressure is conducted into the plenum chamber 98 through a conduit 108. When a predetermined minimum pressure, which is a function of the height of the fluidized bed 86, is obtained in the plenum chamber 98, a flow of gas is conducted from the plenum chamber through the porous layer 104 into the particulate. The flow of gas is effective to form the fluidized bed 86. For the aforementioned bed heights of between ten and forty inches, the rate of gas flow from the plenum chamber 98 into the fluidized bed may be between 5 and 100 cubic feet per hour for each square foot of a flat horizontal upper surface 112 of the porous layer 104.

The porous layer 104 may be formed in many different ways, for example, the porous layer 104 may be formed by a plurality of layers of screen. However, it is believed that it may be preferred to form the porous layer 104 of a gas permeable ceramic material, such as a porous stone.

When the bed 86 is to be fluidized, a gas, such as argon, is conducted under pressure through the conduit 86 to the plenum chamber 98. Prior to the pressure in the plenum chamber 98 reaching a minimum pressure determined by many different factors, the particulate in the container 50 is not fluidized. As the pressure in the plenum chamber 98 exceeds the predetermined minimum pressure, the particulate in the container 50 becomes fluidized.

When the particulate in the container 50 becomes fluidized, the bed 86 shimmers and the particles of particulate are suspended in the flow of gas through the bed. The smooth shimmering effect of the fluidized bed 86 is maintained as the fluid pressure in the plenum chamber 98 is increased to a predetermined maximum pressure. If the pressure in the plenum chamber 98 is further increased, the excessive rate of flow of fluid through the bed 86 causes a boiling of the bed with a resulting upward throwing of particles from the bed. It is preferred to maintain the pressure in the plenum chamber 98 at a level which is effective to maintain a smooth shimmering upper surface on the fluidized bed 86.

Prior to fluidization of the bed 86 by the flow of gas from the plenum chamber 98, the body of particulate rests on the porous layer 104 and is effective to block lowering of the mold support 48 into the container 50. When the particulate becomes fluidized, the mold support 48 can be moved downward into the fluidized bed 86, in the manner illustrated schematically in FIG. 3. Although the particulate in the container 50 has become fluidized, the increase in the volume of the particulate from its non-fluidized volume is relatively small. This results in the particulate in the fluidized bed being disposed in engagement with the surface area on the mold 46 disposed within the fluidized bed. Although the particles in the fluidized bed 86 are suspended in the flow gas and move with the flow of gas, they are disposed close to and engage each other.

Figure 3:
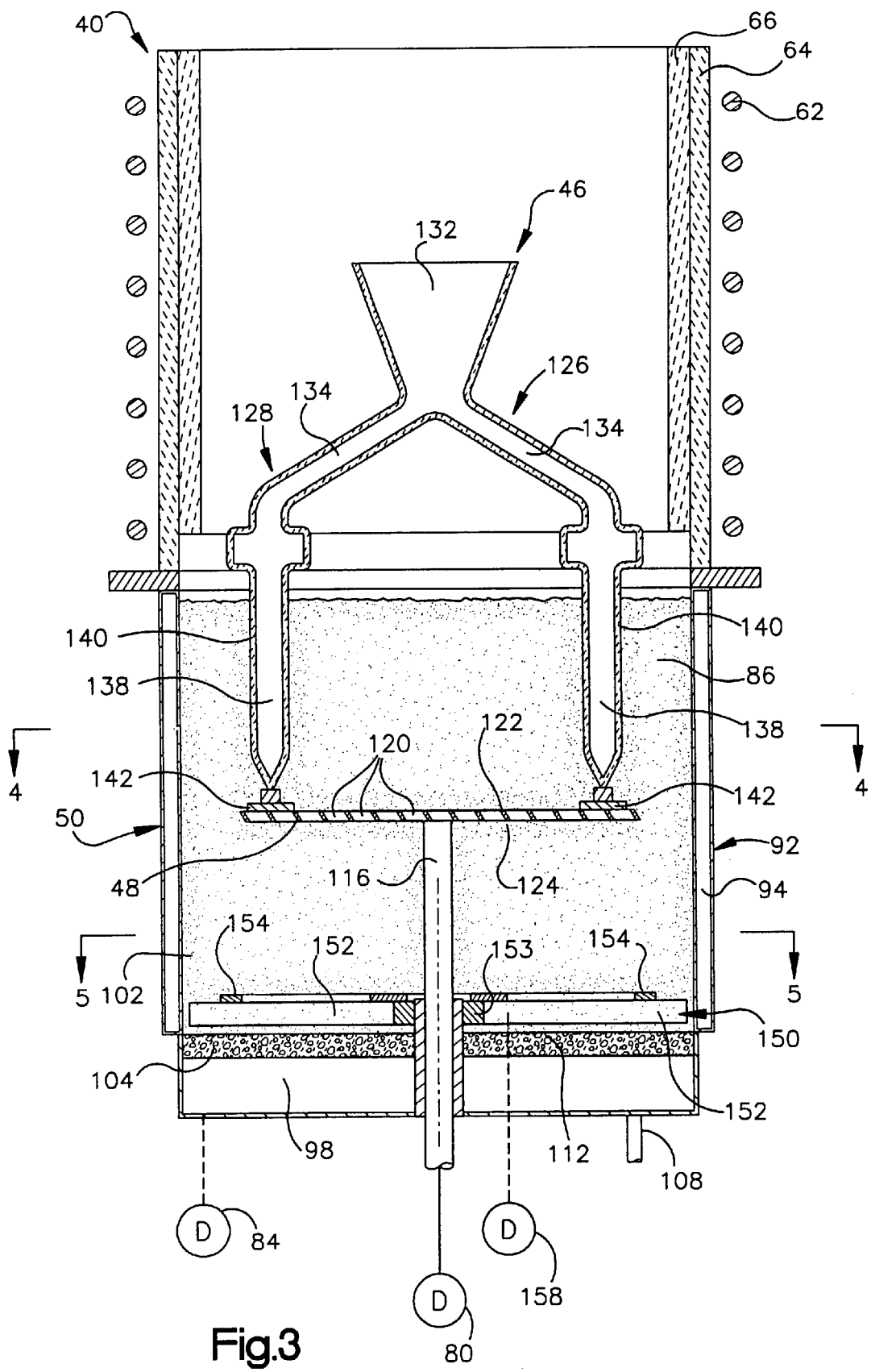
FIG. 3 is an enlarged fragmentary schematic illustration of a portion of FIG. 2 and further illustrating the relationship between the furnace assembly, mold and fluidized bed during movement of the mold into the fluidized bed.

When a portion of the mold 46 is lowered into the fluidized bed 86, in the manner illustrated schematically in FIG. 3, the particulate suspended in the flow of gas in the fluidized bed engages the outer side surface of the mold and moves along the outer side surface of the mold. Since the particles in the fluidized bed are closely adjacent to each other and are continuously moving relative to each other in the flow of gas through the fluidized bed, there is an excellent transfer of heat from the mold 46 to the fluidized bed 86. This transfer of heat occurs by conduction of heat from the mold 46 to the particulate in the fluidized bed 86. This heat is conducted from the particulate to the cooling jacket 94. The mass of the particulate, itself, may be sufficient to absorb the heat from the mold 46 without providing a cooling jacket 94 around the container 50.

The bed 86 in the container 50 may be maintained in a fluidized condition during movement of the container between the lowered position of FIG. 1 and the raised position of FIG. 2. Thus, the gas supply conduit 80 is flexible and capable of accommodating raising and lowering of the container 50 with the plenum chamber 98 during operation of the container drive assembly 84. This enables the fluidized bed 86 to be established when the container 50 is in the lowered position illustrated in FIG. 1 and maintained during movement of the container 50 from the lowered position to the raised position of FIG. 2. Similarly, the fluidized bed may be maintained in the container 50 during operation of the container drive assembly 84 to lower the container from the raised position of FIG. 2 back to the lowered position of FIG. 1.

If desired, fluidization of the bed may be interrupted after the mold 46 has been moved from the furnace assembly 40 into the fluidized bed. Thus, once the portion of the mold containing article mold cavities has been immersed in the fluidized bed 86, the flow of gas to the plenum chamber 98 may be interrupted. This results in the bed becoming defluidized so that the particulate is supported by the porous layer 104 and presses firmly against the outer side surface of the portion of the mold disposed in the fluidized bed 86. The loose packing of the particulate of the fluidized bed around the mold 46 provides an excellent path for conducting heat from the mold 46 through the particulate to the cooling jacket 94.

Once the container 50 has been moved to the lowered position of FIG. 1 with the mold in the non-fluidized bed 86, the bed may again be fluidized or the container 50 and non-fluidized particulate may be removed from the lower housing 34. However, it is believed that it may be desired to maintain the container 50 in the lower housing 34. If this is the situation, a flow of gas would again be established to the plenum chamber 98 and the particulate in the bed 86 would become fluidized. When the particulate in the bed 86 is fluidized, the mold can be readily withdrawn from the bed. However, it is believed that it may be preferred to maintain the bed 86 in a fluidized condition during movement of the bed between the raised and lowered positions.

Mold Support

The mold support 48 is disposed on a shaft 116 connected with the mold support drive assembly 80. Although the shaft 116 has a cylindrical configuration, it is contemplated that the shaft could have a different configuration, for example, polygonal. The longitudinal central axis of the shaft 116 extends through the center of the container 50 and the center of the mold support 48. The central axis of the shaft 116 is coincident with a central axis of the furnace assembly 40.

A plurality of openings 120 (FIGS. 3 and 4) extend through the mold support 48. The openings 120 extend between an upper major side surface 122 (FIG. 3) and a lower major side surface 124 of the mold support 48. The openings 120 enable gas with particulate suspended therein to flow through the mold support 48 as the mold support is lowered into the fluidized bed 86. The presence of the openings 120 in the mold support 48 tends to minimize resistance to movement of the mold support in the fluidized bed 86.

In the illustrated embodiment of the invention, the mold support 48 (FIG. 4) is formed by an expanded metal grid having generally rectangular openings 120. However, it is contemplated that the mold support 48 could be formed in a different manner if desired. For example, the mold support 48 could be cast so as to have an annular ring connected with a central portion of the mold support by a plurality of spokes. This would result in a relatively small number of relatively large openings between the spokes. The mold 46 would be supported on the annular ring which is connected with the central portion of the mold support 48 by the spokes. Of course, the mold support 48 could have a configuration which is different from the specific aforementioned configurations.

The mold 46 rests on the mold support 48. It is contemplated that the mold 46 will have many different configurations depending upon the configuration of the article to be cast. The specific mold 46 illustrated in FIGS. 3 and 4 includes a central portion 126 (FIG. 3) and a peripheral portion 128. The central portion 126 of the mold 46 has a generally circular configuration with an upstanding pour cup 132. Gating passages 134 extend radially outward from the generally conical pour cup 132. The peripheral portion 128 of the mold 46 includes a plurality of article mold cavities 138 (FIGS. 3 and 4) which are disposed in upright article mold sections 140. The article mold sections 140 are disposed in a circular array and are connected with an annular base plate 142.

The article mold cavities 138 have configurations corresponding to the configuration of the articles to be cast. In the specific embodiment of the invention illustrated in FIGS. 3 and 4, the articles to be cast are airfoils for use in a turbine engine and formed of a nickel chrome super alloy. The airfoils are advantageously cast as a single crystal. However, the airfoils could be cast with a columnar grain or equiaxed grain structure if desired. Of course, a mold having a different configuration could be utilized to cast one or more articles of a different configuration.

Although the mold 46 may have any one of many different constructions, the illustrated mold 46 has the same construction as is disclosed in U.S. Pat. Nos. 4,774,992; 5,046,547; 5,062,468; and 5,295,530. The molds in these patents have a plurality of article mold cavities 138 to enable a plurality of articles to be cast at one time. However, it is contemplated that the mold could be constructed for the casting of a single article in the manner disclosed in U.S. Pat. No. 4,862,947. The mold 46 may be formed of a mold material similar to the mold material disclosed in U.S. Pat. No. 4,947,927.

The mold 46 was integrally formed as one piece by repetitively dipping a wax pattern in a slurry of ceramic mold material in the manner disclosed in U.S. Pat. No. 4,955,423. However, it should be understood that the mold 46 could be formed in many different ways and could be utilized to cast many different articles for use in environments other than in association with turbine engines. It is believed that the present invention will advantageously be used in conjunction with the casting of many different types of articles and is not intended to limit the invention to any specific mold construction, type of mold, article, or type of article.

Figure 4:
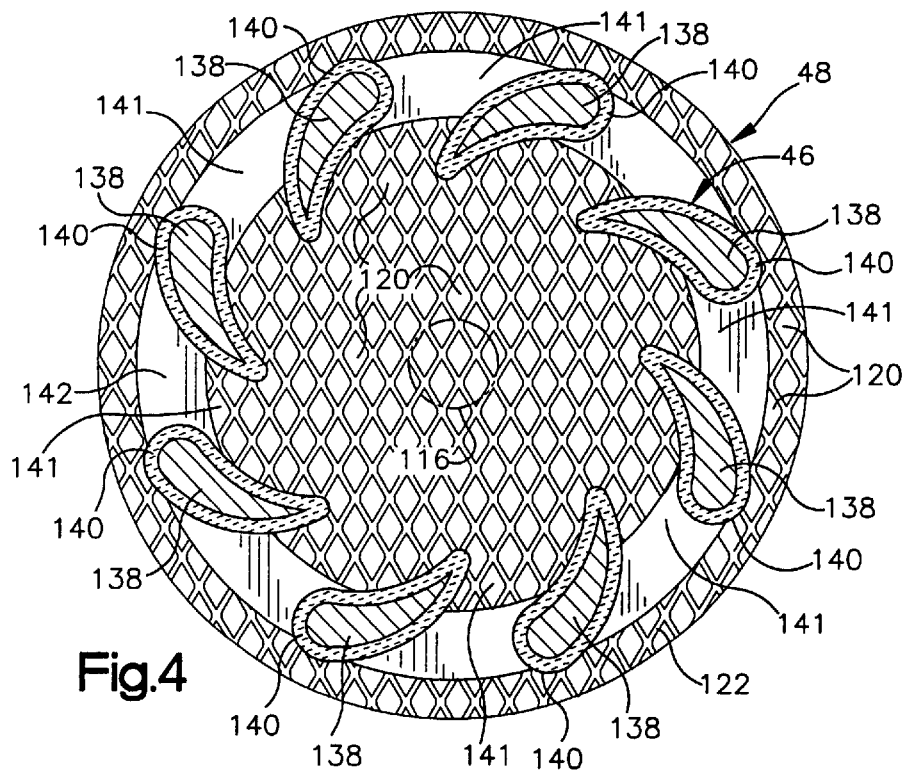
FIG. 4 is a schematic plan view, taken generally along the line 4—4 of FIG. 3, illustrating the relationship of article mold cavities in a peripheral portion of the mold to a support having openings through which gas and particulate of the fluidized bed can flow.

The mold 46 has article mold sections 140 disposed in a circular array with the mold sections spaced apart from each other (FIG. 4). The central portion 126 (FIG. 3) of the mold 46 is disposed above the mold sections 140 and extends across the space between the mold sections. When the mold 48 is lowered into the fluidized bed 86, the gas with particulate suspended therein flows through the openings 120 in the mold support 48. The gas, with particulate suspended therein is at least partially blocked from moving upward, relative to the mold 46, by the central portion 126 of the mold. Therefore, as the mold 46 is lowered, the gas, with particulate suspended therein, flows radially outwardly through passages 141 (FIG. 4) disposed between the article mold sections 140.

The passages 141 between the article mold sections 140 extend for most of the height of the article mold sections. Therefore, there is a relatively free flow of gas, with particulate suspended therein, through the openings 120 in the mold support 48 and through the passages 141 between the article mold sections 140 as the mold 46 is lowered into the fluidized bed 86.

Stirrer Assembly

Figure 5:
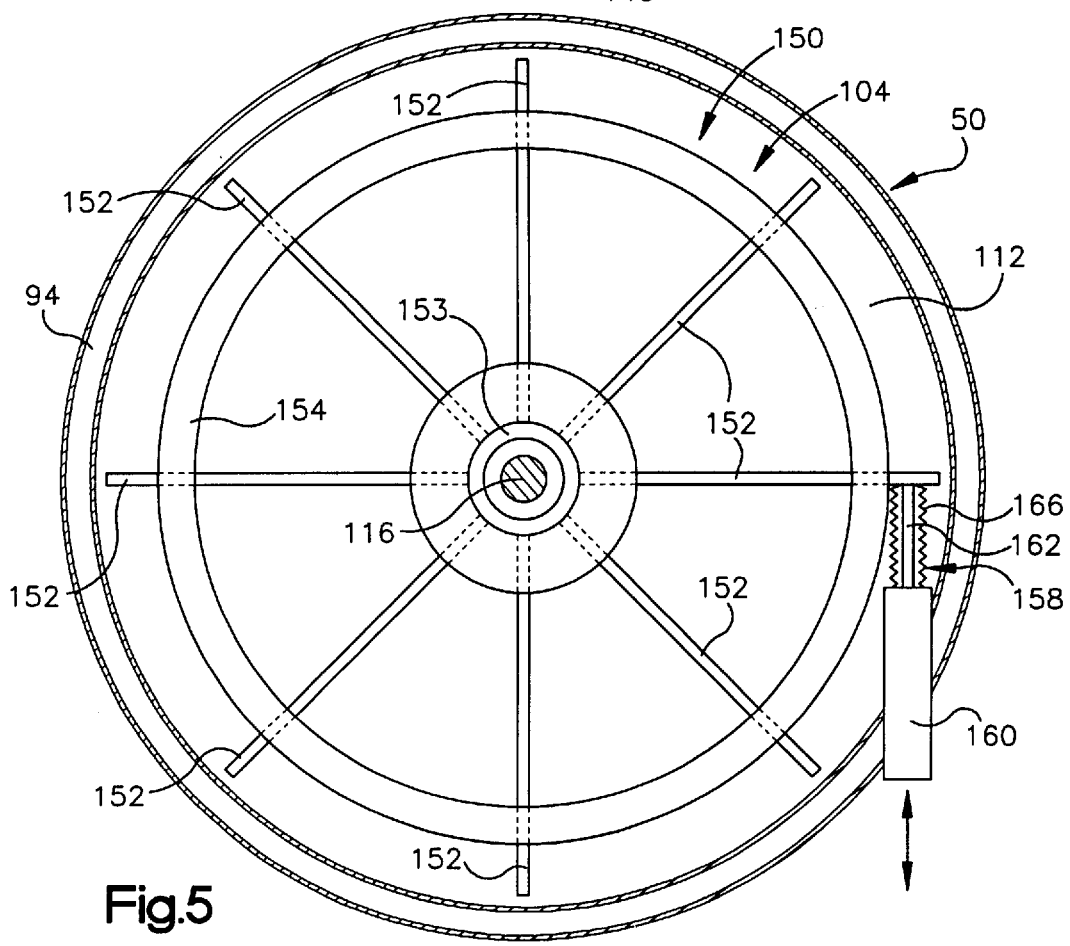
FIG. 5 is a simplified schematic view, taken generally along the line 5—5 of FIG. 3, illustrating a stirrer assembly disposed in the fluidized bed.

In order to promote a more even distribution of particulate in the flow of gas through the fluidized bed 86, a stirrer assembly 150 (FIGS. 3 and 5) is provided in the container 50. The stirrer assembly 150 includes a plurality of blades or members 152 (FIG. 5) which extend radially outward from a cylindrical collar 153 (FIG. 5). The collar 153 extends around a portion of the shaft 116 and is rotatable relative to the shaft.

The collar 153 and stirrer members 152 are fixedly connected and are rotatable together about the longitudinal central axis of the shaft 116. In the specific embodiment of the invention illustrated in FIG. 5, a connector ring 154 is connected with upper edge portions of the stirrer members 152 to interconnect the stirrer members. It should be understood that the stirrer assembly 150 could have a different construction with stirrer members in a different arrangement. For example, the stirrer members 152 could have an arcuately curving configuration.

A drive assembly 158 is connected with the stirrer members 152 and is operable to oscillate the stirrer members along an arcuate path, through a distance of approximately 30 degrees, about the central axis of the shaft 116. The illustrated drive assembly 158 is of the piston and cylinder type. The drive assembly 158 includes a piston and cylinder assembly 160 and a piston rod 162 which is connected with one of the stirrer members 152. The piston rod 162 is connected with one of the stirrer members 152 and is enclosed by a flexible bellows 166.

It should be understood that the drive assembly 158 could have a construction different than the different construction illustrated in FIG. 5. For example, the drive assembly 158 could have a rotatable output member which is connected with the collar 153 through a gear drive arrangement and is effective to continuously rotate the stirrer members 152 about the central axis of the shaft 116 rather than to oscillate the stirrer members in the manner effected by operation of the drive assembly 158.

It should be understood that the stirrer assembly 150 could have a different construction if desired. For example, it is contemplated that the stirrer assembly could include a plurality of drive shafts. These drive shafts would extend upward along the side wall 92 (FIG. 3) of the container 50. The drive shafts are connected with drive assemblies which are disposed outside of the container.

Each of the vertically extending drive shafts disposed along the side wall 92 of the container 50 would be connected to a stirrer member. Each of the drive shafts would oscillate about a vertical axis so that each stirrer member would sweep an arc across the upper side surface 112 of the porous layer 104. If desired, a plurality, for example, two stirrer members could be connected with each drive shaft and separated by a small angle, for example 30 degrees, so that two stirrer members would be oscillated together relative to the lower end portion of the container 50. It should be understood that the arcuate movement of the stirrer members would be coordinated so that the stirrer members would not interfere with each other.

Metal Solidification

As the mold 46 is moved into the fluidized bed 86 (FIG. 3), the molten metal in the mold solidifies. Due to the rapid cooling of the portion of the mold 46 which becomes immersed in the fluidized bed 86, there is a horizontal line of solidification across all of the article mold cavities 138 (FIG. 4). The horizontal line of solidification is disposed a very short distance below the upper surface of the fluidized bed 86. This horizontal solidification front results in directional solidification of the molten metal in the article mold cavities 138. The molten metal solidifies upward from the lower ends of the article mold cavities 138 to the gating passages 134 in the central portion 126 of the mold 46 as the mold is lowered into the fluidized bed.

The molten metal in the article mold cavities 138 may solidify with a single crystal grain structure, a columnar grain structure, or an equiaxed grain structure. The particular type of grain structure which is obtained will depend upon many different factors including the metal cast in the mold 46, the configuration of the mold, and whether or not a single crystal selector is provided in association with the mold. It should be understood that the present invention may be utilized to cast articles having any one of many known grain structures.

Figure 6:
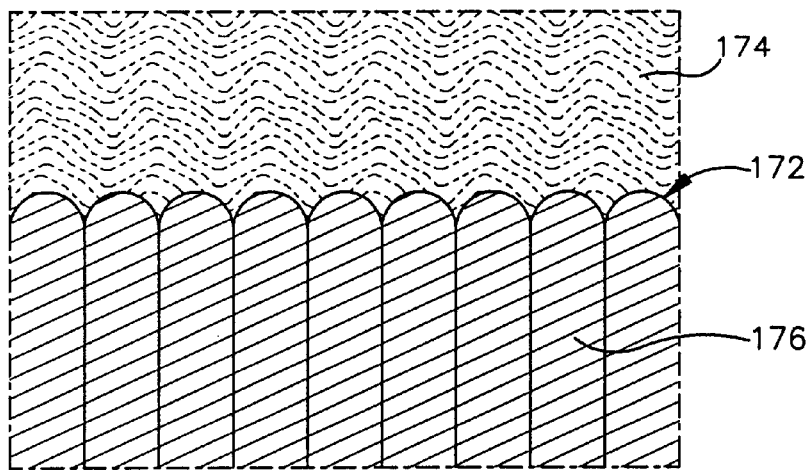
FIG. 6 is a highly schematicized illustration depicting the manner in which molten metal in the mold is solidified with a cellular front as the mold moves into the fluidized bed.

When the molten metal solidifies in the article mold cavities, the rate of heat transfer to the fluidized bed 86 is such that a cellular solidification front can be obtained rather than a dendritic solidification front. A cellular solidification front 172 is illustrated schematically in FIG. 6. The cellular solidification front 172 is disposed in a portion of an article mold cavity 138 (FIG. 3) adjacent to the upper surface of the fluidized bed 86.

The cellular solidification front 172 (FIG. 6) separates molten metal 174 in the upper portion of the article mold cavity 138 from solid metal 176 in the lower portion of the article mold cavity. The cellular solidification front 172 is achieved by slowly lowering the mold 46 into the fluidized bed 86. As has been illustrated schematically in FIG. 6, the cellular solidification front 172 is free of dendrites which commonly project from a solidification front during the solidification of molten metal. The absence of the dendrites is obtained with the cellular solidification front due to the high rate at which heat is transferred from the mold 46 and a relatively low rate of lowering of the mold into the fluidized bed 86.

When molten metal solidifies with a dendritic solidification front, the dendrites tend to become interconnected with small pockets of molten metal between the dendrites. When this molten metal solidifies, there may be a tendency to form small voids in the metal. This increases the porosity of the resulting casting. By having the cellular solidification front 172, the formation of small voids in the casting is eliminated or at least minimized. This results in little or no porosity in the resulting casting.

The absence of porosity in a casting enhances the characteristics of the casting and, in certain environments, such as the hot environments found in turbine engines, it may be very advantageous. The advantages obtained by having a cellular solidification front 172 may be obtained with different types of grain structures, including a single crystal grain structure or an equiaxed grain structure.

It should be understood that the mold 46 may be lowered into the fluidized bed 86 in a manner which results in solidification of the molten metal in the mold along a dendritic solidification front. When the solidification front is either a dendritic solidification front or a cellular solidification front, the front has a horizontal configuration and extends across the metal in all of the article mold cavities 138.

The solidification front moves upward in all of the article mold cavities 138 as the mold 46 is lowered into the fluidized bed. By moving the mold 46 slowly into the fluidized bed 86, a cellular solidification front is obtained. When the speed at which the mold 46 is lowered into the fluidized bed 86 is increased, a dendritic solidification front is obtained.

Gas Dispensing Mold Support

Figure 7:
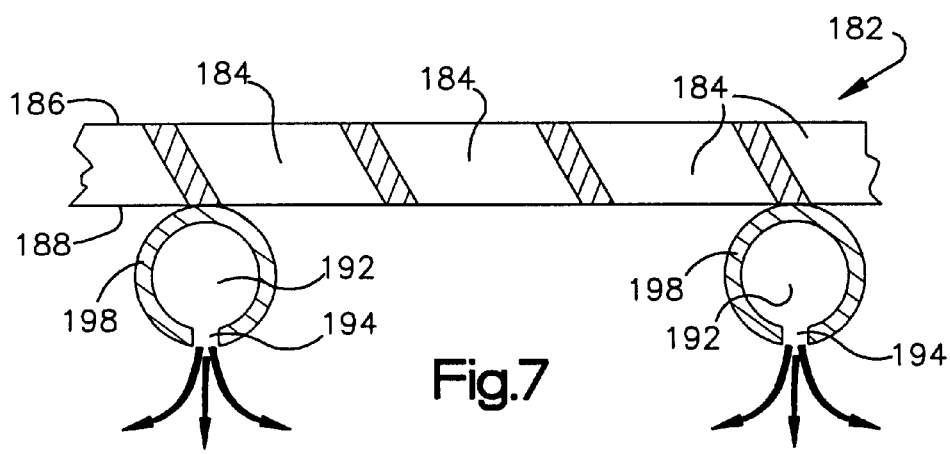
FIG. 7 is a fragmentary schematic illustration of another embodiment of the mold support of FIG. 4 and illustrating the manner in which gas is discharged from a lower side of the mold support.

In the embodiment of the invention illustrated in FIGS. 3 and 4, the mold support is a metal grid having a plurality of openings therein. In the embodiment of the invention illustrated in FIG. 7, the mold support is formed with openings, in the same manner as the mold support 48 of FIG. 4. However, in the embodiment of the invention illustrated in FIG. 7, the mold support dispenses gas to promote fluidization of the bed 86. Since the embodiment of the invention illustrated in FIG. 7 is generally similar to the embodiment of the invention illustrated in FIGS. 1–6, similar terminology will be utilized to refer to similar components. It should be understood that any one or more of the features of the embodiment of the invention illustrated in FIGS. 1–6 could be utilized with the embodiment of the invention illustrated in FIG. 7.

The mold support 182 (FIG. 7) has the same circular configuration as the mold support 48 of FIGS. 3 and 4. The mold support 182 has openings 184 which extend between upper and lower side surfaces 186 and 188 of the mold support 182. The openings 184 have the same configuration as the openings 120 in the mold support 48 of FIG. 4. The openings 184 enable gas with particulate suspended therein to flow through the mold support as the mold support is lowered into the fluidized bed 86 (FIG. 3).

In accordance with a feature of the embodiment of FIG. 7, gas is discharged from passages 192 in the mold support 182 through outlet openings 194. The outlet openings 194 face downward from the mold support 182. Therefore, the gas (argon) which is discharged from the outlet openings, in the manner indicated schematically by arrows in FIG. 7, is directed into the fluidized bed 86 (FIG. 3).

It is contemplated that the gas dispensed from the mold support 182 into the fluidized bed will promote fluidization of the bed immediately ahead of the mold support as the mold support is lowered into the bed. Thus, fluidization of the particulate in the bed 86 will be initially achieved by a flow of gas from the plenum chamber 98 (FIG. 3) into the bed in the manner previously explained. The gas discharged from the mold support 182 (FIG. 7) will promote fluidization of the bed 86 immediately ahead of the mold support as the mold support is lowered into the bed.

It may be desired to use the plenum chamber to effect the initial fluidization of the bed 86 and to utilize the fluid discharged from the mold support 182 to supplement the fluidization obtained by the flow of gas from the plenum chamber 98. It is also contemplated that the fluid discharged from the mold support 182 may be sufficient to effect fluidization of the bed 86. Thus, before the mold support 182 is lowered toward the bed 86, the particulate in the bed may not be fluidized or may only be partially fluidized adjacent to the mold support 182. As the mold support 182 moves down toward the bed 86, the flow of gas from the mold support is effective to fluidize the bed ahead of the mold support as the mold support moves into the bed.

Although the gas discharged from the mold support 182 may be the only source of gas for fluidizing the bed 86, it is believed that it may be preferred to utilize other sources of gas in association with the mold support 182. One of the sources of gas which could be utilized with the mold support 182 is the plenum chamber 98. The gas discharged from the mold support 182 could be effective to prevent aggregation of particulate immediately below the mold support 182 in such a manner as to facilitate movement of the mold support into the fluidized bed 86.

In addition to being directed downwardly from passages 192 connected with the mold support 182, it is contemplated that gas could also be directed toward the side wall 92 (FIG. 3) of the container 50 from the mold support 182. This would prevent the aggregation or packing of particulate adjacent to the side wall 92 of the container 50.

In the embodiment of the invention illustrated in FIG. 7, the passages 192 are disposed in conduits 198 connected to the lower side of the mold support 182. However, it is contemplated that the passages 192 could be formed in the material of the mold support 182 and the conduits 198 eliminated. For example, the mold support 182 could be a cast member with openings extending through the cast member and internal gas passages formed in the member. If this is done, nozzles could be provided in association with the mold support 182 to direct gas from the passages in the mold support in various directions relative to the mold support.

Different Gas Pressures

Figure 8:
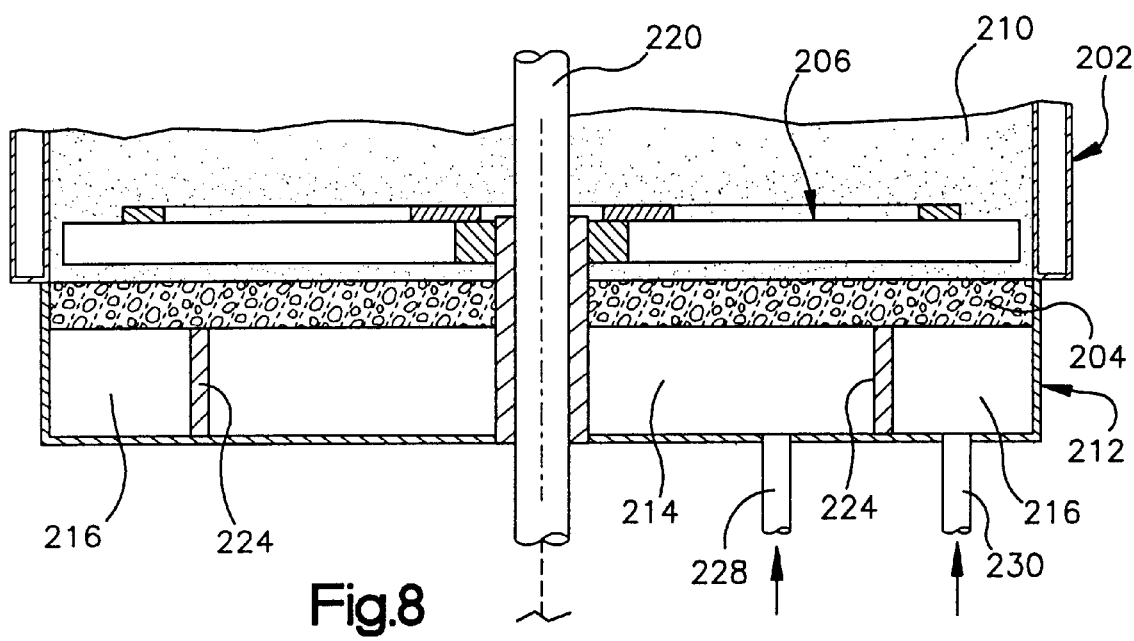
FIG. 8 is a schematic illustration of an embodiment in which a plenum chamber at a lower portion of a fluidized bed is pressurized with gas at different pressures.

In the embodiment of the invention illustrated in FIG. 3, the plenum chamber 98 is supplied with gas at one pressure by the gas supply conduit 108. This results in uniform pressurization of the porous layer 104 and a uniform flow of gas through the porous layer. In the embodiment of the invention illustrated in FIG. 8, the plenum chamber is supplied with gas at different pressures to obtain different flow rates through different portions of the porous layer. Since the embodiment of the invention illustrated in FIG. 8 is generally similar to the embodiment of the invention illustrated in FIG. 3, similar terminology will be utilized to refer to similar components. It should be understood that one or more of the features of the embodiments of the invention illustrated in FIGS. 1–7 could be utilized with the embodiment of the invention illustrated in FIG. 8, if desired.

A container 202 (FIG. 8) has the same construction as the container 50 of FIG. 3. A porous layer 204 has the same construction as the porous layer 104 of FIG. 3. A stirrer assembly 206 is provided immediately above the porous layer 204 to promote distribution of particulate in a fluidized bed 210 held in the container 202. The stirrer assembly 206 has the same construction as the stirrer assembly 150 of FIG. 5. The fluidized bed 210 is formed in the same manner and functions in the same way as previously explained in conjunction with the fluidized bed 86 of FIG. 3.

In accordance with one of the features of the embodiment of FIG. 8, a plenum 212 includes an annular inner section or chamber 214 and an annular outer section or chamber 216. A shaft 220 extends through the plenum 212 and functions to raise and lower a mold support in the same manner as previously explained in conjunction with the shaft 116 of FIG. 3.

The inner chamber 214 of the plenum 212 extends around and is coaxial with the shaft 220. The outer chamber 216 of the plenum 212 extends around and is coaxial with the inner chamber 214. The inner chamber 214 is separated from the outer chamber 216 by a circular plenum wall 224.

Gas, such as argon, at a first pressure is supplied to the inner chamber 214 of the plenum 212 through a conduit 228. Gas at a second pressure is supplied to the outer chamber 216 of the plenum 212 through a conduit 230. Since the inner and outer chambers 214 and 216 of the plenum 212 contain gas at different pressures, gas flows at different rates through different portions of the porous layer 204 into the fluidized bed 210. By directing gas at higher pressures toward areas of the fluidized bed where particulate tends to aggregate or become packed, uniform fluidization of the bed 210 can be achieved.

It is believed that, in some situations, particulate may tend to collect or aggregate adjacent to a cylindrical inner surface of the container 202. If this tends to occur, gas at a relatively high pressure is conducted through the conduit 230 to the outer plenum chamber 216. Gas at a relatively low pressure is conducted through the conduit 228 to the inner plenum chamber 214.

The relatively high fluid pressure in the outer plenum chamber 216 results in a greater rate of flow of gas through the portion of the porous layer 204 disposed above the outer plenum chamber 216 than is obtained through the portion of the porous layer disposed above the inner plenum chamber 214. This results in a greater rate of flow of gas being directed into the fluidized bed 210 adjacent to the side wall of the container 202. Since particulate may tend to accumulate in the fluidized bed 210 adjacent to the side wall of the container 202, the increased flow rate of gas along the side wall is effective to promote fluidization of this particulate.

It is also believed that, in some situations, particulate may tend to collect or aggregate adjacent to a central portion of the container 202. If this tends to occur, gas at a relatively high pressure is conducted through the conduit 228 to the inner plenum chamber 214. Gas at a relatively low pressure is conducted through the conduit 230 to the outer plenum chamber 214.

The relatively high fluid pressure in the inner plenum chamber 214 results in a greater rate of flow of gas through the portion of the porous layer 204 disposed above the inner plenum chamber 214 than is obtained through the portion of the porous layer disposed above the outer plenum chamber 216. This results in a greater rate of flow of gas being directed into the fluidized bed 210 at a central portion of the fluidized bed. Since particulate may tend to accumulate in the fluidized bed 210 at the central portion of the fluidized bed, the increased flow rate of gas into the central portion of the fluidized bed is effective to promote fluidization of this particulate.

It is believed that the location in the fluidized bed 210 where the particulate tends to accumulate may vary with variations in the construction of the mold support 48 (FIG. 3) and the configuration and size of the mold 46. The location in the fluidized bed 210 where the particulate tends to accumulate may also vary with variations in locations where gas is conducted into the fluidized bed. Thus, gas may be conducted into the fluidized bed 210 from a mold support similar to the mold support 182 of FIG. 7. Gas may be conducted into the fluidized bed 210 from side walls of the container 202. By conducting gas into the fluidized bed 210 at various locations, conducting gas into the fluidized bed at different pressures at different locations, and using the stirrer assembly 206, uniform fluidization of the bed is promoted.

Although only a pair of plenum chambers 214 and 216 are provided in the embodiment of the invention illustrated in FIG. 8, it is contemplated that a plurality of plenum chambers could be formed. Thus, by the addition of a second circular plenum wall, in a coaxial relationship with the plenum wall 224 and with additional gas supply conduit, three different gas pressures could be obtained in the plenum 212. This would allow gas at relatively high pressure to be conducted through the portion of the porous layer disposed adjacent to the side wall of the container 202 and through the portion of the porous layer 204 disposed adjacent to the shaft 220. The central portion of the plenum chamber may be at a lower pressure than the radially inner and outer plenum chambers so that there is a lower gas flow rate through the central plenum chamber. When this is done, it is believed that the discharging of gas from the mold support, in the manner illustrated schematically in FIG. 7, may be particularly advantageous.

Alternative Mold Support

In the embodiments of the invention illustrated in FIGS. 1–8, the mold 46 is supported on a mold support 48 (FIG. 3) or a mold support 182 (FIG. 7) disposed at one end of a shaft 116. The mold supports 48 and 182 engage the peripheral portion 128 (FIG. 3) of the mold 46 while the central portion 126 of the mold is spaced from the mold support. In the embodiment of the invention illustrated in FIG. 9, the mold is supported by engagement of a support member with the central portion of the mold. The peripheral portion of the mold is spaced from the mold support. Since the embodiment of the invention illustrated in FIG. 9 is generally similar to the embodiments of the invention illustrated in FIGS. 1–8, similar terminology will be utilized to designate similar components. It should be understood that any of the features of the embodiments of the invention illustrated in FIGS. 1–8 may be utilized in association with the embodiment of the invention illustrated in FIG. 9.

A mold 236 (FIG. 9) has the same general construction as the mold 46 of FIG. 3. The mold 236 includes a central portion 238 and a peripheral portion 240. The central portion 238 of the mold 236 includes a pour cup 244 which is connected with the peripheral portion 240 of the mold by gating passages 246. The gating passages 246 extend radially outward and downward from the pour cup 244 and connect the pour cup in fluid communication with the peripheral portion 240 of the mold 236.

A plurality of article mold cavities 248 are disposed in article mold sections 250 of the peripheral portion 240 of the mold 236. The article mold cavities 248 and mold sections 250 may have the same construction and configuration as the article mold cavities 138 and article mold sections 140 (FIG. 4) of the mold 46. In the embodiment of the mold 236 illustrated in FIG. 9, the article mold sections 250 are not interconnected by a base plate, corresponding to the base plate 142 (FIG. 4) of the mold 46. However, a base plate similar to the base plate 142 of FIG. 4 could be provided as a part of the mold 236 if desired. It should be understood that the mold 236 could be constructed so as to have only a single article mold cavity.

In accordance with a feature of the embodiment illustrated in FIG. 9, the mold 236 is supported by engagement of a support member, such as a shaft 254, with a central portion 238 of the mold. The peripheral portion 240 of the mold is spaced from the shaft 254. This results in bottoms or lower ends 258 of the article mold sections 250 being completely exposed to a fluidized bed 262 held in a container 264.

The central portion 238 of the mold 236 includes a mounting section 268 which connects the mold 236 with the shaft 254. The mounting section 268 is integrally formed as one piece with the remainder of the mold 236. Thus, the mounting section 268 is formed of ceramic mold material.

The mounting section 268 includes a socket or recess 270 in which an end of the shaft 254 is received. It should be understood that the mold 236 and shaft 254 could be interconnected in a different manner if desired. For example, suitable support prongs or arms could be provided on the shaft 254 to engage the central portion 238 of the mold around and between sections of the mold in which the gating passages 246 are formed. Alternatively, a downpole from the pour cup 244 could be received in a socket connected to the shaft 254.

When the mold 236 is to be utilized to cast molten metal articles, the mold is raised into a furnace assembly 274 in the same manner as previously explained in conjunction with the embodiment of the invention illustrated in FIGS. 1–6. The container 264 is raised to position the fluidized bed 262 immediately beneath the furnace assembly 274. Once the mold 236 has been filled with molten metal, the mold is lowered into the fluidized bed 262.

To lower the mold 236 into the fluidized bed 262, the shaft 254 is lowered. As the shaft 254 is lowered, the bottom or lower ends 258 of the article mold sections 250 move into the fluidized bed 262. As this occurs, the particulate suspended in the flow of gas in the fluidized bed 262 impinges against the bottom or lower ends 258 of the article mold sections 250. This initiates solidification of molten metal at the lower ends of the article mold cavities 248.

As the mold 236 is lowered into the fluidized bed 262, the molten metal in the article mold cavities 250 completely solidifies. The solidification of the molten metal in the article mold cavities 248 may occur along a cellular solidification front in the manner previously explained in conjunction with the drawing of FIG. 6. Of course, the speed of lowering the mold 236 into the fluidized bed could be increased so as to effect solidification of the molten metal in the article mold cavities 248 along a dendritic solidification front.

The molten metal in the article mold cavities 248 may be solidified with any desired crystallographic structure. Thus, the articles cast in the mold 236 may have a single crystal, columnar grain, or equiaxed crystallographic structure. Although only the furnace assembly 274 and upper end portion of the fluidized bed 262 and container 264 have been illustrated in FIG. 9, it should be understood that the mold 236 is utilized with casting apparatus having the same construction as the casting apparatus 30 of FIGS. 1 and 2.

Alternative Container and Gas Flow Monitoring

Figure 10:
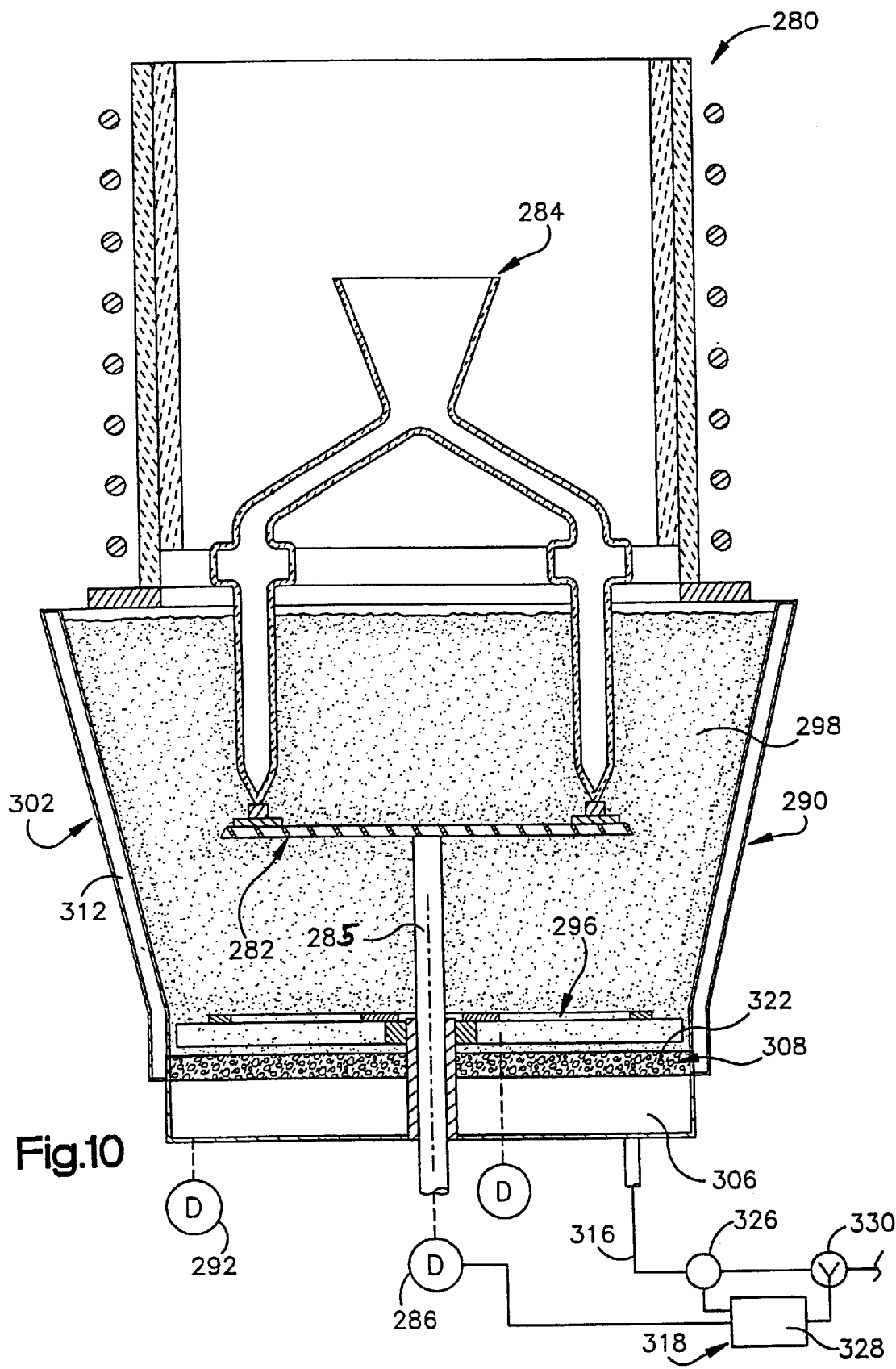
FIG. 10 is a fragmentary schematic illustration, generally similar to FIG. 3, illustrating the manner in which side walls of a container for the fluidized bed may flare upward and outward.

In the embodiments illustrated in FIGS. 1–9, the fluidized bed was held in a container, such as the container 50 of FIG. 3, having a cylindrical configuration. However, it is contemplated that the container holding the fluidized bed could have a different configuration in order to vary the rate of flow of gas and particulate in the fluidized bed. Since the embodiment of the invention illustrated in FIG. 10 is generally similar to the embodiments of the invention illustrated in FIGS. 1–9, similar terminology will be utilized to designate similar components. It should be understood that the features of any of the embodiments of the invention illustrated in FIGS. 1–9 may be utilized with the embodiment of the invention illustrated in FIG. 10.

The apparatus of FIG. 10 includes a furnace assembly 280 having the same construction as the furnace assembly 40 of FIGS. 1–3. A mold support 282 is provided to support a mold 284. The mold support 282 and mold 284 have the same construction as the mold support 48 and mold 46 of FIGS. 3 and 4. A shaft 285 is connected with a mold support drive assembly 286. The mold support drive assembly 286 is operable to move the shaft 285 axially relative to the furnace assembly 280 in the manner previously explained in conjunction with the embodiment of the invention illustration in FIGS. 1–3. It should be understood that the apparatus of FIG. 10 could have a construction which is different than the construction illustrated in FIGS. 1–3 and 10 if desired.

A container 290, corresponding to the container 50 of FIG. 3, can be raised and lowered by a container drive assembly 292. The container drive assembly 292 has the same construction as the container drive assembly 84 of FIGS. 1–3. A stirrer assembly 296 is disposed in the lower end portion of the container 290. The stirrer assembly 296 has the same construction as the stirrer assembly 150 of FIGS. 3 and 5. The stirrer assembly 296 is operable to promote distribution of particulate in a fluidized bed 298. The fluidized bed 298 is formed by the suspension of particulate in the flow of gas in the same manner as previously explained in conjunction with the fluidized bed 86 of FIG. 3.

In accordance with a feature of the embodiment illustrated in FIG. 10, the container 290 has a side wall 302 which slopes upward and outward from a lower end portion of the container. The side wall 302 is formed as the frustrum of a right circular cone. The central axis of the side wall 302 is coincident with a central axis of the shaft 284 and furnace assembly 280. By having the side wall 302 slope upward and outward, the cross sectional area of the fluidized bed 298, as viewed in a horizontal plane, increases in a direction away from the lower end portion of the fluidized bed.

Since the fluidized bed 298 has a relatively small cross section at the lower end portion of the fluidized bed, there is greater fluidization of the particulate in the lower portion of the fluidized bed 298 than in the upper portion of the fluidized bed. This is because the speed at which the gas flows upward from the plenum chamber 306 and through a porous layer 308 from the lower portion of the container to the upper portion of the container will decrease as the cross sectional area of the container increases. This promotes a greater extent of fluidization of the particulate in the lower end portion of the container 290 than in the upper end portion of the container without boiling of the fluidized bed 298 at the upper end of the container 290.

The side wall 302 of the container 390 is enclosed by a cooling jacket 312 in the same manner as in which the side wall of the container 50 is enclosed by the cooling jacket 94 (FIG. 3). However, the side wall 302 and cooling jacket 312 of the container 290 (FIG. 11) are formed as a portion of a right circular cone. It is contemplated that the side wall 302 of the container 290 and cooling jacket 312 could have a different configuration if desired. For example, the side wall of the container 290 could flare outward in a stepwise manner rather than in the continuous manner illustrated in FIG. 10.

During operation of the apparatus illustrated in FIG. 10, there is a continuous flow of gas through the conduit 316 to the plenum chamber 306. A control apparatus 318 is provided to maintain a desired rate of flow of gas into the plenum chamber 306. As was previously mentioned, when the container 290 is at a vertical height of between 10 and 40 inches, it is contemplated that the rate of flow of gas from the plenum chamber 306 through the porous layer 308 into the fluidized bed 298 may advantageously be in a range between 5 and 100 cubic feet per hour for each square foot of a horizontal upper side surface 322 of the porous layer 308. The control apparatus 318 is effective to monitor the rate of flow of gas to the plenum chamber 306 and maintain a desired flow rate of gas to the plenum chamber.

The control apparatus 318 includes a gas flow measurement device 326 which provides an output to a microprocessor 328 indicative of the rate of flow of gas through the conduit 316. The microprocessor 328 is operable to control a valve 330 to maintain a desired flow rate of gas through the conduit 316.

It is contemplated that it may be desired to vary the rate of flow of gas through the conduit 316 as the mold 284 is lowered into the fluidized bed 298. Thus, as the mold support 282 and mold 284 are moved into the fluidized bed 298, there may be a tendency for the rate of flow of gas through the conduit to decrease as the mold 284 and mold support 282 restrict the flow of gas through the fluidized bed 298. When this occurs, the gas flow measuring device 326 provides an output signal to the controller 328 indicative of the decrease in the rate of flow of gas through the fluidized bed 298. In response to this signal, the controller 328 operates the valve 330 to increase the rate of flow.

As the mold 284 is lowered into the fluidized bed 298, the total amount of heat to be transferred from the mold to the fluidized bed increases. In order to effect a corresponding increase in the rate of heat transfer from the mold the fluidized bed, the controller 328 may be programmed to operate the valve 330 and increase the rate of flow of gas as the mold 284 is lowered. To enable the controller 328 to detect the position of the mold 284 relative to the fluidized bed 298, a transducer, not shown, connected with the mold support drive assembly 286 provide an output signal which is indicative of the position of the shaft 28 and the mold support 282 relative to the porous layer 308 at the lower end of the container 290.

The output from the transducer connected with the mold support drive assembly 286 enables the controller 328 to either increase or decrease the rate of flow of gas to the plenum chamber 306 and fluidized bed 298 as a function of extent to which the mold 284 is lowered into the fluidized bed. For example, the greater the distance which the mold 284 is lowered into the fluidized bed 298, the greater may be the rate of gas flow through the conduit 316 to the plenum chamber 306 and fluidized bed. Therefore, as the mold 284 is lowered into the fluidized bed 298, the extent of fluidization of the bed is varied to promote the transfer of heat from the mold to the fluidized bed 298.

Although the control apparatus 318 has been illustrated in association with only the container 290 of FIG. 10, it should be understood that a similar control apparatus could be associated with the container 50 to control the rate of flow of gas into the fluidized bed 86 of FIG. 3 or any of the other embodiments disclosed herein.

Container and Gas Flow Controls

Figure 11:
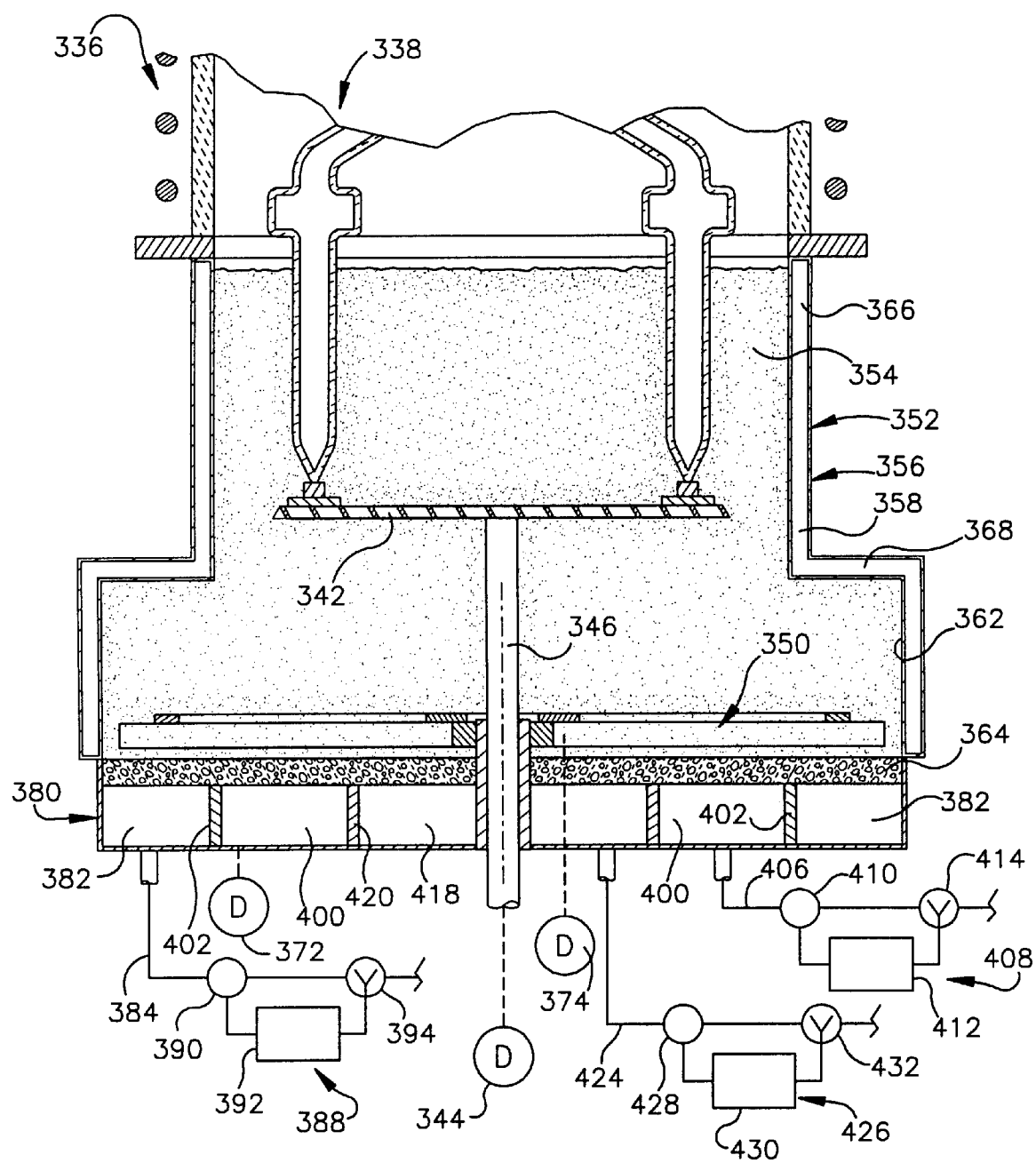
FIG. 11 is a fragmentary sectional view, generally similar to FIG. 10, illustrating the manner in which side walls of the container for the fluidized bed may be configured to reduce the cross sectional area of the upper portion of the fluidized bed.

In the embodiment of the invention illustrated in FIG. 10, the cross sectional area of the container, as viewed in a horizontal plane, increased as the distance above the lower end portion of the fluidized bed increased. In the embodiment of the invention illustrated in FIG. 11, the cross sectional area of the fluidized bed decreases as the distance above the lower end portion of the fluidized bed increases. By decreasing the cross sectional area of the fluidized bed, as viewed in a horizontal plane, as the gas flows upward from the lower end portion of the fluidized bed, the speed of movement of the gas increases. By increasing the speed of movement of the gas, the extent of fluidization of the bed tends to be increased. Since the embodiment of the invention illustrated in FIG. 11 is generally similar to the embodiments of the invention illustrated in FIGS. 1–10, similar terminology will be utilized to designate similar components. It should be understood that any of the features of the embodiments of the invention illustrated in FIGS. 1–10 may be utilized with the embodiment of the invention illustrated in FIG. 11.

A furnace assembly 336 (FIG. 11) is provided to receive a mold 338. The furnace assembly 336 and mold 338 have the same construction as the furnace assembly 40 and mold 46 of FIG. 3. The mold 338 engages a mold support 342. The mold support 342 is connected with a mold support drive assembly 344 by a shaft 346. The construction of the mold support 342 and mold support drive assembly 344 is the same as the construction of the mold support 48 and mold support drive assembly 80 of FIGS. 1–6.

A stirrer assembly 350 (FIG. 11) is disposed in a lower end portion of a container 352 which holds a fluidized bed 354. The container 352 has a side wall 356 with a cooling jacket 358. In accordance with a feature of the embodiment of the invention illustrated in FIG. 12, the side wall 356 of the container 358 has a relatively large cross sectional area, as viewed in a horizontal plane, adjacent to a lower end portion of the container 352. The side wall 356 of the container 352 has a smaller cross sectional area, as viewed in a horizontal plane, adjacent to an upper end portion of the container.

The side wall 356 of the container 352 includes a relatively large diameter cylindrical lower end portion 362 which is connected with a circular porous layer 364. The side wall 356 also includes a cylindrical upper end portion 366 which is disposed in a coaxial relationship with the lower end portion 362 and porous layer 364. The upper end portion 366 of the side wall 356 is connected with the lower end portion 362 of the side wall 356 by an annular connector wall 368.

The upper end portion 366 of the side wall 356 has a smaller diameter than and is coaxial with the lower end portion 362 of the side wall 356. Therefore, as gas flows upward from the porous layer 364 through the fluidized bed 354, the velocity of the gas increases as it moves from the lower end portion of the fluidized bed into the upper end portion of the fluidized bed. This increase in the velocity of the gas as it moves into the upper portion of the fluidized bed is particularly apparent immediately adjacent to the upper end portion 366 of the side wall 356. Therefore, there is relatively little tendency for particulate to aggregate or become packed adjacent to the upper end portion of the side wall 356.

In the embodiment illustrated in FIG. 11, the side wall 356 of the container 352 changes in cross sectional area in a stepwise manner. However, it is contemplated that the side wall 356 of the container 352 could continuously taper in an upward direction. This would result in the side wall 356 of the container 352 being formed as a portion of a right circular cone.

A container drive assembly 372 is operable to raise and lower the container 352 with the fluidized bed 354 in the same manner as previously explained in conjunction with the embodiment of the invention illustrated in FIGS. 1–6. A drive assembly 374 effects operation of the stirrer assembly 350 in the same manner as previously explained in conjunction with the drive assembly 158 for the stirrer assembly 150 of FIG. 5. The drive assembly 374 for the stirrer assembly 350 is advantageously connected with the container 352 for movement with the container relative to the furnace assembly 336. However, the drive assembly 374 could remain stationary during movement of the container 352.

A plenum 380 is disposed adjacent to a lower side of the porous layer 364. The plenum 380 includes a plurality of annular chambers which hold gas at different pressures. Thus, an annular radially outer chamber 382 is connected with a source of gas through a conduit 384. A control assembly 388 is provided to maintain a desired rate of flow of gas to the radially outer chamber 382. The control assembly includes a gas flow measuring device 390 which provides an output signal to a controller 392 indicative of the rate of flow of gas through the conduit 384 to the outer chamber 382. The controller 392 effects operation of a valve 394 to maintain a desired rate of flow of gas to the outer chamber 382.

An annular intermediate chamber 400 is separated from the radially outer chamber 382 by a circular plenum wall 402. Gas is conducted to the intermediate chamber 400 through a conduit 406. A control assembly 408 is operable to control the rate of flow of gas through the conduit 406 to the intermediate chamber 400. The control assembly 408 includes a gas flow measuring device 410 which provides an output signal to a controller 412 indicative of the rate of flow of gas through the conduit 406. The controller 412 effects operation of a valve 414 to maintain a desired rate of flow of gas to the intermediate chamber 400.

A radially inner plenum chamber 418 has an annular configuration and is separated from the intermediate chamber 400 by a circular plenum wall 420. A shaft 346 extends through the center of inner chamber 418.

The inner chamber 418 is supplied with gas under pressure through a conduit 424. A control apparatus 426 includes a gas flow measuring device 428 which provides an output signal to a controller 430 indicative of the rate of flow of gas through the conduit 424. The controller 430 effects operation of a valve 432 to maintain a desired gas flow rate through the conduit 424 to the inner plenum chamber 418.

The controllers 392, 412 and 430 may receive output signals from a transducer connected with the mold support drive assembly 344 to effect variations in the rate of flow of gas to the plenum chambers 382, 400 and 418 as a function of the position of the mold 338 and mold support 342 relative to the fluidized bed 354. This enables the fluid pressure in the plenum chambers to be varied as the mold 338 and mold support 342 are lowered into the fluidized bed 354. It should be understood that the pressure in one of the plenum chambers 392, 412 or 430 may be decreased while pressure in one or more of the other plenum chambers is increased. For example, the fluid pressure in the intermediate plenum chamber 400 could remain constant while the pressure in the outer plenum chamber 382 is increased and the pressure in the inner plenum chamber 418 is decreased.

Container Wall Gas Supply

Figure 13:
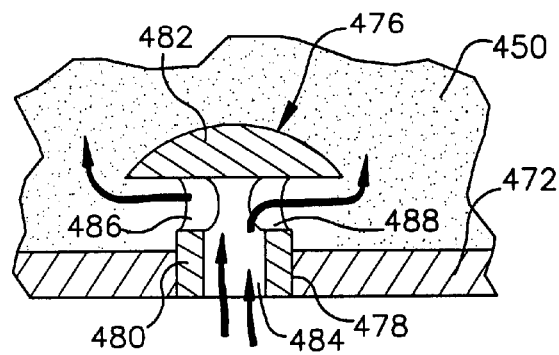
FIG. 13 is a fragmentary sectional view illustrating the manner in which gas may be conducted from fixtures connected to a bottom wall of a container for a fluidized bed.
Figure 14:
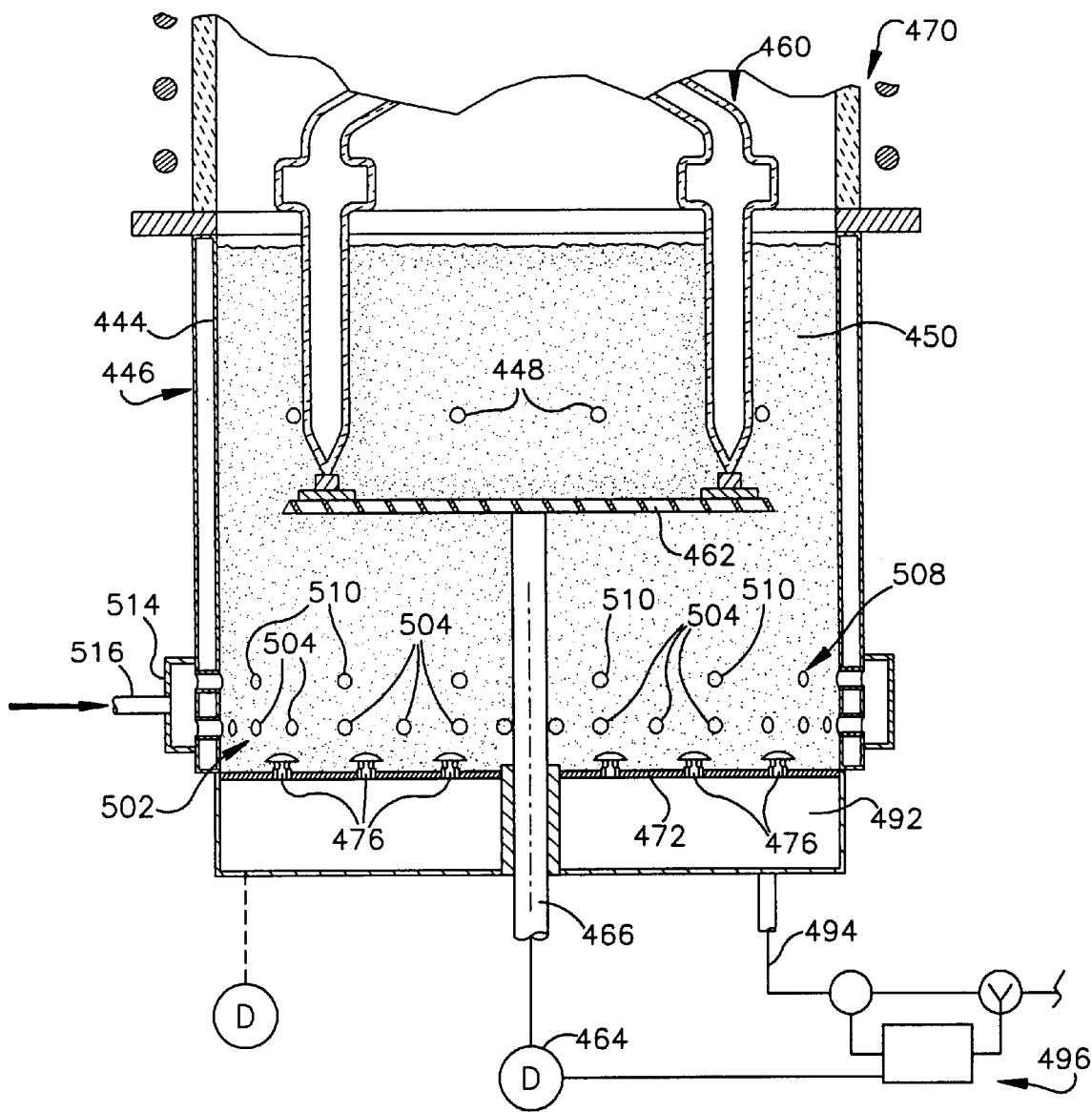
FIG. 14 is a fragmentary sectional view, generally similar to FIG. 3, illustrating the manner in which gas may be conducted through side and bottom walls of a container for a fluidized bed.

In the embodiments of the invention illustrated in FIGS. 3, 8, 10 and 11, the flow of gas to fluidize particulate in the container is supplied through a porous layer in the lower end portion of the container. In the embodiment of the invention illustrated in FIGS. 12–14, the gas for fluidizing the particulate is supplied through side and/or bottom walls of the container. Since the embodiment of the invention illustrated in FIGS. 12–14 is generally similar to the embodiments of the invention illustrated in FIGS. 1–11, similar terminology will be utilized to designate similar components. It should be understood that one or more of the features of the embodiments of the invention illustrated in FIGS. 1–11 may be utilized with the embodiment of the invention illustrated in FIGS. 12–14.

A side wall 444 of a container 446 is illustrated in FIGS. 12 (sheet 6 of the drawings) and 14 (sheet 9 of the drawings). In accordance with a feature with this embodiment of the invention, gas is directed through an opening 448 (FIG. 12) in the side wall 444 of the container 446 into a fluidized bed 450. In the embodiment of the invention illustrated in FIG. 12, the gas is conducted under pressure to the opening 448 through a conduit 454 in the manner indicated schematically by an arrow 456 in FIG. 12.

The conduit 454 has a longitudinal central axis which is coincident with a longitudinal central axis of the generally cylindrical opening 448. The coincident central axes of the opening 448 and conduit 454 extend radially outward from a central axis of the container 446. This results in the flow of gas being directed into the fluidized bed along a radial path which extends perpendicular to the longitudinal central axis of the container 446.

If desired, the conduit 454 and the opening 448 could have a horizontal axis skewed at an acute angle relative to a radius of the container 446. This would result in the flow of gas from the conduit 454 to the opening 448 promoting a swirling or rotating action in the fluidized bed 450. For example, the coincident horizontal central axes of the conduit 454 and opening 448 could extend at an angle of 45 or 60 degrees to a diametrical plane containing the central axis of the cylindrical container 446. This would promote a swirling action in the fluidized bed adjacent to the side wall 444 where particulate may tend to aggregate or become packed during lowering of a mold 460 (FIG. 14) disposed on a mold support 462.

The mold support 462 is connected with a mold support drive assembly 464 by a shaft 466. The mold support drive assembly 464 is operable to raise and lower the shaft 466 and mold support 462 along with the mold 460 in the manner previously described in conjunction with the embodiment of the invention illustrated in FIGS. 1–6. The mold support 462 has the same construction as the mold support of FIG. 4. Operation of the mold support drive assembly 464 is operable to move the mold 460 into and out of a furnace assembly 470. If desired, the mold support 462 could have the same construction as the mold support 182 of FIG. 7.

In accordance with another feature of the embodiment of FIGS. 13 and 14, gas distribution outlets are provided in a bottom or lower end wall 472 of the container 446. In order to prevent the gas outlets in the bottom wall from becoming blocked with particulate, a fixture 476 (FIG. 13) extends axially upward from an opening 478 in the bottom wall 472. The fixture 476 includes a cylindrical stem portion 480 and a hemispherical head portion 482. A central passage 484 extends through the stem portion 480 to outlet openings 486 and 488 which are disposed immediately beneath the head portion 482. The head portion 482 protects the outlet openings 486 and 488 from being blocked by particulate prior to fluidization of the bed 450.

There are a plurality of the fixtures 476 connected with the bottom wall 472 of the container 446 (FIG. 14). The array of fixtures 476 is connected in fluid communication with a plenum chamber 492. The plenum chamber 492 is supplied with gas under pressure through a conduit 494. The flow gas through the conduit 494 is regulated by a control apparatus 496 having the same construction and mode of operation the control apparatus 318 of FIG. 10. If desired, the plenum chamber 492 could be divided into a plurality of sections in the manner illustrated in FIGS. 8 and 11.

In addition to the outlets 448 (FIGS. 12 and 14) in the side wall 444 of the container 446, a lower series 502 (FIG. 14) of outlets 504 are disposed in the lower end portion of the side wall 444 of the container 446. In addition, an upper series 508 of outlets 510 is provided in the lower end portion of the side wall 444 of the container 446. The outlets 504 and 510 are connected in fluid communication with an annular manifold 514 which is supplied with air under pressure through a conduit 516. A control apparatus (not shown) having the same construction as the control apparatus 318 of FIG. 10 and the control apparatus 496 of FIG. 14, is provided to monitor the rate of flow of gas through the conduit 516 to the manifold 514. Although only an upper and lower series 502 and 508 of outlets is illustrated in FIG. 14 as being disposed adjacent to the lower end portion of the container 446, it is contemplated that additional outlets could be provided along the side wall 444 of the container if desired.

In the embodiment of the invention illustrated in FIG. 14, the flow of gas from the outlets 504 and 510 is directed radially inward toward the longitudinal central axis of the fluidized bed 450. However, if desired, the outlets 504 and 510 could have horizontal central axes which are skewed relative to radial planes extending through the longitudinal central axis of the container 446. If this is done, the flow of gas from the outlets 504 and 510 would promote a swirling action in the fluidized bed to further promote uniform distribution of particulate in the fluidized bed 450.

Although the outlets 504 and 510 have been shown as being formed in the side wall 444 of the container 446, the outlets could be formed in small nozzles which extend from the side wall in either a radial direction or in a direction skewed to radial planes extending through the central axis of the container 446. The central axes of the nozzles could be disposed in horizontal planes. Alternatively, the central axes of the nozzles could slope upward or downward. The upward and/or downward sloping central axes may be skewed relative to radial planes to promote a swirling action in the fluidized bed 450.

In the embodiment of the invention illustrated in FIG. 14, a stirrer assembly has not been provided adjacent to the lower end portion of the fluidized bed 450. However, a stirrer assembly having the same general construction as the stirrer assembly 150 of FIGS. 3 and 5, could be provided in the lower portion of the fluidized bed 450 if desired. Of course, if this was done, the stirrer assembly would have to be disposed a sufficient distance above the bottom wall 472 to clear the upper ends of the fixtures 476.

Although the mold support 462 of FIG. 14 has the same construction as the mold support 48 of FIGS. 3 and 4, it is contemplated that the mold support 462 could be provided with gas outlets, in a manner similar to the mold support of FIG. 7. It is believed that the provision of gas outlets from the mold support 462 may be particularly advantageous when the outlets 504 and 510 are angled so as to promote a swirling action in the flow of gas around the side wall 444 in the fluidized bed 450.

Mold Moving Apparatus

Figure 15:
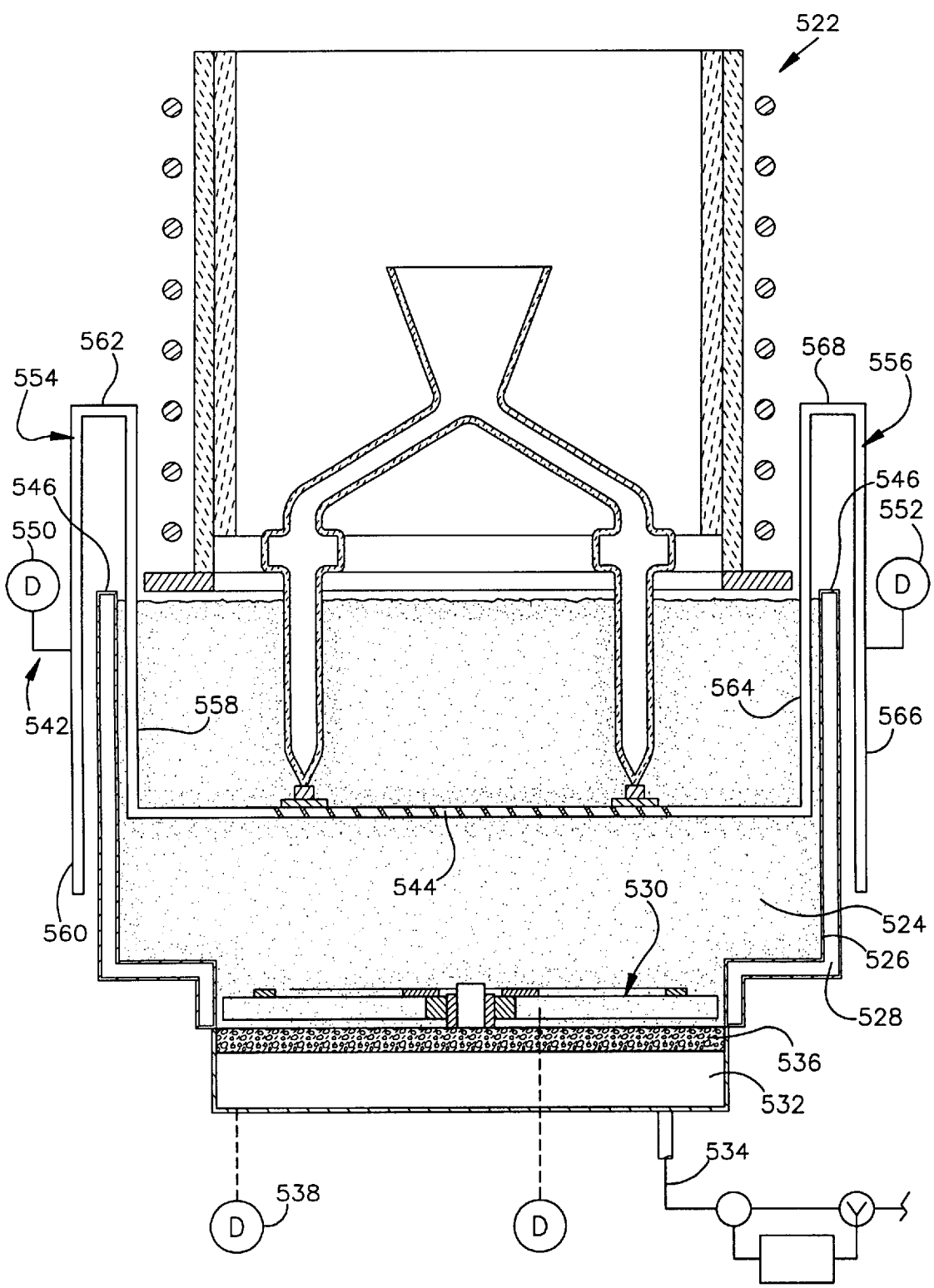
FIG. 15 is a schematic illustration depicting the manner in which a mold may be supported in a fluidized bed by a support assembly which extends across an upper end portion of a container for the fluidized bed and is connected with a drive assembly disposed outside of the fluidized bed.

In the embodiments of the invention illustrated in FIGS. 1–14, the apparatus for raising and lowering the mold includes a shaft which extends through a seal at the lower end portion of the fluidized bed. In the embodiment of the invention illustrated in FIG. 15 the necessity for providing a seal around a mold support shaft is eliminated. Since the embodiment of the invention illustrated in FIG. 15 is generally similar to the embodiments of the invention illustrated in FIGS. 1–14, therefore, similar terminology will be utilized to designate similar components. It should be understood that any one of the features of the embodiments of the invention illustrated in FIGS. 1–14 could be utilized in association with the embodiment of the invention illustrated in FIG. 15.

A furnace assembly 522 has the same general construction as the furnace assembly 40 of FIGS. 1–6. A fluidized bed 524 is disposed in a container 526 which is enclosed by a cooling jacket 528. A stirrer assembly 530 is disposed adjacent to a lower end portion of the fluidized bed 524 and is operable to promote distribution of the particulate in the fluidized bed. The stirrer assembly 530 has the same construction as the stirrer assembly 150 of FIGS. 3 and 5.

Gas is supplied to a plenum chamber 532 through a conduit 534. The gas flows from the plenum chamber 532 through a porous layer 536 into the fluidized bed 524 in the manner previously explained in conjunction with the embodiment of the invention illustrated in FIG. 3. A gas flow control apparatus, corresponding to the control apparatus of FIG. 10, may be provided to control the flow of gas to the plenum chamber 306. A container drive assembly 538 has the same construction as the container drive assembly 84 of FIGS. 1–6 and is operable to move the container 524 relative to the furnace assembly 502 in the manner previously described in conjunction with the embodiment of the invention illustrated in FIGS. 1–6.

In accordance with a feature of the embodiment of the invention illustrated in FIG. 15, a drive assembly 542 for raising and lowering a mold support 544 extends across an upper end portion 546 of the container 526. The mold support 544 is connected with a pair of drive units 550 and 552 by a plurality of generally U-shaped support members 554 and 556. Since the support members 554 and 556 extend across the circular upper end portion of the container 526, it is not necessary to provide seals in association with the support members.

The support member 554 includes an inner leg 558 which extends into the fluidized bed 524 and is connected with the mold support 544. In addition, the support member 554 includes an outer leg 560 which is connected with the drive unit 550. The inner and outer legs 558 and 560 are interconnected by a connector section 562. Similarly, the support member 556 includes an inner leg 564 and an outer leg 566. The outer leg 566 is connected with the drive unit 552. A connector section 568 interconnects the inner and outer legs 564 and 566.

The drive units 550 and 552 may be of the recirculating ball and nut type. The recirculating ball and nut drive units 550 and 552 may cooperate with screw threads formed on the outer legs 560 and 566 of the support members 554 and 556. Although only two support members 554 and 556 and drive units 550 and 552 have been illustrated in FIG. 15, it should be understood that additional support members and drive units may be connected with the mold support 544 if desired.

Since the support members 554 and 556 extend across the upper end portion 546 of the container 526, it is unnecessary to provide a seal between the fluidized bed 524 and a shaft, similar to the shaft 116 of FIG. 3, which supports a mold support, similar to the mold support 48 of FIG. 3. Although the mold support 544 has the same general construction as the mold support 48 of FIG. 4, the mold support 544 may be provided with gas discharge outlets in the same manner as is the mold support 182 of FIG. 7. It should also be understood that gas outlets could be provided along the side walls of the container in the manner illustrated in FIGS. 12–14.

Alternative Embodiment of Mold Moving Apparatus

Figure 16:
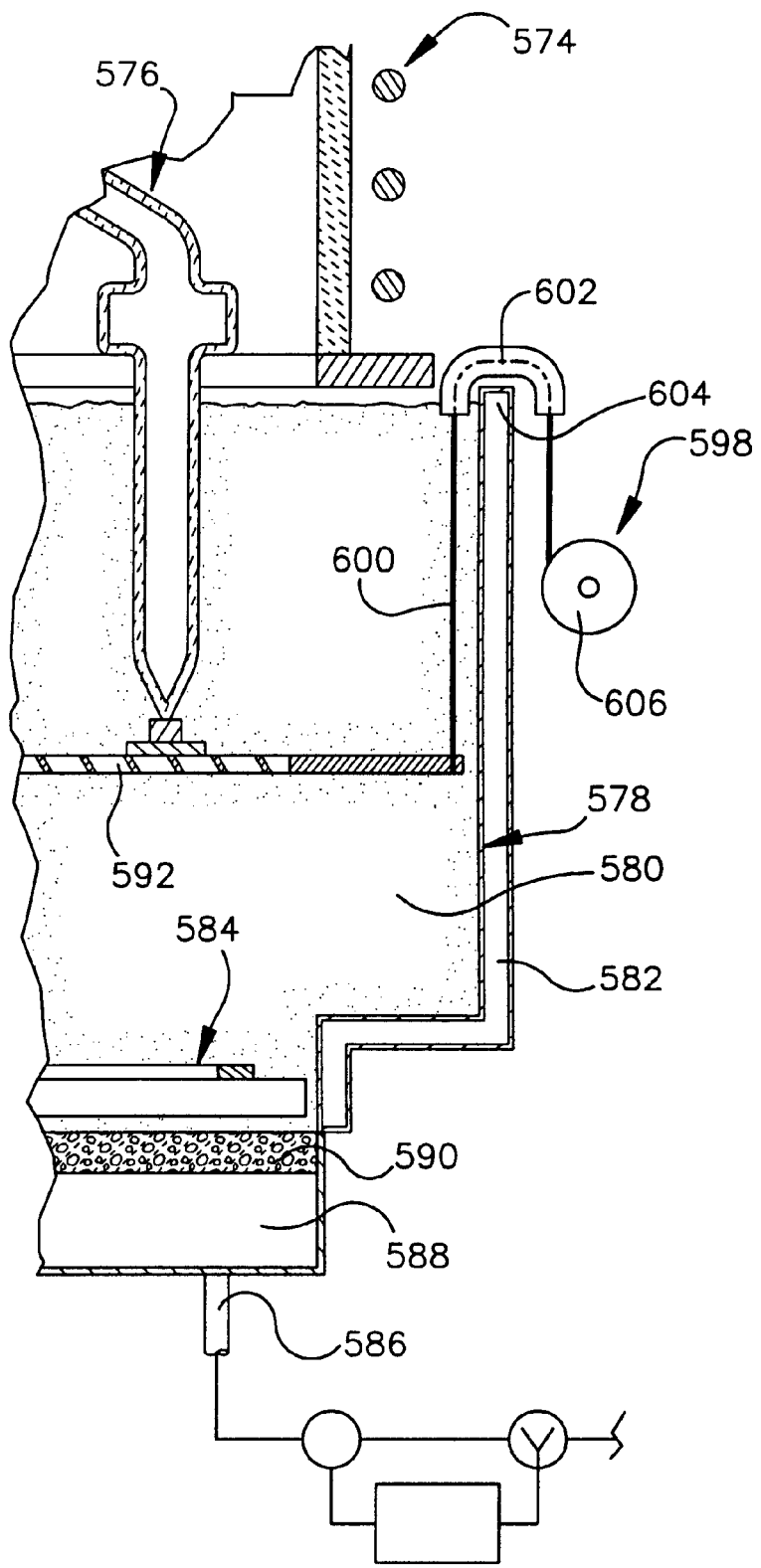
FIG. 16 is a fragmentary schematic illustration of an embodiment in which a support for a mold is suspended in a fluidized bed on elongated flexible members.

In the embodiment of the invention illustrated in FIG. 15, the mold support drive assembly 542 includes rigid support members 554 and 556 which are moved relative to the container 526. In the embodiment of the invention illustrated in FIG. 16, the rigid support members 554 and 556 of FIG. 15 have been replaced by flexible support members. Since the embodiment of the invention illustrated in FIG. 16 is generally similar to the embodiment of the invention illustrated in FIG. 15, similar terminology will be utilized to designate similar components. It should be understood that any of the features of the embodiments of the invention illustrated in FIGS. 1–15 may be utilized with the embodiment of the invention illustrated in FIG. 16.

A furnace assembly 574 (FIG. 16) receives a mold 576 in the same manner as previously discussed in conjunction with the embodiment of the invention illustrated in FIGS. 1–6. A container 578 holds a fluidized bed 580 and is enclosed by a cooling jacket 582. A stirrer assembly 584 is disposed in a lower end portion of the fluidized bed 580.

Gas under pressure is conducted through a conduit 586 to a plenum chamber 588. The gas flows from the plenum chamber 588 through a porous layer 590 into the fluidized bed 580. The mold 576 is supported in the fluidized bed 580 on a mold support 592.

The mold support 592 has the same construction as the mold support 48 of FIGS. 3 and 4. The stirrer assembly 584 has the same construction as the stirrer assembly 150 of FIGS. 3 and 5. The manner in which the gas under pressure is conducted from the plenum chamber 588 through the porous layer 590 into the fluidized bed 580 is the same as was previously described in conjunction with the embodiment of the invention illustrated in FIGS. 1–6.

In accordance with a feature of the embodiment of FIG. 16, a drive assembly 598 is provided to raise and lower the mold support 592. Although only a single drive assembly 598 has been illustrated in FIG. 16 in association with the mold support 592, it should be understood that additional drive assemblies (not shown) are connected with the mold support 592. The additional drive assemblies have the same construction as the drive assembly 598.

The drive assembly 598 includes an elongated flexible member 600. The elongated flexible member 600 may be a wire rope or similar article. The elongated flexible member 600 extends through a hollow tubular member 602 which is connected with an upper end portion 604 of the container 578. The drive assembly 598 includes a winch 606 which is connected with the elongated flexible member 600.

When the mold support 592 is to be raised relative to the fluidized bed 580, winches, corresponding to the winch 606, in the drive assemblies, corresponding to the drive assembly 598, are operated to wind up flexible elongated members 600. Similarly, when the mold support 592 is to be lowered, the winches, corresponding to the winch 606, are operated in the drive assemblies, corresponding to the drive assembly 598, to unwind the elongated flexible members and lower the mold support 592 into the fluidized bed 580.

Container Drive Assembly

Figure 17:
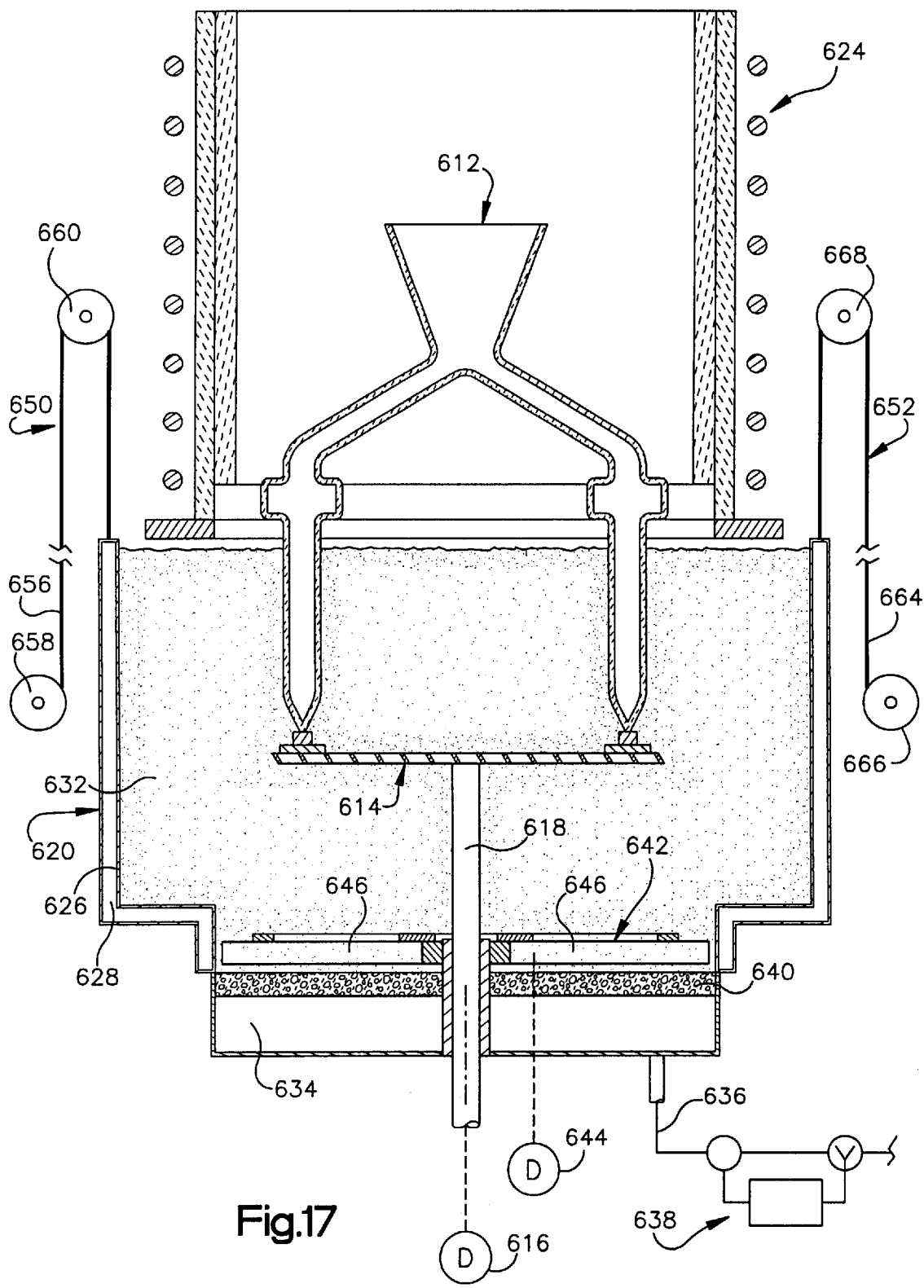
FIG. 17 is a fragmentary schematic illustration, generally similar to FIG. 3, illustrating an embodiment in which a fluidized bed is supported by flexible elongated members.

In the embodiment of the invention illustrated in FIGS. 1–16, a piston and cylinder type container drive assembly is utilized to raise and lower the container which holds the fluidized bed. In the embodiment of the invention illustrated in FIG. 17, elongated flexible members or cables are utilized to support, raise, and lower the container. Since the embodiment of the invention illustrated in FIG. 17 is generally similar to the embodiments of the invention illustrated in FIGS. 1–16, similar terminology will be utilized to designate similar components. It should be understood that one or more of the features of the embodiments of the invention illustrated in FIGS. 1–16 could be utilized with the embodiment of the invention illustrated in FIG. 17.

A mold 612 (FIG. 17) is supported on a mold support 614. A mold support drive assembly 616 is operable to move a shaft 618 relative to a container 620. Operation of the mold support drive assembly 616 moves the mold 612 into and out of a furnace assembly 624. If desired, the mold support drive assembly 616 could have the same construction as the mold support drive assembly 542 of FIG. 15 or the mold support drive assembly 598 of FIG. 16.

The container 620 includes a side wall 626 which is enclosed by a cooling jacket 628. The container 620 holds a fluidized bed 632. The fluidized bed 632 is formed by particulate suspended in a flow of gas, such as argon.

The gas for suspending the particulate in the fluidized bed 632 is conducted to a plenum chamber 634 through a conduit 636. A control apparatus 638 is provided to control the flow of gas in the same manner as previously described in conjunction with the embodiment of the invention illustrated in FIG. 10. The plenum chamber 634 could have a construction similar to the construction of the plenum 212 of FIG. 8 or the plenum 380 of FIG. 11 if desired.

The gas is conducted from the plenum chamber 634 (FIG. 17) through a porous layer 640 into the fluidized bed 632. A stirrer assembly 642 is disposed adjacent to a lower end portion of the fluidized bed. A drive assembly 644 is connected with the stirrer assembly 642 and is operable to move stirrer members 646 in the lower end portion of the fluidized bed 632 to promote uniform distribution of particulate in the fluidized bed. The stirrer assembly 642 has the same construction as the stirrer assembly 150 of FIGS. 3 and 5.

In accordance with a feature of the present invention, the container 620 (FIG. 17) and fluidized bed 632 are raised and lowered relative to the furnace assembly 624 by operation of container drive assemblies 650 and 652. The container drive assembly 650 includes a flexible cable or elongated member 656 which is connected with a winch 658. The cable 656 extends over a pulley 660 which is mounted for rotation about an axis disposed in a fixed relationship with the furnace assembly 624. An end of the cable is connected with an upper end of the container 620.

The container drive assembly 652 has the same construction as the container drive assembly 650 and includes a cable or elongated flexible member 664 which is connected with a winch 666. The cable 664 extends over a pulley 668 which is mounted for rotation about an axis disposed in a fixed relationship with the furnace assembly 624. An end of the cable 664 is connected with an upper end portion of the container 620.

When the container 620 is to be moved to the raised position illustrated in FIG. 17, the winches 658 and 666 are operated together to wind up the cables 656 and 654 on the winches. Similarly, when the container 620 is to be lowered, the winches 658 and 666 both are operated to unwind the cables 656 and 664 and lower the container.

In the embodiment of the invention illustrated in FIG. 16, a pair of container drive assemblies 650 and 652 are illustrated as being associated with opposite sides of the container 620. It should be understood that a greater number of container drive assemblies, for example, three, could be provided if desired. It should also be understood that although the container drive assemblies 650 and 652 include the flexible cables 656 and 664, the container drive assemblies could have a different construction if desired. For example, the container drive assemblies 650 and 652 could have a ball and nut type construction similar to the ball and nut type constructions of the drive units 550 and 552 of FIG. 15.

Suspended Mold

In the embodiment of the invention illustrated in FIGS. 3 and 4, a mold support is provided at one end of a shaft to engage a lower end portion of a mold and support the mold. In the embodiment of the invention illustrated in FIG. 9, the shaft directly engages a central portion of the mold and a peripheral portion of the mold is spaced from the shaft which supports the mold. In the embodiment of the invention illustrated in FIGS. 18 and 19, the mold is suspended for movement relative to a furnace and fluidized bed. By suspending the mold, the need for a shaft which extends through the fluidized bed is eliminated.

A mold 678 (FIG. 18) is suspended by a pair of movable support members 680 and 682. The support members 680 and 682 extend through an upper end portion of a furnace assembly 686 and are movable relative to the furnace assembly to raise and lower the mold 678. A container 690 is disposed below the furnace assembly 686 and holds a fluidized bed 692. A container drive assembly 694 is operable to raise and lower the container 690 relative to the furnace assembly 686. The container drive assembly 694 may have any one of the constructions illustrated in FIGS. 1–3 or FIG. 17.

A fluidized bed 692 is formed by suspending particulate in a flow of gas. The gas for forming the fluidized bed is conducted to a plenum chamber 696 through a conduit 698. A control apparatus 700 is provided to control the flow of gas to the plenum chamber 696. The gas flows from the plenum chamber 696 through a porous layer 704 into the fluidized bed 692. A stirrer assembly 706 is disposed at a lower end portion of the fluidized bed 692 and is operable to promote uniform distribution of particulate in the fluidized bed. The general construction of the container 690 and the manner in which the fluidized bed 692 is formed in the container is the same as was previously described in conjunction with the embodiment of the invention illustrated in FIG. 3.

The support member 680 is connected with a drive assembly 712 (FIG. 19 on sheet 6 of the drawings). The drive assembly 712 includes an elongated flexible member or cable 714 which is connected with a winch 716. The cable 714 extends around a pair of pulleys 720 and 722 which are disposed above the furnace assembly 686. An end of the cable 714 is connected with the support member 680.

A stabilizing frame 726 is provided to guide movement of the support member 680 relative to the furnace assembly 686. The stabilizing frame 726 includes a tubular guide member 730. A pair of support members 732 and 733 are provided to fixedly support the guide member 730 above the furnace assembly 686.

Figure 18:
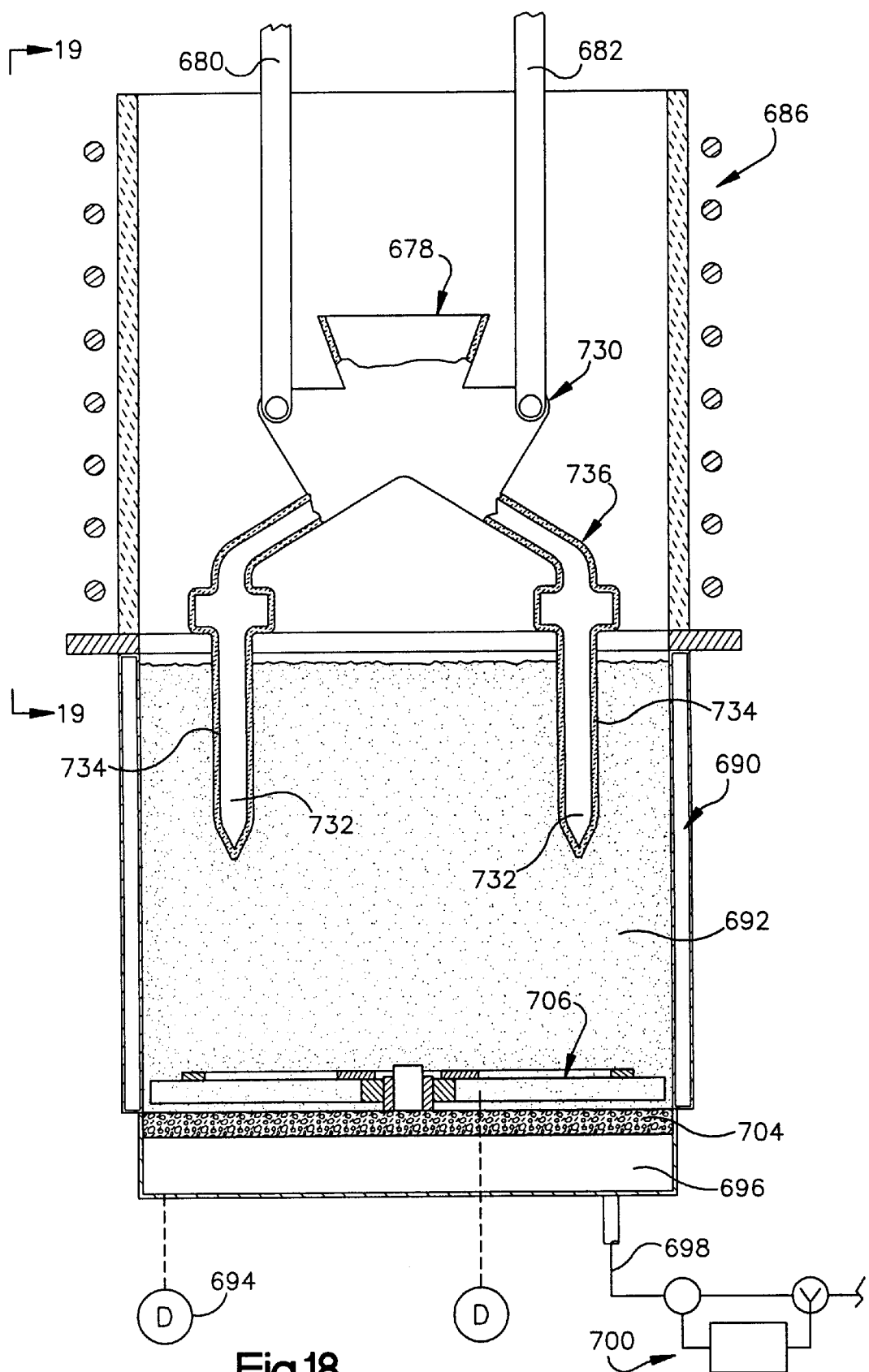
FIG. 18 is a schematic illustration, generally similar to FIG. 3, depicting the manner in which a mold may be suspended by upwardly extending members.

Although only the drive assembly 712 for raising and lowering the support member 680 is illustrated in FIG. 19, it should be understood that a similar drive assembly is provided in association with the support member 682 (FIG. 18). The drive assemblies for the support members 680 and 682 are operable to raise the mold 678 into the furnace assembly 686. After molten metal has been poured into the mold 678 in the furnace 686, the drive assemblies for the support members 680 and 682 are operable to lower the mold 678 into the fluidized bed 692. Due to the relatively hot environment of the furnace assembly 686, that is between 2,500 degrees Fahrenheit and 3,000 degrees Fahrenheit, the support members 680 and 682 may be formed of graphite.

In the embodiment of the invention illustrated in FIG. 18, the support members 680 and 682 are connected with a central portion 738 of the mold 678. The support members 680 and 682 may be connected with graphite rods which extend through passages formed in the central portion of the mold 678. A plurality of article mold cavities are formed in article mold sections 734 disposed in a circular array in a peripheral portion 736 of the mold 678. The article mold sections are spaced apart from each other to enable the gas suspended particulate of the fluidized bed 692 to engage the peripheral portion 736 of the mold around the article mold sections 734. Since the mold 678 is suspended, lower end or bottom surfaces on the article mold sections 734 are completely exposed to the particulate in the fluidized bed 692.

Although the drive assembly 712 uses cables 714 to suspend the mold 678, the mold could be suspended in a different manner if desired. For example, the support members 680 and 682 could be connected with ball nut and screw type drive assemblies if desired. Although the support members 680 and 682 are connected with cables at a location outside of the upper housing for the furnace assembly 686, the support member drives could be disposed within the upper housing, corresponding to the upper housing 32 of FIG. 1.

Mold with Through Passages

Figure 20:
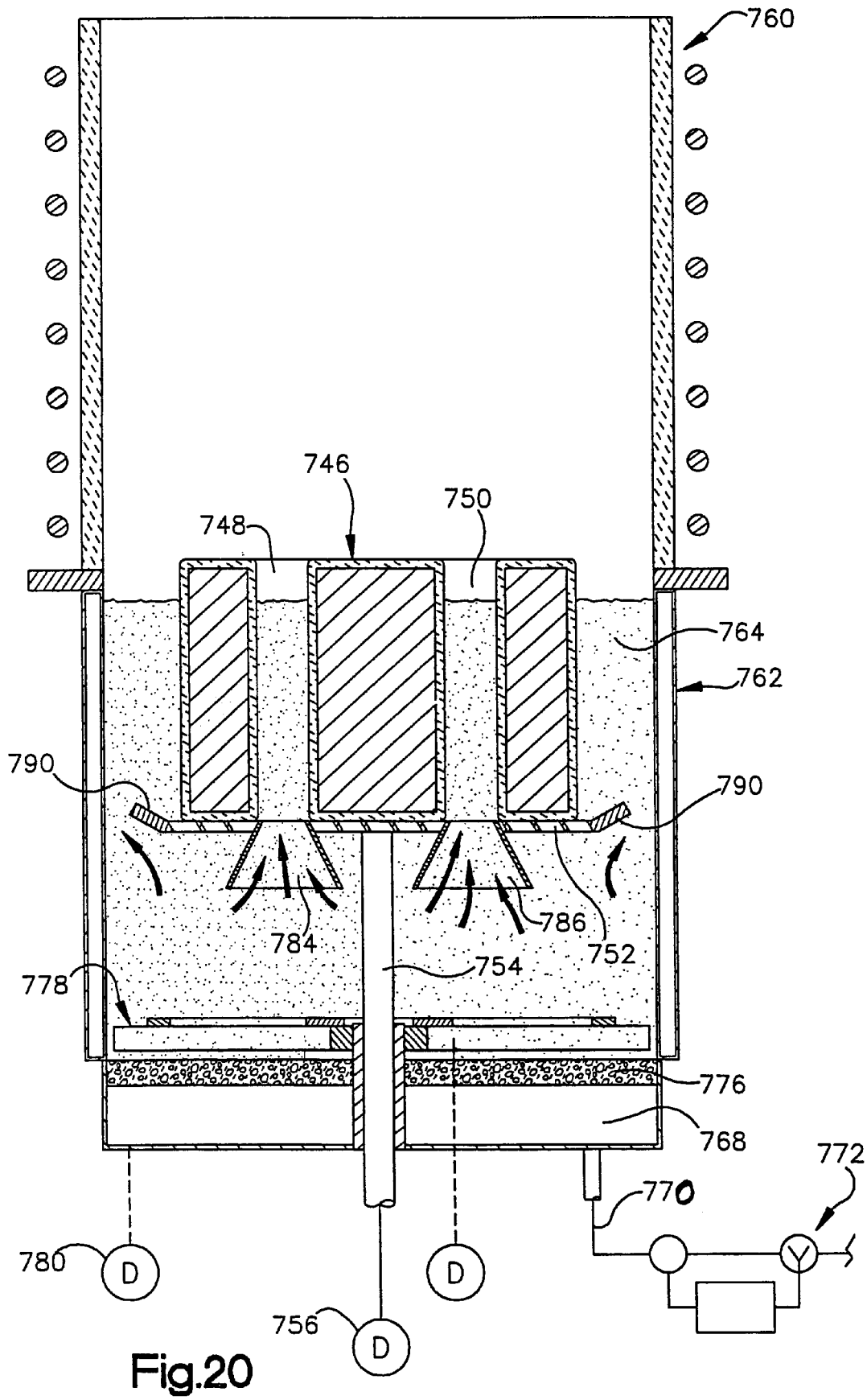
FIG. 20 is schematic illustration, generally similar to FIG. 3, depicting the manner in which a flow of gas and particulate is conducted through passages formed in a mold.

In the embodiment of FIGS. 1–19, the illustrated molds have been provided with a peripheral portion having a plurality of spaced apart article mold sections. The material of the fluidized bed flows around the outside of each of the article mold sections. In the embodiment of the invention illustrated in FIG. 20, the material of the fluidized bed flows through passages in the mold. Since the embodiment of the invention illustrated in FIG. 20 is generally similar to the embodiments of the invention illustrated in FIGS. 1–19, similar terminology will be utilized to designate similar components. It should be understood that one or more of the features of the embodiments of the invention illustrated in FIGS. 1–19 may be utilized in association with the embodiment of the invention illustrated in FIG. 20.

A mold 746 has passages 748 and 750 which extend through the mold. The mold is disposed on a mold support 752. The mold support 752 is connected with a shaft 754 which is vertically movable by a mold support drive assembly 756. The mold support drive assembly 756 is operable to raise and lower the mold 746 relative to a furnace assembly 760 and a container 762. The container 762 holds a fluidized bed 764 formed by particulate suspended in a flow of gas.

Gas is supplied to a plenum chamber 768 through a conduit 770. The flow of gas through the conduit 770 is controlled by a control apparatus 772. The control apparatus 772 is operable to control the flow of gas to the plenum chamber 768 in the same manner as previously described in conjunction with the embodiment of the invention illustrated in FIG. 10. The gas flows from the plenum chamber 768 through a porous layer 776 into the fluidized bed 764.

A stirrer assembly 778 is disposed in the lower end portion of the fluidized bed 764 to promote even distribution of particulate in the fluidized bed. A container drive assembly 780 is connected with the container 762 and is operable to raise and lower the container relative to the furnace assembly 760. The stirrer assembly 778 and container drive assembly 780 have the same construction and mode of operation as the stirrer assembly 150 and container drive assembly 84 of FIGS. 1–5.

The cylindrical passages 748 and 750 extend through the mold 746. In the embodiment of the invention illustrated in FIG. 20, it is desired to have the article solidify in the mold 746 in a direction away from the passages 748 and 750. To promote solidification of the molten metal in the mold 746 in a direction away from the passages 748 and 750, flow of gas and particulate in the fluidized bed 764 through the passages is promoted by baffles 784 and 786.

The baffles 784 and 786 have a generally frustroconical configuration and are fixedly connected with the mold support 752. The baffles 784 and 786 extend downward from the mold support 752 and flare radially outward and downward. This results in the baffles promoting a flow of gas with particulate suspended therein through the passages 748 and 750.

The relatively high rate of flow of the material of the fluidized bed 764 through the passages 748 and 750 increases the rate of heat transfer from surfaces defining the passages 748 and 750 to the fluidized bed 764. This results in the molten metal adjacent to the surfaces defining the passages 748 and 750 solidifying before the molten metal in the remainder of the mold 746.

To retard the solidification of molten metal in the mold 746 adjacent to outer side surfaces of the mold, an annular baffle 790 flares radially outward and upward from the mold support 752. The baffle 790 promotes a flow of gas and particulate in the fluidized bed 764 away from the outer side surfaces of the mold 746.

In FIG. 20, the baffles 784, 786 and 790 have been illustrated as being connected with the mold support 752. It is contemplated that the baffles could be connected with the side wall of the container 762 if desired. The baffles may be supported on struts which extend into the fluidized bed 764 from the side wall of the container. This would enable gas and particulate to flow through passages disposed between the side wall of the container and the baffles.

Mold with Baffle

Figure 21:
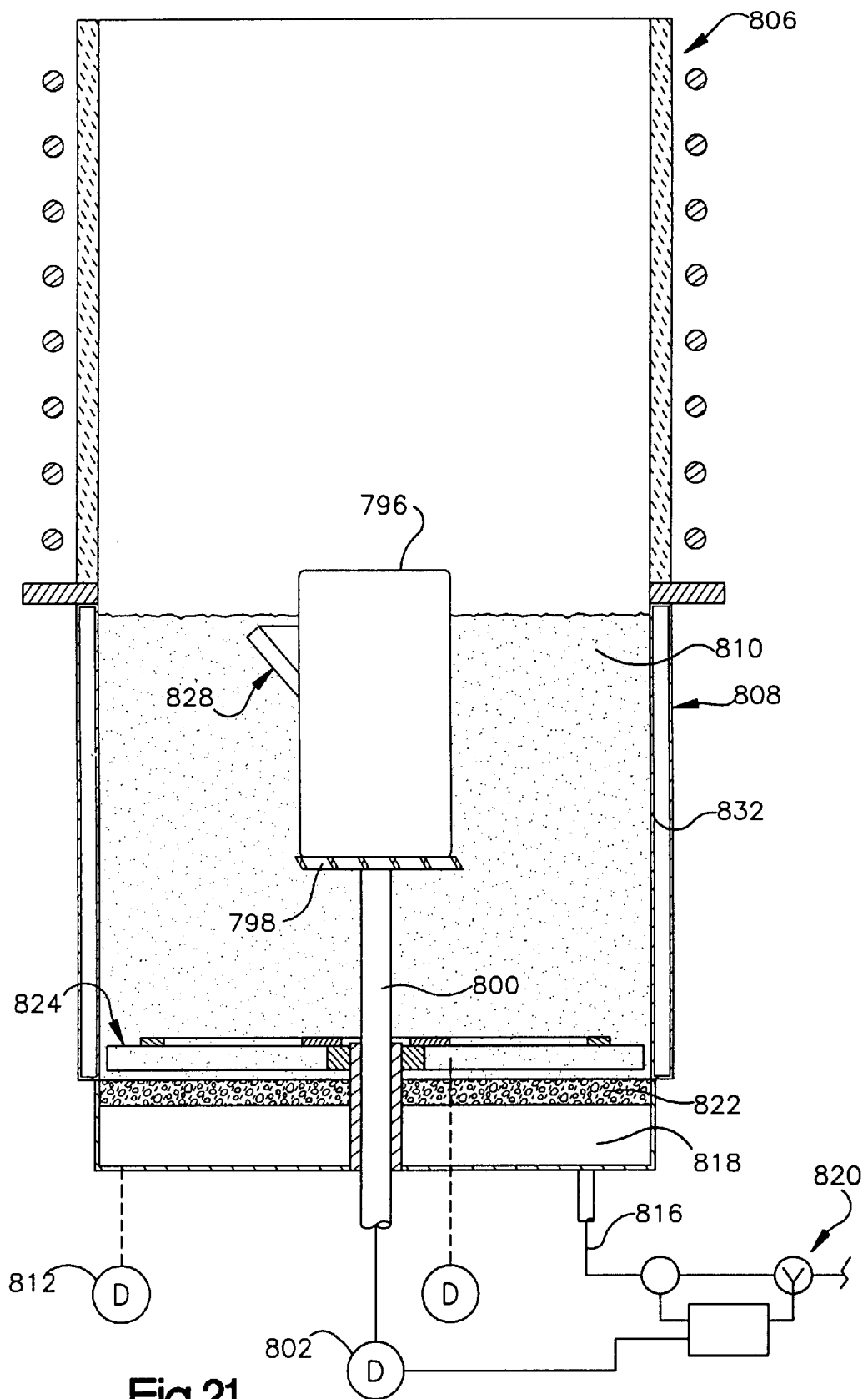
FIG. 21 is a schematic illustration, generally similar to FIG. 20, depicting the manner in which a baffle may be integrally formed with a mold to deflect a flow of gas and particulate in a fluidized bed.

In the embodiment of the invention illustrated in FIG. 20, the baffles 784, 786 and 790 are fixedly connected with the mold support 752. In the embodiment of the invention illustrated in FIG. 21, a baffle is integrally formed with the mold. Since the embodiment of the invention illustrated in FIG. 21 is generally similar to the embodiments of in FIGS. 1–20, similar terminology will be utilized to designate similar components. It should be understood that one or more of the features of the embodiments of the invention illustrated in FIGS. 1–20 may be utilized in association with the embodiment of the invention illustrated in FIG. 21.

A mold 796 is disposed on a mold support 798. The mold support 798 has the same construction as the mold support 48 of FIGS. 3 and 4. It should be understood that gas outlets could be associated with the mold support 798 in the manner illustrated schematically in FIG. 7 for the mold support 182.

The mold support 798 is disposed on the upper end of a shaft 800 connected with a mold support drive assembly 802. The mold support drive assembly 802 is operable to raise and lower the mold support 798 and mold 796 relative to a furnace assembly 806 and a container 808. The container 808 holds a fluidized bed 810. The container 808 and fluidized bed 810 can be raised and lowered relative to the furnace assembly 806 by a container drive assembly 812.

The fluidized bed 810 contains particulate suspended in a flow of gas. Gas is supplied to the fluidized bed 810 from a conduit 816. The conduit 816 is connected with a plenum chamber 818. A flow of gas, that is argon, to the plenum chamber 818 is regulated by a control apparatus 820 having the same construction and mode of operation as the control apparatus 318 of FIG. 10. The gas under pressure flows from the plenum chamber 818 through a porous layer 822 into the fluidized bed 810. A stirrer assembly 824 is provided in the lower end portion of the fluidized bed 810 and has the same construction as the stirrer assembly 150 of FIGS. 3 and 5.

In accordance with a feature of the embodiment of FIG. 21, the mold 796 is provided with a baffle 828 which extends outward from one side of the mold 796. The baffle 828 and the mold 796 are integrally formed as one piece of ceramic mold material. The baffle 828 slopes outward and upward from the mold 796. The baffle 828 directs flow of gas and suspended particulate in the fluidized bed 810 away from the mold 796. This results in a lower rate of heat transfer from the portion of the mold disposed directly above the baffle. Therefore, the molten metal in the portion of the mold 796 disposed directly above the baffle will tend to solidify slower than the molten metal in other portions of the mold.

In addition to providing baffle 828 in association with a mold, a baffle could be fixedly connected with a side wall 832 of the container 808 or with the mold support 798. Rather than deflecting a flow of gas and suspended particulate in a direction away from the mold 796, baffles connected with the mold support 798 or side wall 832 could be oriented so as to deflect the flow of gas and particulate in the fluidized bed 810 in a direction toward the mold 796. This may be accomplished in much the same manner as in which the baffles 784 and 786 of FIG. 20 direct a flow of gas and particulate in the fluidized bed 764 into the passages 748 and 750. Of course, there will be a relatively high heat transfer rate from the portion of the mold 796 (FIG. 21) toward which a flow of gas and suspended particulate in the fluidized bed 810 is directed by baffles.

It is contemplated that, in addition to baffles, insulating material may be associated with the mold 796 to promote or retard solidification of molten metal in selected portions of the mold. The insulating material may be used by itself or in conjunction with baffles. The insulating material is applied over portions of the mold 796 in which it is desired to reduce the heat transfer rate from the mold. This will result in the molten metal in portions of the mold 796 which are not covered with insulating material solidifying faster than molten metal in a portion of the mold covered by insulating material.

Casting of Thin Wall Article

Figure 22:
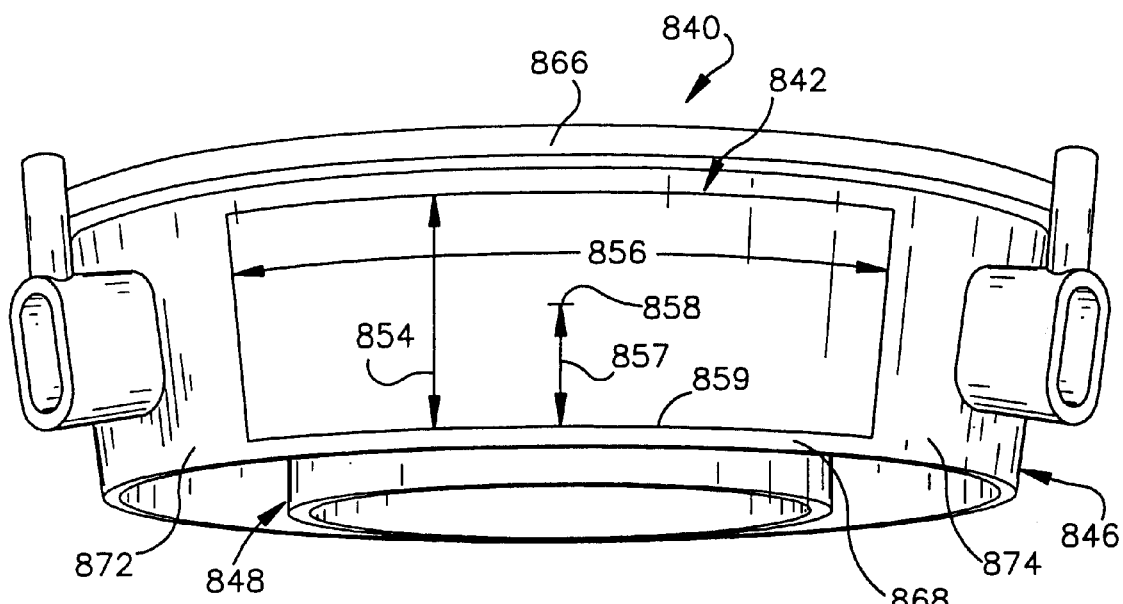
FIG. 22 is an illustration of a cast metal turbine engine component.
Figure 23:
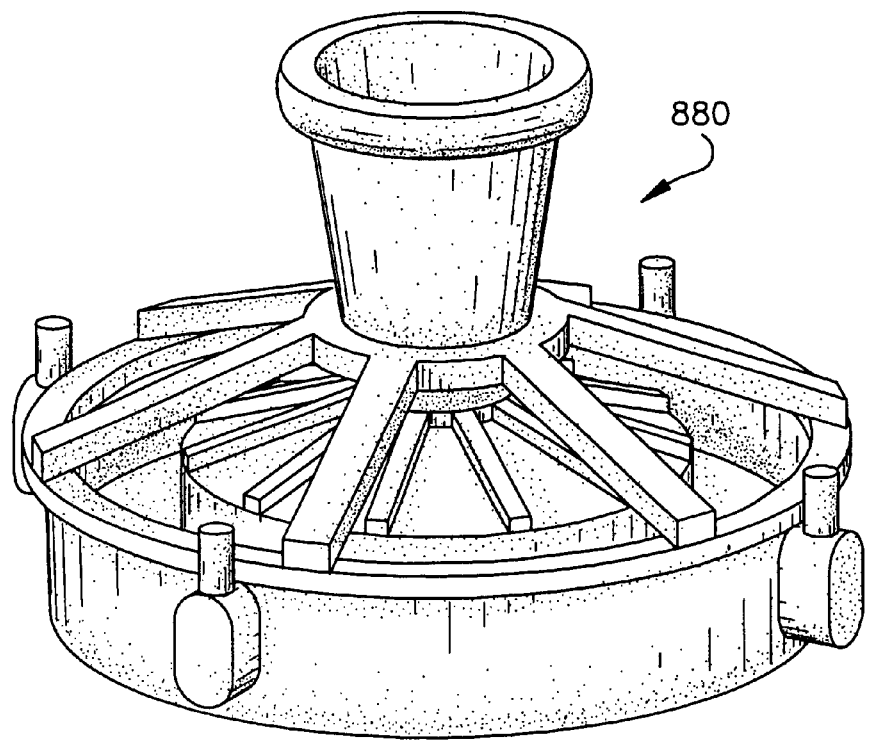
FIG. 23 is a schematic pictorial illustration of a mold for the turbine engine component of FIG. 22.
Figure 24:
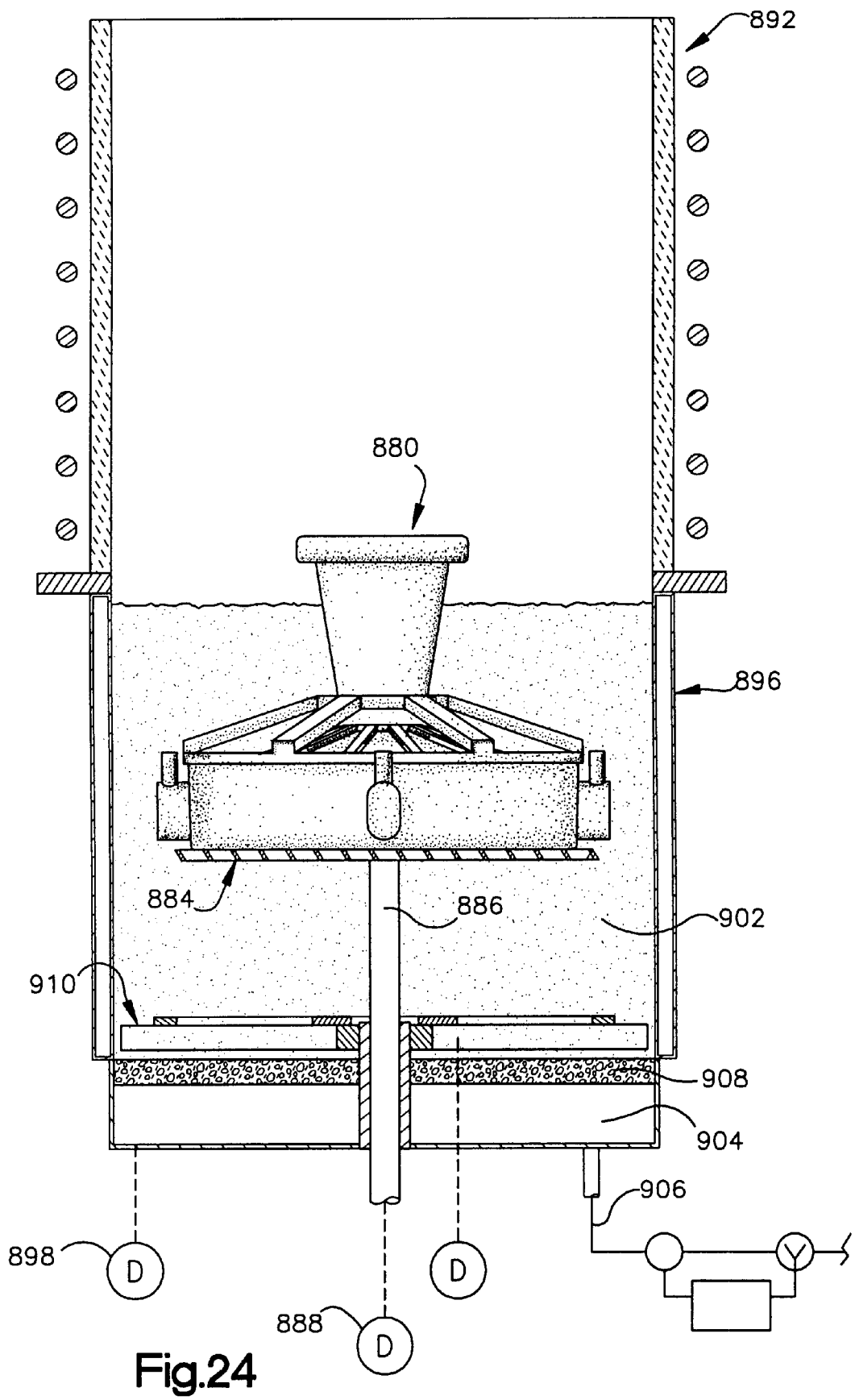
FIG. 24 is a schematic illustration, generally similar to FIG. 3, depicting the manner in which the mold of FIG. 23 is lowered from a furnace into a fluidized bed.

In the embodiment of the invention illustrated in FIGS. 1–6, a mold for casting airfoils or similar components is disclosed. It is contemplated that the mold may be constructed so as to cast many different types of articles. An article having a thin wall portion and a mold and method for casting the article are disclosed in FIGS. 22–24. Since the embodiment of the invention illustrated in FIGS. 22–24 is generally similar to the embodiments of in FIGS. 1–21, similar terminology will be utilized to designate similar components. It should be understood that one or more of the features of the embodiments of the invention illustrated in FIGS. 1–21 may be utilized with the embodiment of the invention illustrated in FIGS. 22–24.

A turbine engine component 840 having a thin wall portion 842 is cast as one piece. The cast turbine engine component 840 has a generally cylindrical outer wall 846 which circumscribes and is coaxial with a generally cylindrical inner wall 848. The inner and outer walls 846 and 848 are interconnected, in a known manner, by radially extending struts (not shown). It should be understood that although the turbine engine component 840 has been illustrated in FIG. 22, it is contemplated that the present invention may be utilized to cast articles other than turbine engine components.

The thin wall portion 842 of the turbine engine component 840 has an as-cast thickness of 0.060 of an inch or less. The as-cast thin wall portion 842 has an axial extent, indicated at 854 in FIG. 22, and a circumferential extent indicated at 856 in FIG. 22. The distance 857 from a center 858 of the thin wall portion 842 to a closest edge 859 of the thin wall portion divided by the thickness of the thin wall portion is equal to forty or more.

In the turbine engine component 840, the axial and circumferential extents 854 and 856 of the thin wall portion 842 are such that the as-cast inner and outer major side surfaces of the thin wall portion 842 have a surface area of at least sixteen square inches. The side surfaces of the thin wall portion have an extent of at least four inches along each axis of a pair of orthogonal axes. Thus, the width 854 and length 856 are both at least four inches.

The thin wall portion 842 has a uniform thickness and extends axially between a relatively thick circular upper rim or frame 866 and a relatively thick lower rim or frame 868. In the turbine engine component 840, the thin wall portion 842 does not extend completely around the turbine engine component but is bounded by relatively thick side or frame sections 872 and 874 which extend between the rim or frame sections 866 and 868.

The turbine engine component 840 has the same construction as is disclosed in U.S. Pat. No. 4,724,891. In order to avoid prolixity of description, the disclosure in the aforementioned U.S. Pat. No. 4,724,891 is hereby incorporated herein in its entirety by this reference thereto.

Although one specific turbine engine component 840 has been illustrated in FIG. 22, it should be understood that other metal articles may be cast using the advantages of the present invention. For example, the metal article could have the configuration corresponding to the configuration of a thin metal airfoil. Alternatively, the metal article could have a configuration corresponding to the configuration of a portion of a housing which could be used in association with a turbine engine. Although the article 840 has frame portions 866 and 868, the entire article could be formed by the thin wall portion 842. It is contemplated that the metal article could have the same construction as disclosed in U.S. Pat. No. 6,050,325. The disclosure in the aforementioned U.S. Pat. No. 6,050,325 is hereby incorporated herein in its entirety by this reference thereto.

The cast article, regardless of its configuration, may be formed of any desired metal, including a nickel-chrome superalloy, titanium or a titanium alloy.

When the article 840 is to be cast, a wax pattern having a configuration corresponding to the configuration of the article is formed. The wax pattern may be formed of natural or synthetic wax materials. A wax pour cup pattern and a wax gating pattern is connected with the wax pattern of the article 840.

After the wax pattern has been assembled, it is repetitively dipped in a slurry of ceramic mold material and dried to form a covering of a desired thickness over the pattern. The covering of ceramic mold material and pattern are then heated to a temperature sufficient to melt the wax forming the pattern. This wax is drained from the covering of ceramic mold material to leave a mold 880 (FIG. 23). The mold 880 has the same construction as is disclosed in the aforementioned U.S. Pat. No. 4,724,891. However, if the article to be cast has a different configuration, such as the configuration disclosed in U.S. Pat. No. 6,050,325, the mold would have a different configuration.

When the article 840 is to be cast in the mold 880, the mold is positioned on a mold support 884 disposed on the upper end of a shaft 886 (FIG. 24). The shaft 886 is connected with a mold support drive assembly 888. The mold support drive assembly 888 is operated to raise the mold 880 into a furnace assembly 892 in the same manner as previously described in conjunction with FIGS. 1 and 2 herein.

A container 896 is raised to a position immediately below the furnace 892 by a container drive assembly 898. A fluidized bed 902 is held in the container 896. The fluidized bed is formed by particulate suspended in a flow of gas.

Gas (argon) is supplied to a plenum chamber 904 at the lower end portion of the container 896 through a conduit 906. The gas flows from the plenum chamber 904 through a porous layer 908 into the fluidized bed 902. A stirrer assembly 910 is disposed at a lower end portion of the fluidized bed 902 to promote uniform distribution of particulate in the fluidized bed.

When the mold 880 has been filled with molten metal in the furnace 892 in the same manner as previously described in conjunction with the embodiment of the invention illustrated in FIGS. 1–6, the mold support drive assembly 888 is operated to lower the mold support 884 into the fluidized bed 902. As the mold 880 is lowered into the fluidized bed, the molten metal in the mold is solidified to form a cast metal article, such as the turbine engine component 840 of FIG. 22.

Bellows

Figure 25:
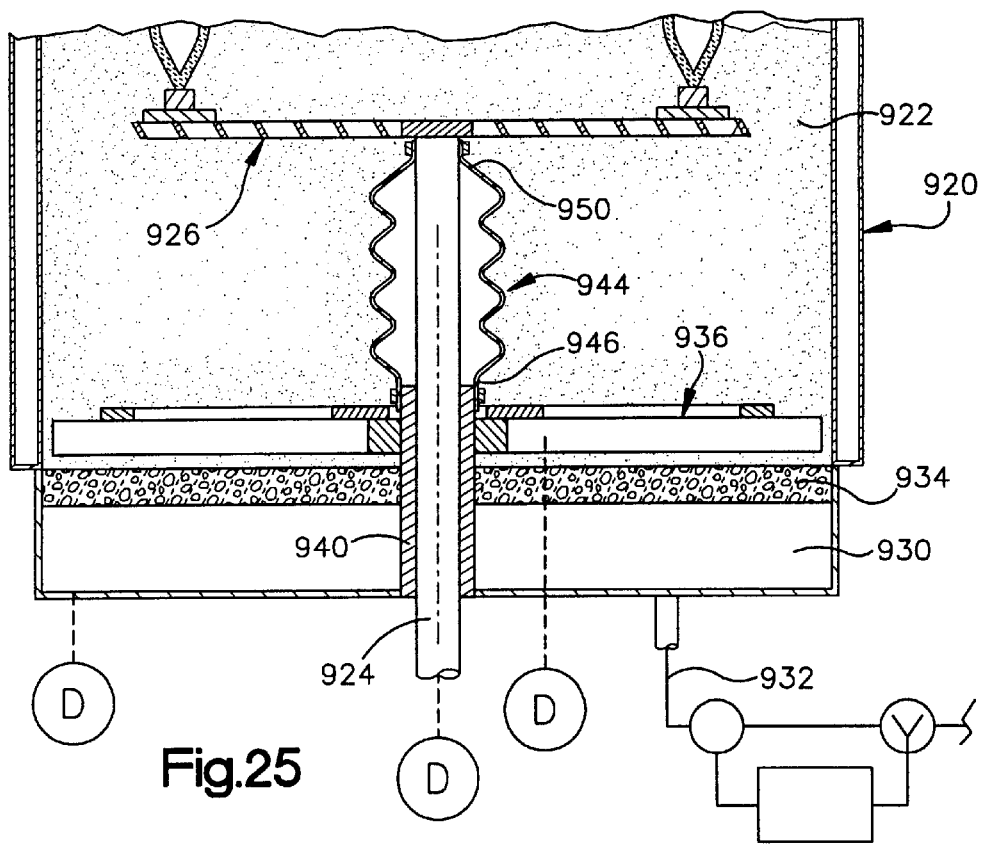
FIG. 25 is a schematic illustration depicting the manner in which a bellows may be connected with a mold support and a container for a fluidized bed.
Figure 26:
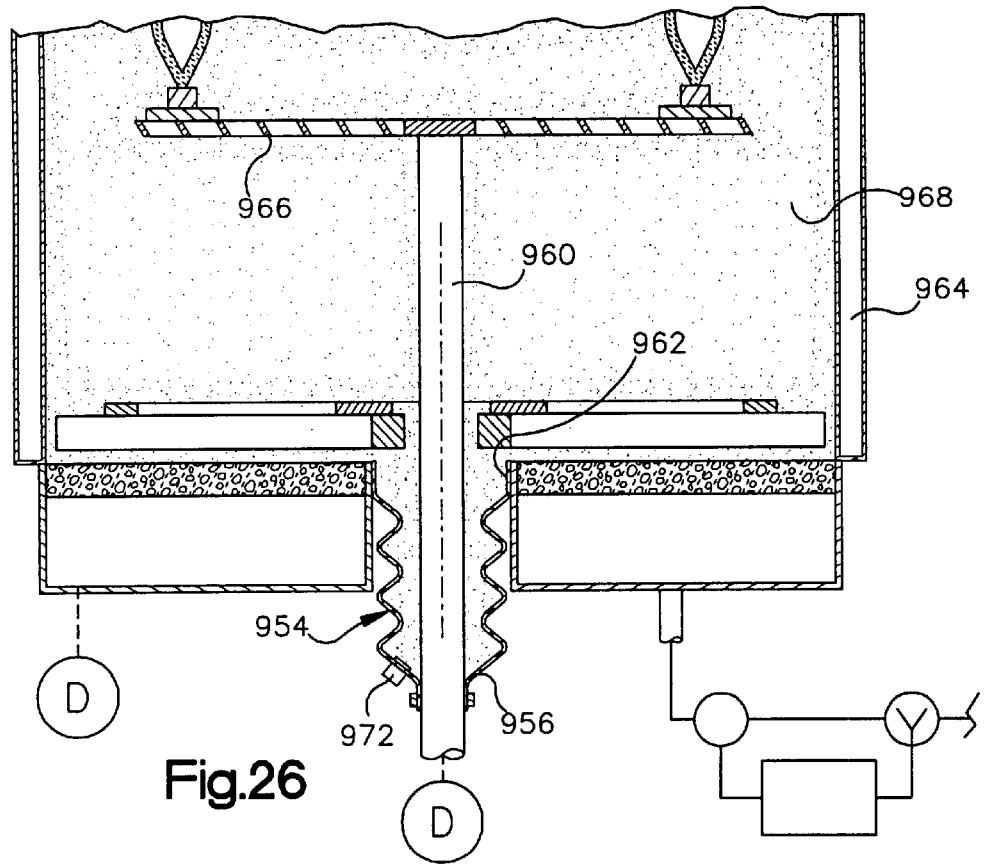
FIG. 26 is a schematic illustration, generally similar to FIG. 25, illustrating an alternative manner of connecting a bellows with a mold support and container for a fluidized bed.

In the embodiment of the invention illustrated in FIG. 3, the shaft 116 extends through a seal into the fluidized bed 86. Exposure of the seal to particulate in the fluidized bed may tend to impair the effectiveness of the seal. In the embodiment of the invention illustrated in FIGS. 25 and 26, a bellows is provided to protect the seal. Since the embodiment of the invention illustrated in FIGS. 25 and 26 is generally similar to the embodiments of in FIGS. 1–24, similar terminology will be utilized to designate similar components. It should be understood that one or more components from the embodiments of the invention illustrated in FIGS. 1–24 may be utilized with the embodiments of the invention illustrated in FIGS. 25 and 26.

A container 920 (FIG. 25) holds a fluidized bed 922. A shaft 924 has an upper end portion which is connected with a mold support 926. A mold support drive assembly is connected with the shaft 924 and is operable to raise and lower the mold support 926 relative to the container 920 and fluidized bed 922.

The fluidized bed 922 is formed by particulate suspended in a flow of gas. Gas for the fluidized bed is supplied to a plenum chamber 930 through a conduit 932. The gas flows from the plenum chamber 930 through a porous layer 934 into the fluidized bed 922. A stirrer assembly 936 is disposed in a lower end portion of the fluidized bed 922 to promote uniform distribution of particulate in the fluidized bed.

The mold support 926 has the same construction as the mold support 48 of FIGS. 3 and 4. However, it is contemplated that gas outlets could be provided in association with the mold support 926 in the same manner as previously described in conjunction with the embodiment of the invention illustrated in FIG. 7.

During operation of the mold support drive assembly to raise and lower the mold support 926, the shaft 924 moves axially relative to a combination seal and bearing member 940. In order to protect a bearing member 940 from exposure to the particulate in the fluidized bed 922, a bellows 944 extends around the shaft. A lower end portion 946 of the bellows is connected with the bearing member 940 and the lower end portion of the container 922. An upper end portion 950 of the bellows is connected with the shaft 924 and immediately beneath the mold support 926.

When the mold support 926 is lowered, the bellows 944 is contracted. Similarly, when the mold support 926 is raised, the bellows 944 is extended. The bellows 944 prevents the particulate in the fluidized bed 922 from flowing into the bearing 944 during raising and lowering of the mold support 926.

In the embodiment of the bellows illustrated in FIG. 25, the bellows has pleats formed by annular folds which extend around the bellows. It is contemplated that the bellows 944 could be formed by a flexible cloth element which would not have pleats but would merely move from an extended condition substantially free of folds to a retracted condition having randomly arranged folds. The flexible cloth element may have a construction similar to known boot seals.

In the embodiment of the invention illustrated in FIG. 25, the particulate material may tend to become packed in the folds of the bellows. When this occurs, it may be difficult to collapse the bellows 944.

In the embodiment of the invention illustrated in FIG. 26, the bellows is extended as the mold support is lowered so that packing of particulate in the folds of the bellows does not interfere with lowering of the mold support. Thus, a bellows 954 has a lower end portion 956 fixedly connected with a shaft 960. An upper end portion 962 of the bellows is fixedly connected with a container 964.

When the shaft 960 and mold support 966 are lowered, the bellows 954 expands. As this occurs, the extent of the folds in the bellows 954 decreases. The interior of the bellows 954 is connected in fluid communication with the fluidized bed 968 in the container 964. Therefore, particulate may flow from the fluidized bed 968 into the bellows.

Once the mold support 966 has been lowered, air under pressure may be conducted through an inlet 972 to the interior of the bellows. This air pressure will tend to blow the particulate out of the inside of the bellows. During subsequent use of the apparatus, the air inlet is closed.

If desired, the bellows 954, like the bellows 944 of FIG. 25, may be replaced with a flexible cloth element. The flexible element will not have pleats which define folds in a flexible wall which extends around the shaft 960.

Conclusion

The present invention relates to a new and improved method and apparatus (FIGS. 1–26) for use in casting a metal article. During casting of the metal article, a mold, for example the mold 46 of FIG. 3, is moved into a fluidized bed 86. As the mold 46 moves into the fluidized bed 86, molten metal in the mold is solidified.

In one specific instance, the mold 46 is raised into a furnace assembly 40 where the mold is filled with molten metal. A container 50 holding the fluidized bed 86 is moved to a raised position adjacent to the furnace assembly 40. The mold 46 is lowered into the fluidized bed 86 in the container. The container 50 is lowered.

A stirrer member 150 may be provided in the fluidized bed 86 to promote distribution of particulate in a flow of gas through the fluidized bed. A support 48 for the mold 46 may have a plurality of openings 120 to enable gas and particulate to flow through the support for the mold. Fluid may be conducted from the support for the mold (FIG. 7) to promote fluidization of particulate. Fluidization of the particulate may also be promoted by conducting gas at different pressures (FIGS. 8 and 11) into different locations in the fluidized bed.

The mold 46 (FIG. 3) may be constructed with a central portion 126 and a peripheral portion 128 in which a plurality of article mold cavities 138 are disposed. The mold may be supported by engaging the central portion of the mold (FIGS. 9 and 18). The peripheral portion of the mold may be spaced from the support (FIGS. 9 and 18) to facilitate heat transfer from the article mold cavities. The central portion of the mold may be suspended from an upwardly extending support (FIG. 18) or may rest on a downwardly extending support (FIG. 9).

The side walls of the container for the fluidized bed may be configured so as to effect a change in the speed of movement of the gas in which the particulate is suspended through the fluidized bed (FIGS. 10 and 11). Baffles (FIGS. 20 and 21) may be provided in association with the fluidized bed to deflect portions of the flow of fluidized material in the bed. Bellows (FIGS. 25 and 26), which may be flexible sleeves, are advantageously associated with apparatus which extends into the fluidized bed to minimize exposure of seals to the particulate in the fluidized bed.

When the molten metal solidifies in the mold, the molten metal may be solidified with a cellular front (FIG. 6) which is free of dendrites. By solidifying the molten metal with a cellular front which is free of dendrites, the characteristics of the resulting casting are enhanced.

It has been established that satisfactory solidification of molten metal in a mold (FIGS. 1–25) may be obtained when a flow of gas is conducted through the fluidized bed at a flow rate of between 5 and 100 cubic feet per hour for each square foot of the fluidized bed in a horizontal plane. The upper portion of the fluidized bed may be exposed to a fluid pressure of between $6 \times 10^{-4}$ atmospheres to 1.0 atmosphere. The maximum temperature at the upper portion of the fluidized bed may vary within a range of 2,500 degrees Fahrenheit and 3,000 degrees Fahrenheit.

It should be understood that any one of the features mentioned herein and/or additional features may be utilized by itself or in combination with other features of the invention. It should also be understood that the invention is not to be limited to any one of the specific embodiments disclosed herein. This is because there are many different ways in which the various features of the invention may be used together or separately and in which they may be changed from the specific embodiments disclosed herein.

Having described the invention, the following is claimed:

1. A method of casting a metal article, said method comprising the steps of raising a mold from a lowered position in which the mold is disposed below a furnace assembly to a raised position in which the mold is at least partially disposed in the furnace assembly, raising a container from a lowered position in which the container is disposed below the furnace assembly to a raised position in which the container is adjacent to the furnace assembly, lowering the mold from the raised position into a fluidized bed in the container while the container is in the raised position, solidifying molten metal in the mold while the mold is at least partially enclosed by the fluidized bed, and lowering the container.

2. A method as set forth in claim 1 wherein the fluidized bed includes particulate suspended in a flow of gas, said method further includes moving a stirrer member in a lower portion of the container to promote a uniform distribution of particulate in the flow of gas.

3. A method as set forth in claim 2 wherein said step of moving a stirrer member in a lower portion of the container includes rotating the stirrer member about an axis which extends parallel to a longitudinal axis of a path along which the container is raised from the lowered position to the raised position.

4. A method as set forth in claim 3 wherein said step of rotating the stirrer member about the axis which extends parallel to the longitudinal axis of the path along which the container is raised from the lowered position to the raised position includes rotating the stirrer member about an axis which extends through a central portion of the fluidized bed.

5. A method as set forth in claim 3 wherein said step of rotating the stirrer member about the axis which extends parallel to a longitudinal axis of the path along which the container is raised from the lowered position to the raised position includes rotating the stirrer member about an axis which is offset form a central portion of the fluidized bed and is disposed adjacent to a peripheral portion of the fluidized bed.

6. A method as set forth in claim 1 further including the step of conducting a flow of gas into the container and suspending particulate in the container in the flow of gas to establish the fluidized bed in the container, said method further includes monitoring at least one characteristic of the flow of gas into the container to detect changes in at least one characteristic of the fluidized bed and changing the flow of gas into the container as a function of changes in the one characteristic of the flow of gas.

7. A method as set forth in claim 1 further including the steps of establishing a fluidized bed in the container by conducting a flow of gas through a porous layer into particulate supported in the container on the porous layer and suspending the particulate in the flow of gas through the porous layer, said step of lowering the mold from the raised position into the fluidized bed while the container is in the raised position includes conducting gas through the porous layer at a flow rate of between 5 and 100 cubic feet per hour for each square foot of the porous layer in a horizontal plane through which gas is conducted into the fluidized bed.

8. A method as set forth in claim 1 wherein said step of solidifying molten metal in the mold while the mold is at least partially enclosed by the fluidized bed includes solidifying at least a portion of the molten metal in the mold with a cellular solidification front disposed between molten and solid metal.

9. A method as set forth in claim 1 wherein said step of raising a mold includes raising the mold with a support member which extends into the container, said step of lowering the mold into the fluidized bed includes expanding a flexible element which extends around a portion of the support member with one end of the flexible element connected with the support member and an end of the flexible element opposite from the one end connected with the container.

10. A method as set forth in claim 1 wherein said step of raising a mold includes raising the mold with a support member which extends into the container, said step of lowering the mold into the fluidized bed includes contracting a flexible element which extends around a portion of the support member with one end of the flexible element connected with the support member and an end of the flexible element opposite from the one end connected with the container.

11. A method as set forth in claim 1 wherein said step of raising the mold from a lowered position includes connecting an elongated flexible element with the mold and transmitting force to the elongated flexible element to move the elongated flexible element in a first direction, said step of lowering the mold includes moving the elongated flexible element in a second direction opposite to the first direction.

12. A method as set forth in claim 1 further including the step of deflecting flow of gas and particulate with a baffle disposed adjacent to the mold during performance of said step of lowering the mold into the fluidized bed.

13. A method as set forth in claim 1 wherein the mold includes an array of article mold cavities and a pour cup connected in fluid communication with the article mold cavities and aligned with a central portion of the array of article mold cavities, said step of raising the mold includes supporting the mold on an upper end portion of a support member having a central axis which extends through the array of article mold cavities with portions of the mold in which the article mold cavities are disposed spaced from the support member and with the mold free of engagement with any support structure other than the upper end portion of the support member, said step of lowering the mold from the raised position into the fluidized bed includes exposing at least the entire lower end portion of the portion of the mold in which the article mold cavities are disposed to a flow of gas and particulate in the fluidized bed.

14. A method as set forth in claim 1 wherein the container in which the fluidized bed is established has a lower end portion with a first cross sectional area in a horizontal plane and an upper end portion with a second cross sectional area in a horizontal plane, said first cross sectional area being greater than said second cross sectional area, said method includes conducting a flow of gas and particulate form the lower end portion of the container to the upper end portion of the container and promoting an increase in the speed of movement of gas and particulate as the gas and particulate flows from the lower end portion of the container to the upper end portion of the container.

15. A method as set forth in claim 1 wherein the container in which the fluidized bed is established has a lower end portion with a first cross sectional area in a horizontal plane and an upper end portion with a second cross sectional area in a horizontal plane, said first cross sectional area being smaller than said second cross sectional area, said method includes conducting a flow of gas and particulate from the lower end portion of the container to the upper end portion of the container and promoting a decrease in the speed of movement of gas and particulate as the gas and particulate flows from the lower end portion of the container to the upper end portion of the container.

16. A method as set forth in claim 1 wherein the mold is supported with a plurality of support members which extend from locations outside of the container and across an upper end portion of the container when the mold is in the raised position, said step of lowering the mold from the raised position into the fluidized bed includes lowering the support members relative to the container while the support members continue to extend across the upper end portion of the container.

17. A method as set forth in claim 1 wherein said step of lowering the mold from the raised position includes moving an elongated member which supports the mold downward through a lower end portion of the container.

18. A method as set forth in claim 1 further including the step of directing a flow of gas into the fluidized bed at a plurality of locations along a side wall of the container during performance of said step of lowering the mold from the raised position into the fluidized bed.

19. A method as set forth in claim 1 further including the step of conducting a flow of gas into the lower portion of the fluidized bed, said step of conducting a flow of gas into the lower portion of the fluidized bed includes conducting a flow of gas at a first flow rate into a first portion of the fluidized bed and conducting gas at a second flow rate into a second portion of the fluidized bed, said second flow rate being greater than said first flow rate.

20. A method as set forth in claim 1 further including the step of supporting the mold in the raised position on a perforated support, said step of lowering the mold from the raised position into the fluidized bed includes flowing gas and particulate through openings in the perforated support.

21. A method as set forth in claim 20 further including the step of directing a flow of gas from the perforated support toward the lower portion of the fluidized bed during movement of the mold into the fluidized bed.

22. A method as set forth in claim 1 wherein said step of raising the mold from the lowered position to the raised position includes operating a first force transmitting assembly to move the mold upward toward the furnace assembly, said step of raising the container from the lowered position to the raised position includes operating a second force transmitting assembly to move the container upward toward the furnace assembly, said step of lowering the mold from the raised position into the fluidized bed while the container is in the raised position includes operating the first force transmitting assembly to lower the mold while the second force transmitting assembly is in a nonoperating condition.

23. A method as set forth in claim 22 wherein said step of raising the mold from the lowered position to the raised includes transmitting force through an upper end portion of the furnace assembly to the mold by operating the first force transmitting assembly.

24. A method as set forth in claim 23 wherein said step of raising the container from the lowered position to the raised position includes operating the second force transmitting assembly to apply force to a lower end portion of the container.

25. A method of casting a metal article, said method of casting a metal article includes supporting particulate on an upper surface of a porous support disposed at a lower end portion of a container, conducting a flow of gas through the porous support at a flow rate of between 5 and 100 cubic feet per hour for each square foot of the upper surface of the porous support to form a fluidized bed in the container by suspending the particulate in the flow of gas, exposing an upper end portion of the fluidized bed to a fluid pressure of between $6 \times 10^{-4}$ atmospheres and 1.0 atmosphere and to a temperature of between 2,500 degrees Fahrenheit and 3,000 degrees Fahrenheit, lowering the mold into the fluidized bed, and solidifying molten metal in the mold as the mold is lowered into the fluidized bed.

26. A method as set forth in claim 25 wherein said step of lowering the mold into the fluidized bed includes lowering the mold at a rate of twenty inches or more per hour.

27. A method as set forth in claim 25 wherein said step of solidifying molten metal in the mold as the mold is lowered into the fluidized bed includes solidifying the molten metal as a single crystal.

28. A method as set forth in claim 25 wherein said step of solidifying molten metal in the mold includes solidifying at least a portion of the molten metal in the mold with a cellular solidification front disposed between the molten and solid metal.

29. A method as set forth in claim 25 further including the step of moving a stirrer member in the container at a location adjacent to the porous support to promote a uniform distribution of particulate in the flow of gas.

30. A method as set forth in claim 29 wherein said step of moving a stirrer member in the container includes rotating the stirrer member about an axis which extends parallel to a path along which the mold is lowered into the fluidized bed.

31. A method as set forth in claim 29 wherein said step of moving the stirrer member in the container includes rotating the stirrer member about an axis which extends through a central portion of the fluidized bed.

32. A method as set forth in claim 29 wherein said step of moving the stirrer member in the container includes rotating the stirrer member about an axis which is offset from a central portion of the fluidized bed and is disposed adjacent to a side wall of the container in which fluidized bed is formed.

33. A method as set forth in claim 29 further including the steps of moving the mold into the furnace assembly, and moving the container toward the furnace assembly, said step of exposing the upper end portion of the fluidized bed to a fluid pressure between 6×10−4 atmospheres and 1.0 atmosphere and to a temperature of 2,500 degrees Fahrenheit being at least partially performed while at least a portion of the mold is in the furnace assembly and after having performed said step of moving the container toward the furnace.

34. A method as set forth in claim 25 wherein said step of lowering the mold into the fluidized bed includes supporting the mold with a support member which extends into the container in which the fluidized bed is formed, said step of lowering the mold into the fluidized bed includes expanding a bellows which extends around a portion of the support member with one end of the bellows connected with the support member and an end of the bellows opposite from the one end connected with the container.

35. A method as set forth in claim 25 wherein said step of lowering the mold includes supporting the mold with a support member which extends into the container in which the fluidized bed is formed, said step of lowering the mold into the fluidized bed includes contracting a bellows which extends around a portion of the support member with one end of the bellows connected with the support member and an end of the bellows opposite from the one end connected with the container.

36. A method as set forth in claim 25 wherein said step of lowering the mold into the fluidized bed includes moving an elongated flexible element along a nonlinear path and transmitting force between the elongated flexible element and the mold.

37. A method as set forth in claim 25 further including the step of deflecting flow of gas and particulate with a baffle disposed adjacent to the mold during performance of said step of lowering the mold into the fluidized bed.

38. A method as set forth in claim 25 wherein the mold includes an array of article mold cavities and a pour cup connected in fluid communication with the article mold cavities and aligned with a central portion of the array of article mold cavities, said step of lowering the mold into the fluidized bed includes supporting the mold on a support having a central axis which extends through the array of article mold cavities with portions of the mold in which the article mold cavities are disposed spaced from the support column and with the mold free of engagement with any support structure other than an upper end portion of the support, said step of moving the mold into the fluidized bed includes exposing at least the entire lower end portion of the portion of the mold in which the article mold cavities are disposed to a flow of gas and particulate in the fluidized bed.

39. A method as set forth in claim 25 further including the step of decreasing the speed of movement of gas and particulate in the fluidized bed as the gas and particulate flow from a lower portion of the fluidized bed to an upper portion of the fluidized by forming the fluidized bed with a relatively small cross sectional area at the lower portion of the fluidized bed and relatively large cross sectional area at an upper portion of the fluidized bed.

40. A method as set forth in claim 25 further including the step of increasing the speed of movement of gas and particulate in the fluidized bed as the gas and particulate flow from a lower portion of the fluidized bed to an upper portion of the fluidized bed by forming the fluidized bed with a relatively large cross sectional area at the lower portion of the fluidized bed and a relatively small cross sectional area at an upper portion of the fluidized bed.

41. A method as set forth in claim 25 wherein said step of lowering the mold into the fluidized bed includes flowing gas and particulate through openings in a support for the mold.

42. A method of casting a metal article, said method comprising the steps of supporting a mold containing molten metal above a fluidized bed formed of particulate suspended in a flow of gas, said step of supporting a mold includes supporting the mold on a support member having a plurality of openings which extend between upper and lower sides of the support member, lowering the mold into the fluidized bed, flowing gas in which particulate is suspended through the openings in the support member as the mold is lowered into the fluidized bed, and solidifying the molten metal in the mold while the mold is at least partially disposed in the fluidized bed.

43. A method as set forth in claim 42 further including the step of moving a stirrer member in the fluidized bed to promote uniform distribution of particulate in the flow of gas.

44. A method as set forth in claim 42 further including the steps of raising the mold from a lowered position in which the mold is disposed below a furnace assembly to a raised position in which the mold is at last partially disposed in the furnace assembly, raising a container from a lowered position in which the container is disposed below the furnace assembly to a raised position in which the container is adjacent to the furnace assembly, holding the fluidized bed in the container, and lowering the container after performing said step of lowering the mold into the fluidized bed.

45. A method as set forth in claim 42 wherein the fluidized bed is disposed in a container having a porous support at a lower end portion of the container, said method further includes the steps of maintaining the fluidized bed in the container by conducting a flow of gas through the porous support at a flow rate of between 5 and 100 cubic feet per hour for each square foot of an upper surface of the porous support, exposing an upper portion of the fluidized bed to a fluid pressure of between 6×10−4 atmospheres and 1.0 atmosphere and to a temperature of between 2,500 degrees Fahrenheit and 3,000 degrees Fahrenheit.

46. A method as set forth in claim 42 further including the step of flowing gas from the support into the fluidized bed during performance of said step of lowering the mold into the fluidized bed.

47. A method as set forth in claim 42 further including the step of conducting a flow of gas into the fluidized bed, said step of conducting a flow of gas into the fluidized bed includes conducting a flow of gas at a first flow rate into a first portion of the fluidized bed and conducting gas at a second flow rate into a second portion of the fluidized bed, said second flow rate being greater than said first flow rate.

48. A method as set forth in claim 42 further including the step of rotating an stirrer member in the fluidized bed about an axis which extends parallel to a longitudinal axis of a path along which the mold is lowered into the fluidized bed.

49. A method as set forth in claim 42 further including the step of rotating a stirrer member in the fluidized bed about an axis which extends through a central portion of the fluidized bed.

50. A method as set forth in claim 42 further including the step of rotating a stirrer member in the fluidized bed about an axis which is offset from a central portion of the fluidized bed and is disposed adjacent to a peripheral portion of the fluidized bed.

51. A method as set forth in claim 42 wherein the fluidized bed includes a central portion and a peripheral portion which extends around the central portion of the fluidized bed, said step of lowering the mold into the fluidized bed includes moving the mold into the central portion of the fluidized bed, said method further includes directing a flow of gas into the peripheral portion of the fluidized bed at a plurality of locations during performance of said step of moving the mold into the fluidized bed.

52. A method as set forth in claim 42 wherein said step of supporting the mold above the fluidized bed includes supporting the support member with a shaft which extends between the support member and a lower portion of the fluidized bed, said step of lowering the mold into the fluidized bed includes withdrawing the shaft from the fluidized bed.

53. A method as set forth in claim 52 further including the step of rotating a stirrer member about an axis which is coincident with a central axis of the shaft as the mold is lowered into the fluidized bed.

54. A method as set forth in claim 42 wherein the fluidized bed is disposed in a container, said step of supporting the mold above the fluidized bed includes supporting the mold with a plurality of members which extend from locations outside of the container and across an upper end portion of the container, said step of lowering the mold into the fluidized bed includes lowering the members relative to the container while the members continue to extend across the upper end portion of the container.

55. A method as set forth in claim 42 further including the step of increasing the speed of movement of gas and particulate in the fluidized bed as the gas and particulate flow from a lower portion of the fluidized bed to an upper portion of the fluidized bed by forming the fluidized bed with a relatively large cross sectional area at the lower portion of the fluidized bed and a relatively small cross sectional area at an upper portion of the fluidized bed.

56. A method as set forth in claim 42 further including the step of decreasing the speed of movement of gas and particulate in the fluidized bed as the gas and particulate flow from a lower portion of the fluidized bed to an upper portion of the fluidized by forming the fluidized bed with a relatively small cross sectional area at the lower portion of the fluidized bed and relatively large cross sectional area at an upper portion of the fluidized bed.

57. A method as set forth in claim 42 further including the step of deflecting flow of gas and particulate with a baffle disposed adjacent to the mold during performance of said step of lowering the mold into the fluidized bed.

58. A method as set forth in claim 42 wherein said step of supporting a mold above a fluidized bed includes supporting the mold with a shaft which extends into a container in which the fluidized bed is disposed and is connected with the support member, said step of lowering the mold into the fluidized bed includes contracting a bellows which extends around a portion of the shaft with one end of the bellows connected with the shaft and an end of the bellows opposite from the one end connected with the container.

59. A method as set forth in claim 42 wherein said step of supporting a mold includes supporting the mold with a shaft which extends into a container in which the fluidized bed is disposed and is connected with the support member, said step of lowering the mold into the fluidized bed includes expanding a bellows which extends around a portion of the shaft with one end of the bellows connected with the shaft and an end of the bellows opposite from the one end connected with the container.

60. A method as set forth in claim 42 wherein said step of solidifying the molten metal in the mold includes solidifying at least a portion of the molten metal in the mold with a cellular solidification front disposed between molten and solid metal.

61. A method of casting a metal article, said method comprising the steps of providing a porous layer on which particulate is disposed, conducting a flow of gas at a first flow rate through a first portion of the porous layer, conducting a flow of gas at a second flow rate through a second portion of the porous layer, suspending the particulate in the flow of gas through the first and second portions of porous layer to form a fluidized bed having portions through which gas flows at different flow rates, lowering a mold containing molten metal into the fluidized bed, and solidifying the molten metal in the mold as the mold is lowered into the fluidized bed.

62. A method as set forth in claim 61 further including the step of moving a stirrer member in the fluidized bed to promote distribution of particulate in the flow of gas.

63. A method as set forth in claim 61 wherein said steps of conducting a flow of gas at a first flow rate through a first portion of a porous layer and conducting a flow of gas at a second flow rate through a second portions of a porous layer include flowing gas into a container in which the fluidized bed is formed, said step of lowering the mold into the fluidized bed includes moving the mold into the container, said method further includes lowering the container after performing said step of moving the mold into the container.

64. A method as set forth in claim 61 wherein said step of conducting a flow of gas at a first flow rate through a first portion of the porous layer includes conducting a flow of gas through the first portion of the porous layer at a flow rate of between 5 and 100 cubic feet per hour for each square foot of the first portion of the porous layer, said method includes exposing an upper end portion of the fluidized bed to a fluid pressure of between $6 \times 10^{-4}$ atmospheres and 1.0 atmosphere and to a temperature of between 2,500 degrees Fahrenheit and 3,000 degrees Fahrenheit during at least a portion of performance of said step of lowering a mold containing molten metal into the fluidized bed.

65. A method as set forth in claim 61 further including the step of supporting the mold on a support member having a plurality of openings which extend between upper and lower sides of the support member as the mold is lowered into the fluidized bed, said method further includes the step of flowing gas in which particulate is suspended through the openings in the support member as the support member is lowered into the fluidized bed.

66. A method as set forth in claim 61 wherein the first portion of the porous layer is aligned with a central portion of the fluidized bed and the second portion of the porous layer is aligned with a peripheral portion of the fluidized bed, said step of lowering the mold into the fluidized bed includes moving the mold along a path having a longitudinal central axis which is coincident with a central axis of the mold and extends through the central portion of the fluidized bed.

67. A method as set forth in claim 61 wherein the first flow rate of gas through the first portion of the porous layer is less than the second flow rate of gas through the second portion of the porous layer during lowering of the mold into the fluidized bed.

68. method of casting a metal article, said method comprising moving a mold containing molten metal into a central portion of a fluidized bed, solidifying the molten metal in the mold as the mold moves into the central portion of the fluidized bed, conducting gas into the central portion of the fluidized bed at a first flow rate during movement of the mold into the central portion of the fluidized bed, and conducting gas into a peripheral portion of the fluidized bed at a second flow rate during movement of the mold into the central portion of the fluidized bed.

69. A method as set forth in claim 68 further including the step of moving a stirrer member the fluidized bed to promote distribution of particulate in the flow of gas.

70. A method as set forth in claim 68 wherein the second flow rate of gas into the peripheral portion of the fluidized bed is greater than the first flow rate of gas into the central portion of the fluidized bed.

71. A method as set forth in claim 68 wherein the first flow rate of gas into the central portion of the fluidized bed is at a flow rate of between 5 and 100 cubic feet per hour for each square foot of the central portion of the fluidized bed in a horizontal plane, the second flow rate of gas into the peripheral portion of the fluidized bed is at a flow rate of between 5 and 100 cubic feet per hour for each square foot of the peripheral portion of the fluidized bed in the horizontal plane.

72. A method as set forth in claim 68 wherein upper end portions of the peripheral and central portions of the fluidized bed are exposed to a fluid pressure of between $6 \times 10^{-4}$ atmospheres and 1.0 atmosphere and to a temperature of between 2,500 degrees Fahrenheit and 3,000 degrees Fahrenheit during at least a portion of performance of said step of lowering the mold into the fluidized bed.

73. A method of casting a metal article, said method comprising the steps of providing a container having an upwardly extending side wall, lowering a mold containing molten metal into a fluidized bed into the container, conducting a flow of gas into the fluidized bed from a plurality of locations disposed along the side wall of the container as the mold is lowered into the fluidized bed, and solidifying molten metal in the mold as the mold is lowered into the fluidized bed.

74. A method as set forth in claim 73 further including the step of moving a stirrer member in the fluidized bed to promote distribution of particulate which is suspended in a flow of gas in the fluidized bed.

75. A method as set forth in claim 73 wherein the mold has a central portion and a peripheral portion in which a plurality of article mold cavities are disposed, said step of lowering the mold into the fluidized bed being performed with a bottom of the peripheral portion of the mold exposed to a flow of gas and particulate in the fluidized bed, said step of solidifying molten metal in the mold as the mold is lowered into the fluidized bed includes solidifying the molten metal in the article mold cavities.

76. A method as set forth in claim 73 wherein said step of conducting a flow of gas into the fluidized bed from a plurality of locations disposed along the side wall of the container includes directing the flow of gas from each of the locations along a path which extends transverse to a vertical plane extending through a central axis of the container.

77. A method as set forth in claim 73 further including the step of monitoring at least one characteristic of the flow of gas into the container to detect changes in at least one characteristic of the fluidized bed.

78. A method as set forth in claim 73 wherein said step of conducting a flow of gas into the fluidized bed in the container includes conducting a flow of gas into the lower end portion of the container and into the container from locations disposed along the side wall of the container at a flow rate of between 5 and 100 cubic feet per hour for each square foot of the fluidized bed in a horizontal plane disposed adjacent to the lower end portion of the fluidized bed, exposing an upper end portion of the fluidized bed to a fluid pressure of between $6 \times 10^{-4}$ atmospheres and 1.0 atmosphere and to a temperature of between 2,500 degrees Fahrenheit and 3,000 degrees Fahrenheit.

79. A method as set forth in claim 73 further including the step of lowering the container after having performed said step of lowering the mold into the fluidized bed.

80. A method of casting a metal article, said method comprising the steps of moving a mold containing molten metal into a fluidized bed, solidifying the molten metal as the mold moves into the fluidized bed, and deflecting a flow of gas and particulate in the fluidized bed with a baffle disposed adjacent to the mold during performance of said step of moving the mold into the fluidized bed.

81. A method as set forth in claim 80 further including the step of rotating a stirrer member in the fluidized bed about an axis which extends along a path of movement of the mold as the mold is moved into the fluidized bed.

82. A method as set forth in claim 80 further including the step of moving the baffle with the mold as the mold is moved into the fluidized bed.

83. A method as set forth in claim 80 wherein said step of moving the mold into the fluidized bed includes moving the mold relative to the baffle.

84. A method as set forth in claim 80 wherein said step of deflecting flow of gas and particulate with a baffle includes deflecting the flow of gas and particulate in a direction away from the mold with the baffle as the mold is moved into the fluidized bed.

85. A method as set forth in claim 80 wherein said step of deflecting a flow of gas and particulate with a baffle includes deflecting the flow of gas and particulate in a direction toward the mold with the baffle as the mold is moved into the fluidized bed.

86. A method of casting a metal article, said method comprising the steps of providing a container having a side wall which extends upward from a lower end portion of the container and which at least partially defines a container interior having different cross sectional areas in horizontal planes disposed at different distances from the lower end portion of the container, conducting a flow of gas into the container to establish a fluidized bed of particulate suspended in a flow of gas, varying the rate of flow of at least a portion of the flow of gas in the fluidized bed under the influence of variations in the cross sectional area of the container interior at different distances from the lower end portion of the container, lowering a mold containing molten metal into the fluidized bed, and solidifying the molten metal in the mold as the mold is lowered into the fluidized bed.

87. A method as set forth in claim 86 further including the step of moving a stirrer member in the fluidized bed to promote distribution of particulate in the flow of gas.

88. A method as set forth in claim 87 further including the step of lowering the container after having performed said step of lowering the mold into the fluidized bed.

89. A method as set forth in claim 86 wherein said step of lowering a mold containing molten metal into the fluidized bed includes supporting the mold on a support and flowing gas and particulate through openings in the support.

90. A method as set forth in claim 89 further including the step of directing a flow of gas from the support into the fluidized bed during movement of the mold into the fluidized bed.

91. A method as set forth in claim 86 further including the step of conducting a flow of gas into the fluidized bed from a plurality of locations along the side wall of the container as the mold is lowered into the fluidized bed.

92. A method of casting a metal article, said method comprising the steps of providing a container, supporting a mold containing molten metal on a support member disposed above the container, forming a fluidized bed in the container, said step of forming a fluidized bed in the container includes conducting a flow of gas from openings connected with the support member into the container, lowering the support member and mold into the fluidized bed, and solidifying the molten metal in the mold as the mold is lowered into the fluidized bed.

93. A method as set forth in claim 92 further including the step of moving a stirrer member in the fluidized bed to promote distribution of particulate in the fluidized bed.

94. A method as set forth in claim 92 wherein said step of forming a fluidized bed in the container includes conducting a flow of gas into a lower portion of the container.

95. A method as set forth in claim 92 wherein said step of forming a fluidized bed in the container includes conducting a flow of gas into the container from a plurality of locations along a side wall of the container.

96. A method as set forth in claim 92 wherein a plurality of passages extend through the support member, said step of lowering the support member includes flowing gas in which particulate is suspended through the openings in the support member.

97. A method as set forth in claim 92 further including the step of lowering the container after performing said step of lowering the support member and mold into the fluidized bed.

98. A method as set forth in claim 92 further including the steps of monitoring at least one characteristic of the flow of gas from the openings connected with the support member into the fluidized bed to detect changes in at least one characteristic of the fluidized bed and changing the flow of gas from the support member as a function of changes in the one characteristic of the flow of gas.

99. A method as set forth in claim 92 wherein the support member is connected with an upper end of a shaft which extends into the container, said step of lowering the support member and mold into the fluidized bed includes withdrawing the shaft from the container.

100. A method as set forth in claim 92 wherein the support member is connected with a plurality of force transmitting members which extend from locations outside of the container and across an upper end portion of the container, said step of lowering the support member and mold into the fluidized bed includes lowering the force transmitting members relative to the container while the force transmitting members continue to extend across the upper end portion of the container.

101. A method as set forth in claim 92 further including the step of deflecting flow of gas and particulate with a baffle disposed adjacent to the mold during performance of said step of lowering the support member and mold into the fluidized bed.

102. A method as set forth in claim 92 wherein said step of supporting the mold on a support member disposed above the container includes supporting the support member with a shaft which extends into the container, said step of lowering the support member and mold includes contracting a bellows which extends around a portion of the shaft with one end connected with the shaft and an end of the bellows opposite from the one end connected with the container.

103. A method as set forth in claim 92 wherein said step of supporting the mold on a support member disposed above the particulate material includes supporting the support member with a shaft which extends into the container, said step of lowering the support member and mold includes expanding a bellows which extends around a portion of the shaft with one end connected with the shaft and an end of the bellows opposite from the one end connected with the container.

104. A method of casting metal articles in a mold having an array of article mold sections, said method comprising the steps of supporting the mold on a support having openings extending between upper and lower sides of the support, filling article mold cavities in an array of article mold sections of the mold with molten metal while the mold is disposed on the support, lowering the support and the mold into a fluidized bed formed of particulate suspended in a flow of gas, flowing gas and particulate through the openings in the support into a central portion of the array of article mold sections as the support and mold are lowered into the fluidized bed, flowing gas and particulate from the central portion of the array of article mold sections through openings between the article mold sections as the support and mold are lowered into the fluidized bed, and solidifying molten metal in the article mold cavities as the support and mold are lowered into the fluidized bed.

105. A method as set forth in claim 104 further including the step of moving a stirrer member in the fluidized bed to promote distribution of particulate in the flow of gas.

106. A method as set forth in claim 104 wherein said step of filling article mold cavities in the article mold sections with molten metal includes pouring molten metal into a pour cup in the central portion of the array of article mold sections and conducting molten metal from the pour cup to the article mold cavities.

107. A method as set forth in claim 104 further including the step of establishing the fluidized bed by conducting a flow of gas into a container at a flow rate of between 5 and 100 cubic feet per hour for each square foot of a horizontal plane disposed in the container.

108. A method as set forth in claim 104 wherein said step of lowering the support and mold into the fluidized bed includes lowering the support and mold into a central portion of the fluidized bed with a peripheral portion of the fluidized bed extending around the mold, said method further includes conducting gas at a first flow rate into the central portion of the fluidized bed during lowering of the support and mold into the fluidized bed and conducting gas at a second flow rate into the peripheral portion of the fluidized bed during lowering of the support and mold into the fluidized bed.

109. A method as set forth in claim 104 further including the steps of holding the fluidized bed in a container and lowering the container after performing said step of lowering the support and mold into the fluidized bed.

110. A method as set forth in claim 104 further including the step of conducting a flow of gas into the fluidized bed from a plurality of locations disposed along a periphery of the fluidized bed.

111. A method as set forth in claim 104 further including the step of conducting gas into the fluidized bed from a plurality of openings which are connected with the support as the support and the mold are lowered into the fluidized bed.

112. A method as set forth in claim 104 wherein said step of solidifying molten metal in the article mold cavities includes solidifying at least a portion of the molten metal in each of the article mold cavities with a cellular solidification front disposed between molten and solid metal as the support and mold are lowered into the fluidized bed.

113. A method as set forth in claim 104 further including the step of deflecting a flow of gas and particulate with a baffle disposed adjacent to the mold during performance of said step of lowering the support and mold into the fluidized bed.

114. A method as set forth in claim 104 further including the steps of conducting a flow of gas into the fluidized bed during lowering of the support and mold into the fluidized bed, monitoring at least one characteristic of the flow of gas into the fluidized bed to detect changes in at least one characteristic of the fluidized bed, and changing the flow of gas into the fluidized bed as a function of changes in the one characteristic of the flow of gas.

115. A method of casting a metal article, said method comprising the steps of supporting a mold having an article mold cavity with a thin wall mold section having a thickness of 0.060 inches or less and an extent of at least four inches along orthogonal axes with a total surface area of at least sixteen square inches disposed between upper and lower frame mold sections, filling the article mold cavity with molten metal, moving the mold into a fluidized bed, transmitting heat from the molten metal in the article mold cavity to the fluidized bed, solidifying the metal in the lower frame mold section as the mold is moved into the fluidized bed, solidifying the molten metal in the thin wall mold section after performing said step of solidifying the molten metal in the lower frame mold section as the mold is moved into the fluidized bed, and solidifying the molten metal in the upper frame mold section as the mold is moved into the fluidized bed.

116. A method as set forth in claim 115 wherein said step of moving the mold into the fluidized bed includes moving the mold into the fluidized bed during solidification of the molten metal in the thin wall mold section at a rate which is different than rates at which the mold is moved into the fluidized bed during solidification of the molten metal in the lower and upper frame mold sections of the article mold cavity.

117. A method as set forth in claim 115 further including the step of moving a stirrer member in the fluidized bed to promote distribution of particulate in the fluidized bed.

118. A method of casting a metal article having a passage extending through the article, said method comprising the steps of providing a mold having a passage extending through the mold at a location which is a function of a location where a passage extends through the article, filling an article mold cavity in the mold with molten metal, transmitting heat from a portion of the mold where the passage extends through the mold by conducting a flow of gas with particulate suspended therein through the passage in the mold, and solidifying the molten metal in the mold.

119. A method as set forth in claim 118 further including the step of moving the mold into a fluidized bed, said step of conducting a flow of gas with particulate suspended therein through the passage in the mold is performed at the same time that said step of moving the mold into a fluidized bed is performed.

120. An apparatus for use in casting a metal article, said apparatus comprising a furnace assembly, a mold support member which is movable relative to said furnace assembly to move a mold supported by said mold support member relative to said furnace assembly, said mold support member being movable relative to said furnace assembly between a raised position in which the mold is supported by said mold support with the mold at least partially disposed in said furnace assembly and a lowered position in which the mold is supported by said support with the mold disposed below said furnace assembly, a container which holds a fluidized bed into which said mold support member is movable to move the mold into the fluidized bed, said container being movable relative to said furnace assembly between a raised position in which said container is disposed adjacent to said furnace assembly and a lowered position in which said container is disposed below said furnace assembly, and a container drive assembly connected with said container and operable to move said container between the raised and lowered positions of said container.

121. An apparatus as set forth in claim 120 further including a stirrer member disposed in said container and movable relative to said container to promote uniform distribution of particulate in the fluidized bed in said container.

122. An apparatus as set forth in claim 120 further including a mold support drive assembly connected with said mold support and operable to lower said mold support relative to said container to move the mold into the fluidized bed when said container is in the raised position of said container.

123. A method of casting a metal article, said method comprising the steps of supporting a mold containing molten metal on a perforated support, moving a mold containing molten metal into a fluidized bed formed of particulate suspended in a flow of gas, said step of moving the mold into the fluidized bed includes flowing gas and particulate through openings in the perforated support, solidifying the molten metal in the mold as the mold moves into the fluidized bed, and moving a stirrer member in the fluidized bed to promote uniform distribution of particulate in the flow of gas.

124. A method as set forth in claim 123 further including the step of directing a flow of gas from the perforated support toward a lower portion of the fluidized bed during movement of the mold into the fluidized bed.

125. A method as set forth in claim 123 further including the step of conducting a flow of gas into the fluidized bed, said step of conducting a flow of gas into the fluidized bed includes conducting a flow of gas at a first flow rate into a first portion of the fluidized bed and conducting gas at a second flow rate into a second portion of the fluidized bed, said second flow rate being greater than said first flow rate.

126. A method as set forth in claim 123 wherein said step of moving a stirrer member in the fluidized bed includes rotating the stirrer member about an axis which extends along a path of movement of the mold into the fluidized bed.

127. A method as set forth in claim 123 wherein said step of moving a stirrer member in the fluidized bed includes rotating the stirrer member about an axis which extends through a central portion of the fluidized bed.

128. A method as set forth in claim 123 wherein said step of moving a stirrer member in the fluidized bed includes rotating the stirrer member about an axis which is offset from a central portion of the fluidized bed.

129. A method as set forth in claim 123 wherein the fluidized bed includes a central portion and a peripheral portion which extends around the central portion of the fluidized bed, said method further includes directing a flow of gas into the peripheral portion of the fluidized bed at a plurality of locations disposed above the stirrer member during performance of said step of moving the mold into the fluidized bed.

130. A method as set forth in claim 123 further including the step of supporting the mold above the fluidized bed with an elongated member which extends between an upper portion of the fluidized bed and a lower portion of the fluidized bed, said step of moving the mold into the fluidized bed includes withdrawing the elongated member downward from the lower portion of the fluidized bed.

131. A method as set forth in claim 130 wherein said step of moving the stirrer member in of the fluidized bed includes rotating the stirrer member about an axis which is coincident with a central axis of the elongated member.

132. A method as set forth in claim 123 wherein the fluidized bed is disposed in a container, said method further includes the step of suspending the mold and perforated support above the fluidized bed with at least one support member, said step of moving the mold into the fluidized bed includes lowering the suspended mold and perforated support relative to the container.

133. A method as set forth in claim 123 further including the step of forming the fluidized bed with a relatively large cross sectional area at a lower portion of the fluidized bed and a relatively small cross sectional area at an upper portion of the fluidized bed.

134. A method as set forth in claim 123 further including the step of forming the fluidized bed with a relatively small cross sectional area at a lower portion of the fluidized bed and relatively large cross sectional area at an upper portion of the fluidized bed.

135. A method as set forth in claim 123 wherein the mold includes an array of article mold cavities and a pour cup connected in fluid communication with the article mold cavities and aligned with a central portion of the array of article mold cavities, said method further includes supporting the mold on an upper end portion of a support column having a central axis which extends through the array of article mold cavities with portions of the mold in which the article mold cavities are disposed spaced from the support column and with the mold free of engagement with any support structure other than the upper end portion of the support column, said step of moving the mold into the fluidized bed includes exposing at least an entire lower end portion of the portion of the mold in which the article mold cavities are disposed to a flow of gas and particulate in the fluidized bed.

136. A method as set forth in claim 123 further including the step of deflecting flow of gas and particulate with a baffle during performance of said step of moving the mold into the fluidized bed.

137. A method as set forth in claim 123 wherein said step of moving the mold into the fluidized bed includes connecting an elongated flexible element with the mold and transmitting force from the mold to the elongated flexible element.

138. A method as set forth in claim 137 wherein said step of moving the mold into the fluidized bed includes moving the elongated flexible element along a nonlinear path.

139. A method as set forth in claim 123 wherein said step of supporting a mold includes supporting the mold with a support member which is connected with the perforated support and extends into a container in which the fluidized bed is disposed, said step of moving the mold into the fluidized bed includes contracting a bellows which extends around a portion of the support member with one end of the bellows connected with the support member and an end of the bellows opposite from the one end connected with the container.

140. A method as set forth in claim 123 wherein said step of supporting the mold includes supporting the mold with a support member which extends into a container in which the fluidized bed is disposed, said step of moving the mold into the fluidized bed includes expanding a bellows which extends around a portion of the support member with one end of the bellows connected with the support member and an end of the bellows opposite from the one end connected with the container.

141. A method as set forth in claim 123 further including the steps of moving the mold into a furnace assembly, moving the container toward the furnace assembly, and establishing the fluidized bed in the container.

142. A method as set forth in claim 123 further including the step of supporting the mold with a support member, said step of supporting a mold with a support member being performed with a plurality of portions of the mold containing article mold cavities spaced from the support member, said step of moving the mold into the fluidized bed includes engaging the portions of mold containing article mold cavities with a flow of gas and particulate conducted between the portion of the mold containing article mold cavities and the support member.

143. A method as set forth in claim 123 wherein said step of solidifying the molten metal in the mold includes solidifying at least a portion of the molten metal in the mold with a cellular solidification front disposed between molten and solid metal.

144. A method as set forth in claim 123 wherein gas is conducted through the fluidized bed at a flow rate of between 5 and 100 cubic feet per hour for each square foot of fluidized bed disposed in a horizontal plane extending through a lower end portion of the fluidized bed.

145. A method of casting a metal article, said method comprising the steps of moving a mold containing molten metal into a fluidized bed formed of particulate suspended in a flow of gas, solidifying the molten metal in the mold as the mold moves into the fluidized bed, moving a stirrer member in the fluidized bed to promote uniform distribution of particulate in the flow of gas, and conducting a flow of gas into the fluidized bed, said step of conducting a flow of gas into the fluidized bed includes conducting a flow of gas at a first flow rate into a first portion of the fluidized bed and conducting gas at a second flow rate into a second portion of the fluidized bed, said second flow rate being greater than said first flow rate.

146. A method as set forth in claim 145 wherein said step of moving a stirrer member in the fluidized bed includes rotating the stirrer member about an axis which extends along a path of movement of the mold into the fluidized bed.

147. A method as set forth in claim 145 wherein said step of moving a stirrer member in the fluidized bed includes rotating the stirrer member about an axis which extends through a central portion of the fluidized bed.

148. A method as set forth in claim 145 wherein said step of moving a stirrer member in the fluidized bed includes rotating the stirrer member about an axis which is offset from a central portion of the fluidized bed.

149. A method as set forth in claim 145 wherein the fluidized bed includes a central portion and a peripheral portion which extends around the central portion of the fluidized bed, said step of moving the mold into the fluidized bed includes moving the mold into the central portion of the fluidized bed, said method further includes directing a flow of gas into the peripheral portion of the fluidized bed at a plurality of locations disposed above the stirrer member during performance of said step of moving the mold into the fluidized bed.

150. A method as set forth in claim 145 further including the step of supporting the mold above the fluidized bed with an elongated member which extends between an upper portion of the fluidized bed and a lower portion of the fluidized bed, said step of moving the mold into the fluidized bed includes withdrawing the elongated member downward from the lower portion of the fluidized bed.

151. A method as set forth in claim 150 wherein said step of moving the stirrer member in the fluidized bed includes rotating the stirrer member about an axis which is coincident with a central axis of the elongated member.

152. A method as set forth in claim 145 further including the step of suspending the mold above the fluidized bed, said step of moving the mold into the fluidized bed includes lowering the suspended mold into the fluidized bed.

153. A method as set forth in claim 145 further including the step of forming the fluidized bed with a relatively large cross sectional area at a lower portion of the fluidized bed and a relatively small cross sectional area at an upper portion of the fluidized bed.

154. A method as set forth in claim 145 further including the step of forming the fluidized bed with a relatively small cross sectional area at a lower portion of the fluidized bed and relatively large cross sectional area at an upper portion of the fluidized bed.

155. A method of casting a metal article, said method comprising the steps of moving a mold containing molten metal into a fluidized bed formed of particulate suspended in a flow of gas, solidifying the molten metal in the mold as the mold moves into the fluidized bed, and moving a stirrer member in the fluidized bed to promote uniform distribution of particulate in the flow of gas, said step of moving a stirrer member in the fluidized bed includes rotating the stirrer member about an axis which is offset from a central portion of the fluidized bed and is disposed adjacent to a peripheral portion of the fluidized bed.

156. A method as set forth in claim 155 further including the step of supporting the mold containing molten metal on a support, said step of moving the mold into the fluidized bed includes flowing gas and particulate through openings in the support.

157. A method as set forth in claim 156 further including the step of directing a flow of gas from the support toward a lower portion of the fluidized bed during movement of the mold into the fluidized bed.

158. A method as set forth in claim 155 wherein the axis about which the stirrer member is rotated extends parallel to a longitudinal axis of a path along which the mold is moved into the fluidized bed.

159. A method as set forth in claim 155 wherein said method further includes directing a flow of gas into the peripheral portion of the fluidized bed at a plurality of locations disposed above the stirrer member.

160. A method of casting a metal article, said method comprising the steps of moving a mold containing molten metal into a fluidized bed formed of particulate suspended in a flow of gas, the fluidized bed includes a central portion and a peripheral portion which extends around the central portion of the fluidized bed, said step of moving the mold into the fluidized bed includes moving the mold into the central portion of the fluidized bed, solidifying the molten metal in the mold as the mold moves into the fluidized bed, moving a stirrer member in the fluidized bed to promote uniform distribution of particulate in the flow of gas, and directing a flow of gas into the peripheral portion of the fluidized bed at a plurality of locations disposed above the stirrer member during performance of said step of moving the mold into the fluidized bed.

161. A method as set forth in claim 160 further including the step of supporting the mold containing molten metal on a support, said step of moving the mold into the fluidized bed includes flowing gas and particulate through the support.

162. A method as set forth in claim 161 further including the step of directing a flow of gas from the support into the fluidized bed during movement of the mold into the fluidized bed.

163. A method as set forth in claim 160 further including the step of conducting a flow of gas at a first flow rate into a first portion of the fluidized bed and conducting gas at a second flow rate into a second portion of the fluidized bed.

164. A method as set forth in claim 160 wherein moving a stirrer member in the fluidized bed includes rotating the stirrer member about an axis which extends along a path of movement of the mold into the fluidized bed.

165. A method as set forth in claim 160 wherein said step of moving a stirrer member in the fluidized bed includes rotating the stirrer member about an axis which extends through a central portion of the fluidized bed.

166. A method as set forth in claim 160 wherein said step of moving a stirrer member in the fluidized bed includes rotating the stirrer member about an axis which is offset from a central portion of the fluidized bed.

167. A method as set forth in claim 160 further including the step of supporting the mold above the fluidized bed with a support, said step of moving the mold into the fluidized bed includes moving the support into the fluidized bed.

168. A method as set forth in claim 167 wherein said step of moving the stirrer member in of the fluidized bed includes rotating the stirrer member about an axis which extends through the support.

169. A method as set forth in claim 160 further including the step of suspending the mold above the fluidized bed, said step of moving the mold into the fluidized bed includes lowering the suspended mold into the fluidized bed.

170. A method as set forth in claim 160 further including the step of forming the fluidized bed with a relatively large cross sectional area at a lower portion of the fluidized bed and a relatively small cross sectional area at an upper portion of the fluidized bed.

171. A method as set forth in claim 160 further including the step of forming the fluidized bed with a relatively small cross sectional area at a lower portion of the fluidized bed and relatively large cross sectional area at an upper portion of the fluidized bed.

172. A method as set forth in claim 160 wherein the mold includes an array of article mold cavities, said method further includes supporting the mold on a support column having a central axis which extends through the array of article mold cavities with portions of the mold in which the article mold cavities are disposed spaced from the support and with the mold free of engagement with any support structure other than the support, said step of moving the mold into the fluidized bed includes exposing an end portion of the mold to a flow of gas and particulate in the fluidized bed.

173. A method as set forth in claim 160 further including the step of deflecting flow of gas and particulate with a baffle during performance of said step of moving the mold into the fluidized bed.

174. A method as set forth in claim 160 wherein said step of moving the mold into the fluidized bed includes connecting an elongated flexible element with the mold and transmitting force from the mold to the elongated flexible element.

175. A method as set forth in claim 174 wherein said step of moving the mold into the fluidized bed includes moving the elongated flexible element along a nonlinear path.

176. A method as set forth in claim 160 wherein said step of moving the mold into the fluidized bed includes supporting the mold with a support member which extends into a container in which the fluidized bed is disposed, said step of moving the mold into the fluidized bed includes contracting a bellows which extends around a portion of the support member with one end of the bellows connected with the support member and an end of the bellows opposite from the one end connected with the container.

177. A method as set forth in claim 160 wherein said method further includes supporting the mold with a support member which extends into a container in which the fluidized bed is disposed, said step of moving the mold into the fluidized bed includes expanding a bellows which extends around a portion of the support member with one end of the bellows connected with the support member and an end of the bellows opposite from the one end connected with the container.

178. A method as set forth in claim 160 further including the steps of moving the mold into a furnace assembly, moving the container toward the furnace assembly, and establishing the fluidized bed in the container.

179. A method as set forth in claim 160 further including the step of supporting the mold with a support member, said step of supporting a mold with a support member being performed with a plurality of portions of the mold containing article mold cavities spaced from the support member, said step of moving the mold into the fluidized bed includes engaging the portions of mold containing article mold cavities with a flow of gas and particulate conducted between the portion of the mold containing article mold cavities and the support member.

180. A method as set forth in claim 160 wherein said step of solidifying the molten metal in the mold includes solidifying at least a portion of the molten metal in the mold with a cellular solidification front disposed between molten and solid metal.

181. A method as set forth in claim 160 wherein gas is conducted through the fluidized bed at a flow rate of between 5 and 100 cubic feet per hour for each square foot of fluidized bed disposed in a horizontal plane extending through a lower end portion of the fluidized bed.

182. A method of casting a metal article, said method comprising the steps of supporting a mold above a fluidized bed with an elongated member which extends between an upper portion of the fluidized bed and a lower portion of the fluidized bed, moving the mold containing molten metal into a fluidized bed formed of particulate suspended in a flow of gas, said step of moving the mold into the fluidized bed includes withdrawing the elongated member from the upper portion of the fluidized bed, solidifying the molten metal in the mold as the mold moves into the fluidized bed, and moving a stirrer member in the fluidized bed to promote uniform distribution of particulate in the flow of gas, said step of moving the stirrer member in the fluidized bed includes rotating the stirrer member about an axis which is coincident with a central axis of the elongated member.

183. A method as set forth in claim 182 further including the step of supporting the mold containing molten metal on a support which is connected with the elongated member, said step of moving the mold into the fluidized bed includes flowing gas and particulate through the support.

184. A method as set forth in claim 183 further including the step of directing a flow of gas from the support toward the lower portion of the fluidized bed during movement of the mold into the fluidized bed.

185. A method as set forth in claim 182 further including the step of conducting a flow of gas into a lower portion of the fluidized bed, said step of conducting a flow of gas into a lower portion of the fluidized bed includes conducting a flow of gas at a first flow rate into a first portion of the lower portion of the fluidized bed and conducting gas at a second flow rate into a second portion of the lower portion of the fluidized bed, said second flow rate being greater than said first flow rate.

186. A method as set forth in claim 182 wherein the fluidized bed includes a central portion and a peripheral portion which extends around the central portion of the fluidized bed, said step of moving the mold into the fluidized bed includes moving the mold into the central portion of the fluidized bed, said method further includes directing a flow of gas into the peripheral portion of the fluidized bed at a plurality of locations disposed above the stirrer member during performance of said step of withdrawing the elongated member from the upper portion of the fluidized bed.

187. A method as set forth in claim 182 further including the step of forming the fluidized bed with a relatively large cross sectional area at a lower portion of the fluidized bed and a relatively small cross sectional area at an upper portion of the fluidized bed.

188. A method as set forth in claim 182 further including the step of forming the fluidized bed with a relatively small cross sectional area at a lower portion of the fluidized bed and relatively large cross sectional area at an upper portion of the fluidized bed.

189. A method as set forth in claim 182 wherein the mold includes an array of article mold cavities and a pour cup connected in fluid communication with the article mold cavities and aligned with a central portion of the array of article mold cavities, said method further includes supporting the mold on an upper end portion of a support column having a central axis which extends through the array of article mold cavities with portions of the mold in which the article mold cavities are disposed spaced from the support column and with the mold free of engagement with any support structure other than the upper end portion of the support column, said step of moving the mold into the fluidized bed includes exposing at least the entire lower end portion of the portion of the mold in which the article mold cavities are disposed to a flow of gas and particulate in the fluidized bed.

190. A method as set forth in claim 182 further including the step of deflecting flow of gas and particulate with a baffle during performance of said step of moving the mold into the fluidized bed.

191. A method as set forth in claim 182 wherein said step of moving the mold into the fluidized bed includes contracting a bellows which extends around a portion of the elongated member with one end of the bellows connected with the elongated member.

192. A method as set forth in claim 182 wherein said elongated member extends into a container in which the fluidized bed is disposed, said step of moving the mold into the fluidized bed includes expanding a bellows which extends around a portion of the elongated member with one end of the bellows connected with the elongated member and an end of the bellows opposite from the one end connected with the container.

193. A method as set forth in claim 182 further including the steps of positioning the mold relative to a container while the mold is outside a furnace assembly, moving the mold into the furnace assembly, moving the container toward the furnace assembly, and establishing the fluidized bed in the container.

194. A method as set forth in claim 182 wherein said step of solidifying the molten metal in the mold includes solidifying at least a portion of the molten metal in the mold with a cellular solidification front disposed between molten and solid metal.

195. A method as set forth in claim 182 wherein gas is conducted through the fluidized bed at a flow rate of between 5 and 100 cubic feet per hour for each square foot of fluidized bed disposed in a horizontal plane extending through a lower end portion of the fluidized bed.

196. A method of casting a metal article, said method comprising the steps of moving a mold containing molten metal into a fluidized bed formed of particulate suspended in a flow of gas, increasing the speed of movement of gas and particulate in the fluidized bed as the gas and particulate flow from a lower portion of the fluidized bed to an upper portion of the fluidized bed by forming the fluidized bed with a relatively large cross sectional area at a lower portion of the fluidized bed and a relatively small cross sectional area at an upper portion of the fluidized bed, solidifying the molten metal in the mold as the mold moves into the fluidized bed, and moving a stirrer member in the fluidized bed to promote uniform distribution of particulate in the flow of gas.

197. A method as set forth in claim 196 further including the step of supporting the mold containing molten metal on a support, said step of moving the mold into the fluidized bed includes flowing gas and particulate through the support.

198. A method as set forth in claim 197 further including the step of directing a flow of gas from the support toward the lower portion of the fluidized bed during movement of the mold into the fluidized bed.

199. A method as set forth in claim 196 further including the step of conducting a flow of gas into the fluidized bed, said step of conducting a flow of gas into the fluidized bed includes conducting a flow of gas at a first flow rate into a first portion of the lower portion of the fluidized bed and conducting gas at a second flow rate into a second portion of the lower portion of the fluidized bed, said second flow rate being greater than said first flow rate.

200. A method as set forth in claim 196 wherein said step of moving a stirrer member in the fluidized bed includes rotating the stirrer member about an axis which extends along a path of movement of the mold into the fluidized bed.

201. A method as set forth in claim 196 wherein said step of moving a stirrer member in the fluidized bed includes rotating the stirrer member at a location disposed in the lower portion of the fluidized bed.

202. A method as set forth in claim 196 wherein said step of moving a stirrer member in the fluidized bed includes rotating the stirrer member about an axis which is offset from a central portion of the fluidized bed.

203. A method as set forth in claim 196 wherein said method further includes directing a flow of gas into a peripheral portion of the lower portion of the fluidized bed at a plurality of locations disposed above the stirrer member during performance of said step of moving the mold into the fluidized bed.

204. A method as set forth in claim 196 further including the step of supporting the mold above the fluidized bed with an elongated member which extends between the upper portion of the fluidized bed and a lower portion of the fluidized bed, said step of moving the mold into the fluidized bed includes withdrawing the elongated member downward from the lower portion of the fluidized bed.

205. A method as set forth in claim 196 wherein said step of moving the stirrer member in of the fluidized bed includes rotating the stirrer member with the stirrer member disposed in the lower portion of the fluidized bed.

206. A method as set forth in claim 196, said method further including the step of supporting the mold above the upper portion of the fluidized bed, said step of moving the mold into the fluidized bed includes lowering at least a portion of the mold through the upper portion of the fluidized bed into the lower portion of the fluidized bed.

207. A method as set forth in claim 196 wherein the mold includes an array of article mold cavities, said method further includes supporting the mold on an upper end portion of a support having a central axis which extends through the array of article mold cavities, said step of moving the mold into the fluidized bed includes moving at least a lower end portion of the mold from the upper portion of the fluidized bed into the lower portion of the fluidized bed and exposing at least the lower end portion of the portion of the mold to a flow of gas and particulate in the fluidized bed.

208. A method as set forth in claim 196 further including the step of deflecting flow of gas and particulate with a baffle during performance of said step of moving the mold into the fluidized bed.

209. A method as set forth in claim 196 wherein said step of moving the mold into the fluidized bed includes connecting an elongated flexible element with the mold and transmitting force from the mold to the elongated flexible element.

210. A method as set forth in claim 196 further including the step of suspending the mold above the fluidized bed, said step of moving the mold into the fluidized bed includes lowering the suspended mold into the fluidized bed.

211. A method as set forth in claim 196 wherein said step of moving the mold into the fluidized bed includes supporting the mold with a support member which extends into a container in which the fluidized bed is disposed, said step of moving the mold into the fluidized bed includes contracting a bellows which extends around a portion of the support member with one end of the bellows connected with the support member and an end of the bellows opposite from the one end connected with the container.

212. A method as set forth in claim 196 wherein said method further includes supporting the mold with a support member which extends into a container in which the fluidized bed is disposed, said step of moving the mold into the fluidized bed includes expanding a bellows which extends around a portion of the support member with one end of the bellows connected with the support member and an end of the bellows opposite from the one end connected with the container.

213. A method as set forth in claim 196 further including the steps of positioning the mold relative to a container while the mold is outside a furnace assembly, moving the mold into the furnace assembly, moving the container toward the furnace assembly, and establishing the fluidized bed in the container.

214. A method as set forth in claim 196 further including the step of supporting the mold with a support member, said step of supporting a mold with a support member being performed with a plurality of portions of the mold containing article mold cavities spaced from the support member, said step of moving the mold into the fluidized bed includes engaging the portions of mold containing article mold cavities with a flow of gas and particulate conducted between the portion of the mold containing article mold cavities and the support member.

215. A method as set forth in claim 196 wherein said step of solidifying the molten metal in the mold includes solidifying at least a portion of the molten metal in the mold with a cellular solidification front disposed between molten and solid metal.

216. A method as set forth in claim 196 wherein gas is conducted through the fluidized bed at a flow rate of between 5 and 100 cubic feet per hour for each square foot of fluidized bed disposed in a horizontal plane extending through the lower end portion of the fluidized bed.

217. A method of casting a metal article, said method comprising the steps of moving a mold containing molten metal into a fluidized bed formed of particulate suspended in a flow of gas, decreasing the speed of movement of gas and particulate in the fluidized bed as the gas and particulate flow from a lower portion of the fluidized bed to an upper portion of the fluidized by forming the fluidized bed with a relatively small cross sectional area at a lower portion of the fluidized bed and relatively large cross sectional area at an upper portion of the fluidized bed, solidifying the molten metal in the mold as the mold moves into the fluidized bed, and moving a stirrer member in the fluidized bed to promote uniform distribution of particulate in the flow of gas.

218. A method as set forth in claim 217 further including the step of supporting the mold containing molten metal on a support, said step of moving the mold into the fluidized bed includes flowing gas and particulate through the support.

219. A method as set forth in claim 218 further including the step of directing a flow of gas from the support into the fluidized bed during movement of the mold into the fluidized bed.

220. A method as set forth in claim 217 further including the step of conducting a flow of gas into the fluidized bed, said step of conducting a flow of gas into the fluidized bed includes conducting a flow of gas at a first flow rate into a first portion of the lower portion of the fluidized bed and conducting gas at a second flow rate into a second portion of the lower portion of the fluidized bed, said second flow rate being greater than said first flow rate.

221. A method as set forth in claim 217 wherein said step of moving a stirrer member in the fluidized bed includes rotating the stirrer member about an axis which extends along a path of movement of the mold into the fluidized bed.

222. A method as set forth in claim 217 wherein said step of moving a stirrer member in the fluidized bed includes rotating the stirrer member at a location disposed in the lower portion of the fluidized bed.

223. A method as set forth in claim 217 wherein said step of moving a stirrer member in the fluidized bed includes rotating the stirrer member about an axis which is offset from a central portion of the fluidized bed.

224. A method as set forth in claim 217 wherein said method further includes directing a flow of gas into a peripheral portion of the fluidized bed at a plurality of locations disposed above the stirrer member during performance of said step of moving the mold into the fluidized bed.

225. A method as set forth in claim 217 further including the step of supporting the mold above the fluidized bed with an elongated member which extends between the upper portion of the fluidized bed and a lower portion of the fluidized bed, said step of moving the mold into the fluidized bed includes moving the elongated member downward from the lower portion of the fluidized bed.

226. A method as set forth in claim 217 wherein said step of moving the stirrer member in of the fluidized bed includes rotating the stirrer member with the stirrer member disposed in the lower portion of the fluidized bed.

227. A method as set forth in claim 217 said method further including the step of supporting the mold above the upper portion of the fluidized bed, said step of moving the mold into the fluidized bed includes lowering at least a portion of the mold through the upper portion of the fluidized bed into the lower portion of the fluidized bed.

228. A method as set forth in claim 217 wherein the mold includes an array of article mold cavities, said method further includes supporting the mold on an upper end portion of a support having a central axis which extends through the array of article mold cavities, said step of moving the mold into the fluidized bed includes moving an end portion of the mold from the upper portion of the fluidized bed into the lower portion of the fluidized bed and exposing at least the lower end portion of the portion of the mold to a flow of gas and particulate in the fluidized bed.

229. A method as set forth in claim 217 further including the step of deflecting flow of gas and particulate with a baffle performance of said step of moving the mold into the fluidized bed.

230. A method as set forth in claim 217 wherein said step of moving the mold into the fluidized bed includes connecting an elongated flexible element with the mold and transmitting force from the mold to the elongated flexible element.

231. A method as set forth in claim 230 wherein said step of moving the mold into the fluidized bed includes moving the elongated flexible element along a nonlinear path.

232. A method as set forth in claim 217 wherein said step of moving the mold into the fluidized bed includes supporting the mold with a support member which extends into a container in which the fluidized bed is disposed, said step of moving the mold into the fluidized bed includes contracting a bellows which extends around a portion of the support member with one end of the bellows connected with the support member and an end of the bellows opposite from the one end connected with the container.

233. A method as set forth in claim 217 wherein said method further includes supporting the mold with a support member which extends into a container in which the fluidized bed is disposed, said step of moving the mold into the fluidized bed includes expanding a bellows which extends around a portion of the support member with one end of the bellows connected with the support member and an end of the bellows opposite from the one end connected with the container.

234. A method as set forth in claim 217 further including the steps of positioning the mold relative to a container while the mold is outside a furnace assembly, moving the mold into the furnace assembly, moving the container toward the furnace assembly, and establishing the fluidized bed in the container.

235. A method as set forth in claim 217 further including the step of supporting the mold with a support member, said step of supporting a mold with a support member being performed with a plurality of portions of the mold containing article mold cavities spaced from the support member, said step of moving the mold into the fluidized bed includes engaging the portions of mold containing article mold cavities with a flow of gas and particulate conducted between the portion of the mold containing article mold cavities and the support member.

236. A method as set forth in claim 217 further including the step of suspending the mold above the fluidized bed, said step of moving the mold into the fluidized bed includes moving the suspended mold into the fluidized bed.

237. A method as set forth in claim 217 wherein gas is conducted through the fluidized bed at a flow rate of between 5 and 100 cubic feet per hour for each square foot of fluidized bed disposed in a horizontal plane extending through the lower end portion of the fluidized bed.

238. A method of casting a metal article, said method comprising the steps of moving a mold containing molten metal into a fluidized bed formed of particulate suspended in a flow of gas, deflecting flow of gas and particulate with a baffle disposed adjacent to the mold during performance of said step of moving the mold into the fluidized bed, solidifying the molten metal in the mold as the mold moves into the fluidized bed, and moving a stirrer member in the fluidized bed to promote uniform distribution of particulate in the flow of gas.

239. A method as set forth in claim 238 further including the step of supporting the mold containing molten metal on a support, said step of moving the mold into the fluidized bed includes flowing gas and particulate through the support.

240. A method as set forth in claim 238 further including the step of suspending the mold above the fluidized bed, said step of moving the mold into the fluidized bed includes lowering the suspended mold into the fluidized bed.

241. A method as set forth in claim 238 further including the step of conducting a flow of gas into the fluidized bed, said step of conducting a flow of gas into the fluidized bed includes conducting a flow of gas at a first flow rate into a first portion of the fluidized bed and conducting gas at a second flow rate into a second portion of the fluidized bed.

242. A method as set forth in claim 238 wherein said step of supporting a mold includes supporting the mold with a support member which extends into a container in which the fluidized bed is disposed, said step of moving the mold into the fluidized bed includes contracting a bellows which extends around a portion of the support member with one end of the bellows connected with the support member and an end of the bellows opposite from the one end connected with the container.

243. A method as set forth in claim 238 wherein said method further includes supporting the mold with a support member which extends into a container in which the fluidized bed is disposed, said step of moving the mold into the fluidized bed includes expanding a bellows which extends around a portion of the support member with one end of the bellows connected with the support member and an end of the bellows opposite from the one end connected with the container.

244. A method as set forth in claim 238 further including the steps of positioning the mold relative to a container while the mold is outside a furnace assembly, moving the mold into the furnace assembly, moving the container toward the furnace assembly, and establishing the fluidized bed in the container.

245. A method of casting a metal article, said method comprising the steps of moving a mold containing molten metal into a fluidized bed formed of particulate suspended in a flow of gas, said step of moving the mold into the fluidized bed includes connecting an elongated flexible element with the mold and transmitting force from the mold to the elongated flexible element, solidifying the molten metal in the mold as the mold moves into the fluidized bed, and moving a stirrer member in the fluidized bed to promote uniform distribution of particulate in the flow of gas.

246. A method as set forth in claim 245 wherein said step of moving the mold into the fluidized bed includes moving the elongated flexible element along a nonlinear path.

247. A method as set forth in claim 245 further including the step of supporting the mold containing molten metal on a support, said step of moving the mold into the fluidized bed includes flowing gas and particulate through the support.

248. A method as set forth in claim 245 further including the step of suspending the mold above the fluidized bed, said step of moving the mold into the fluidized bed includes lowering the suspended mold into the fluidized bed.

249. A method as set forth in claim 245 further including the step of conducting a flow of gas into the fluidized bed, said step of conducting a flow of gas into the fluidized bed includes conducting a flow of gas at a first flow rate into a first portion of the fluidized bed and conducting gas at a second flow rate into a second portion of the fluidized bed.

250. A method of casting a metal article, said method comprising the steps of moving a mold containing molten metal into a fluidized bed formed of particulate suspended in a flow of gas, said step of moving the mold into the fluidized bed includes supporting the mold with a support member which extends into a container in which the fluidized bed is disposed, and contracting a bellows which extends around a portion of the support member with one end of the bellows connected with the support member and an end of the bellows opposite from the one end connected with the container, solidifying the molten metal in the mold as the mold moves into the fluidized bed, and moving a stirrer member in the fluidized bed to promote uniform distribution of particulate in the flow of gas.

251. A method of casting a metal article, said method comprising the steps of moving a mold containing molten metal into a fluidized bed formed of particulate suspended in a flow of gas, supporting the mold with a support member which extends into a container in which the fluidized bed is disposed, said step of moving the mold into the fluidized bed includes expanding a bellows which extends around a portion of the support member with one end of the bellows connected with the support member and an end of the bellows opposite from the one end connected with the container, solidifying the molten metal in the mold as the mold moves into the fluidized bed, and moving a stirrer member in the fluidized bed to promote uniform distribution of particulate in the flow of gas.

252. A method of casting a metal article, said method comprising the steps of positioning the mold relative to a container while the mold is outside a furnace assembly, moving the mold into the furnace assembly, moving the container toward the furnace assembly, establishing a fluidized bed of particulate suspended in a flow of gas in the container, moving a mold containing molten metal into the fluidized bed formed of particulate suspended in the flow of gas in the container, solidifying the molten metal in the mold as the mold moves into the fluidized bed, and moving a stirrer member in the fluidized bed to promote uniform distribution of particulate in the flow of gas.

253. A method of casting metal articles in a mold having a central portion and a peripheral portion in which a plurality of article mold cavities are disposed, said method comprising the steps of raising the mold from a lowered position in which the mold is disposed below a furnace assembly to a raised position in which the mold is at least partially disposed in the furnace assembly, raising a container from a lowered position in which the container is disposed below the furnace assembly to a raised position in which the container is adjacent to the furnace assembly, holding a fluidized bed formed of particulate suspended in a flow of gas in the container, supporting the mold above the fluidized bed formed of particulate suspended in a flow of gas by transmitting force between the central portion of the mold and a support, lowering the mold into the fluidized bed with a bottom of the peripheral portion of the mold spaced from the support and with the bottom of the peripheral portion of the mold exposed to the flow of gas and particulate in the fluidized bed, said step of lowering the mold into the fluidized bed being initiated with the molten metal in the article mold cavities, solidifying the molten metal in the article mold cavities as the mold is lowered into the fluidized bed, and lowering the container after performing said step of lowering the mold into the fluidized bed.

254. A method as set forth in claim 253 further including the step of moving a stirrer member in a lower portion of the fluidized bed to promote uniform distribution of particulate in the flow of gas.

255. A method as set forth in claim 253 wherein said step of raising the mold from the lowered position to the raised position includes transmitting force between the central portion of the mold and the support with the peripheral portion of the mold spaced from the support.

256. A method as set forth in claim 253 wherein the fluidized bed is disposed in a container having a porous layer at a lower end portion of the container, said method further includes the steps of establishing the fluidized bed in the container by conducting a flow of gas through the porous layer at a flow rate of between 5 and 100 cubic feet per hour for each square foot of an upper surface of the porous layer, exposing an upper portion of the fluidized bed to a fluid pressure of between $6\times10^{-4}$ atmospheres and 1.0 atmosphere and to a temperature of between 2,500 degrees Fahrenheit and 3,000 degrees Fahrenheit.

257. A method as set forth in claim 253 wherein said step of supporting the mold above a fluidized bed by transmitting force between the central portion of the mold and the support includes suspending the mold in a furnace assembly with the support extending through an upper end portion of the furnace assembly.

258. A method as set forth in claim 253 wherein said step of supporting the mold above a fluidized bed by transmitting force between the central portion of the mold and the support includes supporting the mold on a support which extends through the fluidized bed.

259. A method as set forth in claim 253 wherein the peripheral portion of the mold includes a plurality of sections in which the article mold cavities are disposed, said step of lowering the mold into the fluidized bed includes flowing gas and particulate through openings between the sections of the mold.

260. A method as set forth in claim 253 wherein the central portion of the mold includes a pour cup which is connected in fluid communication with the article mold cavities, said step of supporting the mold includes transmitting force between a member having a central axis which extends through the pour cup and the central portion of the mold.

261. A method as set forth in claim 253 wherein the central portion of the mold includes a pour cup which is connected in fluid communication with the article mold cavities, said step of supporting the mold includes transmitting force between the central portion of the mold and a plurality of members having central axes which are offset from a central axis of the pour cup.

262. A method as set forth in claim 253 wherein said step of supporting the mold above the fluidized bed includes supporting the mold above the fluidized bed with an elongated member which extends between an upper portion of the fluidized bed and the lower portion of the fluidized bed, said step of lowering the mold into the fluidized bed includes withdrawing the elongated member from the upper portion of the fluidized bed.

263. A method of casting metal articles in a mold having a central portion and a peripheral portion in which a plurality of article mold cavities are disposed, said method comprising the steps of supporting the mold above a fluidized bed formed of particulate suspended in a flow of gas by transmitting force between the central portion of the mold and a support, the fluidized bed is disposed in a container having a porous layer at a lower end portion of the container, said method further includes the steps of establishing the fluidized bed in the container by conducting a flow of gas through the porous layer at a flow rate of between 5 and 100 cubic feet per hour for each square foot of an upper surface of the porous layer, exposing an upper portion of the fluidized bed to a fluid pressure of between $6\times10^{-4}$ atmospheres and 1.0 atmosphere and to a temperature of between 2,500 degrees Fahrenheit and 3,000 degrees Fahrenheit, lowering the mold into the fluidized bed with a bottom of the peripheral portion of the mold spaced from the support and with the bottom of the peripheral portion of the mold exposed to the flow of gas and particulate in the fluidized bed, said step of lowering the mold into the fluidized bed being initiated with the molten metal in the article mold cavities, and solidifying the molten metal in the article mold cavities as the mold is lowered into the fluidized bed.

264. A method as set forth in claim 263 wherein said step of lowering a mold containing molten metal into the fluidized bed includes lowering the mold into the fluidized bed with a bottom of a peripheral portion of mold completely exposed to the flow of gas and particulate in the fluidized bed.

265. A method of casting a metal article, said method comprising the steps of providing a container, conducting a flow of gas into a fluidized bed in the container, said step of conducting a flow of gas into the fluidized bed in the container includes conducting a flow of gas into a lower end portion of the container at a flow rate of between 5 and 100 cubic feet per hour for each square foot of the fluidized bed in a horizontal plane disposed adjacent to a lower end portion of the fluidized bed, suspending a mold in a furnace assembly disposed above the container, exposing an upper end portion of the fluidized bed to a fluid pressure of between $6\times10^{-4}$ atmospheres and 1.0 atmosphere and to a temperature of between 2,500 degrees Fahrenheit and 3,000 degrees Fahrenheit, and lowering the suspended mold from the furnace assembly into the fluidized bed in the container.

266. A method as set forth in claim 265 wherein the mold has a central portion and a peripheral portion in which a plurality of article mold cavities are disposed, said step of lowering the suspended mold into the fluidized bed being performed with a bottom of the peripheral portion of the mold exposed to a flow of gas and particulate in the fluidized bed, and solidifying molten metal in the article mold cavities as the suspended mold is lowered into the fluidized bed.

267. A method as set forth in claim 265 wherein said step of conducting a flow of gas into a lower portion of the container includes conducting gas into a central portion of the fluidized bed at a first flow rate during lowering of the suspended mold into the fluidized bed and conducting gas into a peripheral portion of the fluidized bed at a second flow rate during lowering of the suspended mold into the fluidized bed.

268. A method as set forth in claim 265 further including the step of monitoring at least one characteristic of the flow of gas into a lower end portion of the container to detect changes in at least one characteristic of the fluidized bed.

269. A method as set forth in claim 265 further including the step of directing a flow of gas into the fluidized bed at locations disposed above a lower end portion of the container during performance of said step of lowering the suspended mold into the fluidized bed.

270. A method as set forth in claim 265 further including the step of varying a rate of flow of gas and particulate in the fluidized bed as the gas and particulate move from the lower end portion of the container to the upper end portion of the container as a result of having different cross sectional areas of the fluidized bed in horizontal planes at different distances from the lower end portion of the container.

271. A method as set forth in claim 265 wherein said step of suspending the mold in the furnace assembly includes connecting the mold with a plurality of rods which extend through an upper end portion of the furnace assembly, said step of lowering the suspended mold includes operating a drive assembly disposed outside the furnace assembly to move the rods downward relative to the furnace assembly.

272. A method as set forth in claim 271 wherein said step of operating a drive assembly to move the rods downward includes moving an elongated flexible member connected with at least one of the rods along a nonlinear path.

273. A method of casting a metal article, said method comprising the steps of providing a container, conducting a flow of gas into a fluidized bed in the container, suspending a mold in a furnace assembly disposed above the container, and lowering the suspended mold from the furnace assembly into the fluidized bed in the container, said step of conducting a flow of gas into a lower portion of the container includes conducting gas into a central portion of the fluidized bed at a first flow rate during lowering of the suspended mold into the fluidized bed and conducting gas into a peripheral portion of the fluidized bed at a second flow rate during lowering of the suspended mold into the fluidized bed.

274. A method as set forth in claim 273 further including the step of exposing an upper end portion of the fluidized bed to a fluid pressure of between $6 \times 10^{-4}$ atmospheres and 1.0 atmosphere and to a temperature of between 2,500 degrees Fahrenheit and 3,000 degrees Fahrenheit.

275. A method as set forth in claim 273 wherein the mold has a central portion and a peripheral portion in which a plurality of article mold cavities are disposed, said step of lowering the suspended mold into the fluidized bed being performed with a bottom of the peripheral portion of the mold exposed to a flow of gas and particulate in the fluidized bed, and solidifying molten metal in the article mold cavities as the suspended mold is lowered into the fluidized bed.

276. A method as set forth in claim 273 further including the step of monitoring at least one characteristic of the flow of gas into a lower end portion of the container to detect changes in at least one characteristic of the fluidized bed.

277. A method as set forth in claim 273 further including the step of directing a flow of gas into the fluidized bed at locations disposed above a lower end portion of the container during performance of said step of lowering the suspended mold into the fluidized bed.

278. A method as set forth in claim 273 further including the step of varying a rate of flow of gas and particulate in the fluidized bed as the gas and particulate move from the lower end portion of the container to the upper end portion of the container as a result of having different cross sectional areas of the fluidized bed in horizontal planes at different distances from the lower end portion of the container.

279. A method as set forth in claim 273 wherein said step of suspending the mold in the furnace assembly includes connecting the mold with a plurality of rods which extend through an upper end portion of the furnace assembly, said step of lowering the suspended mold includes operating a drive assembly disposed outside the furnace assembly to move the rods downward relative to the furnace assembly.

280. A method as set forth in claim 273 wherein said step of operating a drive assembly to move the rods downward includes moving an elongated flexible member connected with at least one of the rods along a nonlinear path.

281. A method as set forth in claim 273 further including the step of moving the container and the fluidized bed downward away from the furnace assembly after lowering the suspended mold into the fluidized bed in the container.

282. A method as set forth in claim 273 further including the step of moving a stirrer member in the fluidized bed to promote uniform distribution of particulate in the flow of gas.

283. A method of casting a metal article, said method comprising the steps of providing a container, conducting a flow of gas into a fluidized bed in the container, varying a rate of flow of gas and particulate in the fluidized bed as the gas and particulate move from a lower end portion of the container to an upper end portion of the container as a result of having different cross sectional areas of the fluidized bed in horizontal planes at different distances from the lower end portion of the container, suspending a mold in a furnace assembly disposed above the container, and lowering the suspended mold from the furnace assembly into the fluidized bed in the container.

284. A method as set forth in claim 283 wherein said step of conducting a flow of gas into the fluidized bed in the container includes conducting a flow of gas into a lower end portion of the container at a flow rate of between 5 and 100 cubic feet per hour for each square foot of the fluidized bed in a horizontal plane disposed adjacent to a lower end portion of the fluidized bed.

285. A method as set forth in claim 283 wherein the mold has a central portion and a peripheral portion in which a plurality of article mold cavities are disposed, said step of lowering the suspended mold into the fluidized bed being performed with a bottom of the peripheral portion of the mold exposed to a flow of gas and particulate in the fluidized bed, and solidifying molten metal in the article mold cavities as the suspended mold is lowered into the fluidized bed.

286. A method as set forth in claim 283 further including the step of monitoring at least one characteristic of the flow of gas into a lower end portion of the container to detect changes in at least one characteristic of the fluidized bed.

287. A method as set forth in claim 283 further including the step of directing a flow of gas into the fluidized bed at locations disposed above a lower end portion of the container during performance of said step of lowering the suspended mold into the fluidized bed.

288. A method as set forth in claim 283 wherein said step of suspending the mold in the furnace assembly includes connecting the mold with a plurality of rods which extend through an upper end portion of the furnace assembly, said step of lowering the suspended mold includes operating a drive assembly disposed outside the furnace assembly to move the rods downward relative to the furnace assembly.

289. A method as set forth in claim 288 wherein said step of operating a drive assembly to move the rods downward includes moving an elongated flexible member connected with at least one of the rods along a nonlinear path.

290. A method of casting a metal article, said method comprising the steps of conducting a flow of gas into a container to provide a fluidized bed in the container, said step of conducting a flow of gas into the container includes maintaining a gas flow rate of between 5 and 100 cubic feet per hour through the container for each square foot of a portion of a horizontal plane disposed in the container adjacent to the lower portion of the container, moving a mold containing molten metal into the fluidized bed, solidifying molten metal in the mold as the mold moves into the fluidized bed, monitoring at least one characteristic of the flow of gas into the container to detect changes in at least one characteristic of the fluidized bed, said step of monitoring at least one characteristic of the flow of gas into the container includes monitoring the rate of flow of gas into the container, and changing the flow of gas into the container as a function of changes in the one characteristic of the flow of gas.

291. A method as set forth in claim 290 wherein said step of conducting a flow of gas into the container includes conducting a flow of gas at a first flow rate to a first portion of the container and conducting a flow of gas at a second flow rate to a second portion of the container, said step of changing the flow of gas into the container includes changing the flow of gas into the second portion of the container.

292. A method of casting a metal article, said method comprising the steps of conducting a flow of gas into a container to provide a fluidized bed in the container, said step of conducting a flow of gas into the container includes maintaining a gas flow rate of between 5 and 100 cubic feet per hour through the container for each square foot of a portion of a horizontal plane disposed in the container adjacent to a lower portion of the container, said step of conducting a flow of gas into the container includes conducting a flow of gas at a first flow rate to a first portion of the container and conducting a flow of gas at a second flow rate to a second portion of the container, moving a mold containing molten metal into the fluidized bed, solidifying molten metal in the mold as the mold moves into the fluidized bed, monitoring at least one characteristic of at least one of the flows of gas into the container to detect changes in at least one characteristic of the fluidized bed, and changing at least one of the flows of gas into the container as a function of changes in the one characteristic of the fluidized bed, said step of changing at least one of the flows of gas into the container includes changing the flow of gas into the second portion of the container.

293. A method of casting a metal article, said method comprising the steps of moving a mold containing molten metal from a furnace assembly into a fluidized bed formed of particulate suspended in a flow of gas, solidifying the molten metal in the mold as the mold moves into the fluidized bed, and moving the fluidized bed away from the furnace assembly with the mold at least partially disposed in the fluidized bed.

294. A method as set forth in claim 293 further including the step of supporting the mold containing molten metal on a support, said step of moving the mold into the fluidized bed includes flowing gas and particulate through openings in the support.

295. A method as set forth in claim 293 further including the step of directing a flow of gas from the support toward a lower portion of the fluidized bed during movement of the mold into the fluidized bed.

296. A method as set forth in claim 293 further including the step of conducting a flow of gas into the fluidized bed, said step of conducting a flow of gas into the fluidized bed includes conducting a flow of gas at a first flow rate into a first portion of the fluidized bed and conducting gas at a second flow rate into a second portion of the fluidized bed, said second flow rate being greater than said first flow rate.

297. A method as set forth in claim 293 further including the step of rotating a stirrer member disposed in the fluidized bed about an axis which extends along a path of movement of the mold into the fluidized bed.

298. A method as set forth in claim 293 wherein the fluidized bed includes a central portion and a peripheral portion which extends around the central portion of the fluidized bed, said step of moving the mold into the fluidized bed includes moving the mold into the central portion of the fluidized bed, said method further includes directing a flow of gas into the peripheral portion of the fluidized bed at a plurality of locations disposed above a lower end portion of the fluidized bed during performance of said step of moving the mold into the fluidized bed.

299. A method as set forth in claim 293 further including the step of supporting the mold above the fluidized bed with an elongated member which extends between an upper portion of the fluidized bed and a lower portion of the fluidized bed, said step of moving the mold into the fluidized bed includes moving the elongated member downward from the lower portion of the fluidized bed.

300. A method as set forth in claim 293 said method further including the step of suspending the mold above the fluidized bed, said step of moving the mold into the fluidized bed includes lowering the suspended mold into the fluidized bed.

301. A method as set forth in claim 293 further including the step of forming the fluidized bed with a relatively large cross sectional area at a lower portion of the fluidized bed and a relatively small cross sectional area at an upper portion of the fluidized bed.

302. A method as set forth in claim 293 further including the step of forming the fluidized bed with a relatively small cross sectional area at a lower portion of the fluidized bed and relatively large cross sectional area at an upper portion of the fluidized bed.

303. A method as set forth in claim 293 wherein the mold includes an array of article mold cavities and a pour cup connected in fluid communication with the article mold cavities and aligned with a central portion of the array of article mold cavities, said method further includes supporting the mold on an upper end portion of a support column having a central axis which extends through the array of article mold cavities with portions of the mold in which the article mold cavities are disposed spaced from the support column and with the mold free of engagement with any support structure other than the upper end portion of the support column, said step of moving the mold into the fluidized bed includes exposing at least an entire lower end portion of the portion of the mold in which the article mold cavities are disposed to a flow of gas and particulate in the fluidized bed.

304. A method as set forth in claim 293 further including the step of deflecting flow of gas and particulate with a baffle during performance of said step of moving the mold into the fluidized bed.

305. A method as set forth in claim 293 wherein said step of supporting a mold containing molten metal includes connecting an elongated flexible element with the mold and transmitting force from the mold to the elongated flexible element.

306. A method as set forth in claim 305 wherein said step of moving the mold into the fluidized bed includes moving the elongated flexible element along a nonlinear path with at least a portion of the path disposed beneath the furnace assembly.

307. A method as set forth in claim 293 wherein said step of supporting a mold includes supporting the mold with a support member which extends into a container in which the fluidized bed is disposed, said method further includes establishing a space which is surrounded by the fluidized bed, extends around the support member, and is free of the particulate material suspended in the fluidized bed.

308. A method as set forth in claim 293 wherein said method further includes supporting the mold with a support member which extends into a particulate free space in a container in which the fluidized bed is disposed.

309. A method as set forth in claim 293 further including the steps of positioning the mold relative to a container while the mold is outside the furnace assembly, moving the mold into the furnace assembly, moving the container toward the furnace assembly, and establishing the fluidized bed in the container.

310. A method as set forth in claim 293 further including the step of supporting the mold with a support member which extends upward through at least a lower portion of the fluidized bed and engages a central portion of the mold, said step of supporting a mold with a support member being performed with a plurality of portions of the mold containing article mold cavities spaced from the support member, said step of moving the mold into the fluidized bed includes engaging the portions of mold containing article mold cavities with a flow of gas and particulate conducted between the portion of the mold containing article mold cavities and the support member.

311. A method as set forth in claim 293 wherein gas is conducted through the fluidized bed at a flow rate of between 5 and 100 cubic feet per hour for each square foot of fluidized bed disposed in a horizontal plane extending through a lower end portion of the fluidized bed.

312. A method of casting a metal article, said method comprising the steps of providing a container, supporting a mold containing molten metal in a furnace assembly with an elongated support member which extends through the container, establishing a fluidized bed in the container, blocking engagement of the fluidized bed with a portion of the support member disposed in the container, lowering the mold from the furnace assembly into the fluidized bed in the container by moving the support member downward relative to the container while continuing to block engagement of the fluidized bed with a portion of the support member disposed in the container, and solidifying the molten metal in the mold as the mold moves into the fluidized bed in the container.

313. A method as set forth in claim 312 wherein said step of lowering the mold into the fluidized bed in the container includes flexing a bellows which extends around the support member and blocks engagement of the fluidized bed with a portion of the support member disposed in the container.

314. A method as set forth in claim 312 further including the step of lowering the container and the fluidized bed with the mold at least partially disposed in the container.

315. A method as set forth in claim 312 further including the step of rotating a stirrer member disposed in the fluidized bed to promote uniform distribution of particulate in the fluidized bed.

316. A method of casting a metal article, said method comprising the steps of establishing a fluidized bed formed of particulate suspended in a flow of gas, said step of establishing a fluidized bed includes conducting a flow of gas upward from a portion of a container having a first circular cross-sectional area in a first horizontal plane to a portion of the container having a second circular cross-sectional area in a second horizontal plane, said second circular cross-sectional area being greater than and being axially aligned with said first circular cross-sectional area, moving a mold containing molten metal from a furnace assembly into the fluidized bed in the container, and solidifying the molten metal in the mold as the mold moves into the fluidized bed.

317. A method as set forth in claim 316 further including the step of raising the container from a lowered position in which the container is disposed below the furnace assembly to a raised position in which the container is disposed adjacent to the furnace assembly, said step of moving a mold from the furnace assembly into the fluidized bed being performed while the container is in the raised position.

318. A method as set forth in claim 317 further including the step of moving a stirrer member in the container to promote a uniform distribution of particulate in the flow of gas.

319. A method as set forth in claim 318 wherein said step of moving a stirrer member in the container includes rotating the stirrer member about an axis which extends parallel to a path along which the mold is moved into the fluidized bed in the container.

320. A method as set forth in claim 316 wherein said step of establishing a fluidized bed includes the step of conducting a flow of gas into the container and suspending particulate in the container in the flow of gas to establish the fluidized bed in the container, said method further includes monitoring the rate of flow of gas into the container.

321. A method as set forth in claim 316 wherein said step of establishing a fluidized bed includes conducting a flow of gas through the first cross-sectional area at a flow rate of between 5 and 100 cubic feet per hour for each square foot of the first cross-sectional area.

322. A method as set forth in claim 316 wherein said step of solidifying molten metal in the mold includes solidifying at least a portion of the molten metal in the mold with a cellular solidification front disposed between molten and solid metal.

323. A method as set forth in claim 316 wherein said step of moving the mold into the fluidized bed includes expanding a flexible element which extends around a portion of a mold support member with one end of the flexible element connected with the support member and an end of the flexible element opposite from the one end connected with the container.

324. A method as set forth in claim 316 wherein said step of moving the mold into the fluidized bed includes contracting a flexible element which extends around a portion of a mold support member with one end of the flexible element connected with the support member and an end of the flexible element opposite from the one end connected with the container.

325. A method as set forth in claim 316 further including the step of deflecting flow of gas and particulate with a baffle disposed in the fluidized bed during performance of said step of lowering the mold into the fluidized bed.

326. A method as set forth in claim 316 wherein the mold includes an array of article mold cavities, said step of moving the mold into the fluidized bed includes supporting the mold on an upper end portion of a support member having a central axis which extends through the array of article mold cavities with portions of the mold in which the article mold cavities are disposed spaced from the support member and with the mold free of engagement with any support structure other than the upper end portion of the support member.

327. A method as set forth in claim 316 wherein the mold is suspended with at least one support member, said step of moving the mold into the fluidized bed includes lowering the suspended mold relative to the container.

328. A method as set forth in claim 316 wherein said step of moving the mold into the fluidized bed includes moving an elongated member which supports the mold downward through a lower end portion of the container.

329. A method as set forth in claim 316 further including the step of directing a flow of gas into the fluidized bed at a plurality of locations along a side wall of the container during performance of said step of moving the mold into the fluidized bed.

330. A method as set forth in claim 316 further including the step of conducting a flow of gas into a lower portion of the fluidized bed, said step of conducting a flow of gas into the lower portion of the fluidized bed includes conducting a flow of gas at a first flow rate into a first portion of the fluidized bed and conducting gas at a second flow rate into a second portion of the fluidized bed, said second flow rate being greater than said first flow rate.

331. A method as set forth in claim 316 further including the step of supporting the mold on a support, said step of moving the mold into the fluidized bed includes flowing gas and particulate through openings in the support.

332. A method as set forth in claim 331 further including the step of directing a flow of gas from the support toward the lower portion of the fluidized bed during movement of the mold into the fluidized bed.

333. A method of casting a metal article, said method comprising the steps of establishing a fluidized bed formed of particulate suspended in a flow of gas, said step of establishing a fluidized bed includes conducting a flow of gas at a first flow rate into a first portion of the fluidized bed and conducting gas at a second flow rate into a second portion of the fluidized bed, said second flow rate being greater than said first flow rate, moving a mold containing molten metal from a furnace assembly into the fluidized bed, and solidifying molten metal in the mold as the mold moves into the fluidized bed.

334. A method as set forth in claim 333 further including the steps of monitoring the rate of flow of gas into the first portion of the fluidized bed and monitoring the rate of flow of gas into the second portion of the fluidized bed.

335. A method as set forth in claim 333 further including the step of supporting the mold containing molten metal on a support, said step of moving the mold into the fluidized bed includes flowing gas and particulate through openings in the support.

336. A method as set forth in claim 335 further including the step of directing a flow of gas from the support toward a lower portion of the fluidized bed during movement of the mold into the fluidized bed.

337. A method as set forth in claim 333 further including the step of rotating a stirrer member in the fluidized bed.

338. A method as set forth in claim 337 wherein said step of rotating a stirrer member in the fluidized bed includes rotating the stirrer member about an axis which extends through a central portion of the fluidized bed.

339. A method as set forth in claim 333 wherein the fluidized bed includes a central portion and a peripheral portion which extends around the central portion of the fluidized bed, said step of conducting a flow of gas into a first portion of the fluidized bed at a first flow rate includes conducting a flow of gas at the first flow rate into the peripheral portion of the fluidized bed, said step of conducting a flow of gas into a second portion of the fluidized bed includes conducting a flow of gas at the second flow rate into the central portion of the fluidized bed.

340. A method as set forth in claim 333 wherein the fluidized bed includes a central portion and a peripheral portion which extends around the central portion of the fluidized bed, said step of conducting a flow of gas into a first portion of the fluidized bed at a first flow rate includes conducting a flow of gas at the first flow rate into the central portion of the fluidized bed, sa id step of conducting a flow of g as into a second portion of the fluidized bed includes conducting a flow of gas at the second flow rate into the peripheral portion of the fluidized bed.

341. A method as set forth in claim 333 further including the step of supporting the mold above the fluidized bed with an elongated member which extends between an upper portion of the fluidized bed and the lower portion of the fluidized bed, said step of moving the mold into the fluidized bed includes moving the elongated member downward from the lower portion of the fluidized bed.

342. A method as set forth in claim 333 wherein the fluidized bed is disposed in a container, said method further includes the step of suspending the mold above the fluidized bed, said step of moving the mold into the fluidized bed includes lowering the suspended mold into the container.

343. A method as set forth in claim 333 further including the step of forming the fluidized bed with a relatively large cross sectional area at a lower portion of the fluidized bed and a relatively small cross sectional area at an upper portion of the fluidized bed.

344. A method as set forth in claim 333 further including the step of forming the fluidized bed with a relatively small cross sectional area at a lower portion of the fluidized bed and relatively large cross sectional area at an upper portion of the fluidized bed.

345. A method of casting metal articles in a mold having a central portion and a peripheral portion which extends downward from the central portion and in which a plurality of article mold cavities are disposed, said method comprising the steps of supporting the mold in a furnace assembly disposed above a fluidized bed formed of particulate suspended in a flow of gas by transmitting force between the central portion of the mold and a support which extends through the fluidized bed, said step of transmitting force between the central portion of the mold and the support includes engaging the central portion of the mold with the support at a location disposed above a lower end of the peripheral portion of the mold, lowering at least a portion of the mold from the furnace assembly into the fluidized bed with the peripheral portion of the mold spaced from the support and extending along a portion of the support, said step of lowering the mold into the fluidized bed includes moving a portion of the support out of the fluidized bed through a lower end of the fluidized bed, and solidifying molten metal in the article mold cavities as the mold is lowered into the fluidized bed.

346. A method as set forth in claim 345 further including the step of moving a stirrer member in a lower portion of the fluidized bed to promote uniform distribution of particulate in the flow of gas.

347. A method as set forth in claim 345 further including the steps of raising the mold from a lowered position in which the mold is disposed below the furnace assembly to a raised position in which the mold is at last partially disposed in the furnace assembly, raising a container from a lowered position in which the container is disposed below the furnace assembly to a raised position in which the container is adjacent to the furnace assembly, holding the fluidized bed in the container, and lowering the container after performing said step of lowering the mold into the fluidized bed.

348. A method as set forth in claim 347 wherein said step of raising the mold from the lowered position to the raised position includes transmitting force between the central portion of the mold and the support with the peripheral portion of the mold spaced from the support.

349. A method as set forth in claim 345 wherein the fluidized bed is disposed in a container having a porous layer at a lower end portion of the container, said method further includes the steps of establishing the fluidized bed in the container by conducting a flow of gas through the porous layer at a flow rate of between 5 and 100 cubic feet per hour for each square foot of an upper surface of the porous layer, exposing an upper portion of the fluidized bed to a fluid pressure of between $6 \times 10^{-4}$ atmospheres and 1.0 atmosphere and to a temperature of between 2,500 degrees Fahrenheit and 3,000 degrees Fahrenheit.

350. A method as set forth in claim 345 wherein the peripheral portion of the mold includes a plurality of sections in which the article mold cavities are disposed, said step of lowering the mold into the fluidized bed includes flowing gas and particulate through openings between the sections of the mold.

351. A method as set forth in claim 345 wherein the central portion of the mold includes a pour cup which is connected in fluid communication with the article mold cavities, said step of lowering the mold into the fluidized bed includes moving the mold downward with the support disposed beneath the pour cup.

352. A method as set forth in claim 345 further including the step of moving the fluidized bed away from the furnace assembly with the peripheral portion of the mold at least partially disposed in the fluidized bed.

353. A method as set forth in claim 345 further including the step of expanding the fluidized bed in a direction perpendicular to a longitudinal axis of the support as gas in the fluidized bed moves upward from the lower end of the fluidized bed.

354. A method as set forth in claim 345 further including the steps of conducting a flow of gas at a first flow rate into a first portion of the fluidized bed and conducting gas at a second flow rate into a second portion of the fluidized bed.

355. A method of casting a metal article, said method comprising the steps of moving a mold containing molten metal into a fluidized bed formed of particulate suspended in a flow of gas, deflecting a flow of gas and particulate in the fluidized bed with a baffle as the mold is moved into the fluidized bed, and solidifying molten metal in the mold as the mold moves into the fluidized bed.

356. A method as set forth in claim 355 further including the step of moving the baffle relative to the fluidized bed as the mold moves into the fluidized bed.

357. A method as set forth in claim 355 further including the step of maintaining the baffle stationary relative to the fluidized bed during movement of the mold into the fluidized bed.

358. A method as set forth in claim 355 further including the step of utilizing the baffle to direct at least a portion of the flow of gas and particulate toward a portion of the mold as the mold moves into the fluidized bed.

359. A method as set forth in claim 355 further including the step of utilizing the baffle to direct at least a portion of the flow of gas and particulate away from a portion of the mold as the mold moves into the fluidized bed.

360. A method as set forth in claim 355 further including the step of moving a stirrer member in the fluidized bed to promote uniform distribution of particulate in the flow of gas and particulate in the fluidized bed.

361. A method as set forth in claim 355 further including the steps of suspending the mold containing molten metal above the fluidized bed and moving the suspended mold to a position disposed in the fluidized bed.

362. A method as set forth in claim 355 wherein the fluidized bed is disposed in a container and the baffle is connected to the container, said step of moving the mold containing molten metal into the fluidized bed includes moving the mold into the container.

363. A method as set forth in claim 362 further including the step of moving the container and the fluidized bed away from a furnace assembly disposed above the fluidized bed which the mold is at least partially disposed in the fluidized bed.

364. A method of casting a metal article, said method includes the step of providing a container having a side wall, at least a portion of the side wall flares outward and upward toward an upper end portion of the container, establishing a fluidized bed formed of particulate suspended in a flow of gas in the container, decreasing an upward rate of flow of gas in the fluidized bed as the gas with particulate suspended therein moves upward along the portion of the container side wall which flares outward and upward, moving a mold containing molten metal from a furnace assembly into the fluidized bed in the container, and solidifying the molten metal in the mold as the mold moves into the fluidized bed.

365. A method as set forth in claim 364 further including the step of raising the container from a lowered position in which the container is disposed below the furnace assembly to a raised position in which the container is disposed adjacent to the furnace assembly, said step of moving a mold from the furnace assembly into the fluidized bed being performed while the container is in the raised position.

366. A method as set forth in claim 364 further including the step of moving a stirrer member in a lower portion of the container to promote a uniform distribution of particulate in the flow of gas.

367. A method as set forth in claim 366 wherein said step of moving a stirrer member in the container includes rotating the stirrer member about an axis which extends parallel to a path along which the mold is moved into the fluidized bed in the container.

368. A method as set forth in claim 364 wherein said step of establishing a fluidized bed includes the step of conducting a flow of gas into the container and suspending particulate in the container in the flow of gas to establish the fluidized bed in the container, said method further includes monitoring the rate of flow of gas into the container.

369. A method as set forth in claim 364 further including the step of deflecting flow of gas and particulate with a baffle disposed in the fluidized bed during performance of said step of moving the mold into the fluidized bed.

370. A method as set forth in claim 364 wherein the mold includes an array of article mold cavities, said step of moving the mold into the fluidized bed includes supporting the mold on an upper end portion of a support member having a central axis which extends through the array of article mold cavities with portions of the mold in which the article mold cavities are disposed spaced from the support member and with the mold free of engagement with any support structure other than the upper end portion of the support member.

371. A method as set forth in claim 364 wherein the mold is supported with a plurality of support members which extend from locations outside of the container and across an upper end portion of the container, said step of moving the mold into the fluidized bed includes lowering the support members relative to the container while the support members continue to extend across the upper end portion of the container.

372. A method as set forth in claim 364 further including the step of suspending the mold above the container, said step of moving the mold from the furnace assembly into the container includes moving the suspended mold downward from the furnace assembly into the container.

373. A method as set forth in claim 364 further including the step of directing a flow of gas into the fluidized bed at a plurality of locations along a side wall of the container during performance of said step of moving the mold into the fluidized bed.

* * * * *

UNITED STATES PATENT AND TRADEMARK OFFICE
CERTIFICATE OF CORRECTION

PATENT NO.   : 6,443,213 B1
DATED        : September 3, 2002
INVENTOR(S)  : Lawrence D. Graham, and Brad L. Rauguth It is certified that error appears in the above-identified patent and that said Letters Patent is hereby corrected as shown below:

Column 35,
Line 30, after "particulate" change "form" to -- from --.

Column 36,
Line 29, after "raised" insert -- position --.

Column 38,
Line 3, after "fluidized (1st occurrence)" insert -- bed --.
Line 67, after "rotating" delete "an" and insert -- a --.

Column 39,
Line 53, after "fluidized (1st occurrence)" insert -- bed --.

Column 40,
Line 33, after "second (2nd occurrence)" delete "portions" and insert -- portion --.

Column 41,
Line 16, after "member" insert -- in --.

Column 47,
Line 13, after "in" delete -- of --.

Column 50,
Line 34, after "in" delete -- of --.

UNITED STATES PATENT AND TRADEMARK OFFICE
CERTIFICATE OF CORRECTION

PATENT NO. : 6,443,213 B1
DATED : September 3, 2002
INVENTOR(S) : Lawrence D. Graham, and Brad L. Rauguth It is certified that error appears in the above-identified patent and that said Letters Patent is hereby corrected as shown below:

Column 54,
Line 2, after "in" delete -- of --.

Column 55,
Line 17, after "fluidized (1st occurrence)" insert -- bed --.
Line 65, after "in" delete -- of --.

Column 66,
Line 6, after "claim" change "317" to -- 316 --.

Signed and Sealed this

Thirteenth Day of July, 2004

JON W. DUDAS
*Acting Director of the United States Patent and Trademark Office*